United States Patent
Sugimoto et al.

(10) Patent No.: US 10,558,121 B2
(45) Date of Patent: *Feb. 11, 2020

(54) PRODUCTION METHOD OF WIRED CIRCUIT BOARD

(71) Applicant: NITTO DENKO CORPORATION, Osaka (JP)

(72) Inventors: Yuu Sugimoto, Osaka (JP); Hiroyuki Tanabe, Osaka (JP); Yoshito Fujimura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 123 days.

This patent is subject to a terminal disclaimer.

(21) Appl. No.: 15/605,259

(22) Filed: May 25, 2017

(65) Prior Publication Data

US 2017/0351181 A1 Dec. 7, 2017

(30) Foreign Application Priority Data

Jun. 7, 2016 (JP) .................. 2016-113756

(51) Int. Cl.
*G03F 7/20* (2006.01)
*G03F 1/38* (2012.01)
(Continued)

(52) U.S. Cl.
CPC .............. *G03F 7/2022* (2013.01); *G03F 1/38* (2013.01); *G03F 7/039* (2013.01); *G03F 7/2002* (2013.01);
(Continued)

(58) Field of Classification Search
CPC .................................................. G03F 7/2022
See application file for complete search history.

(56) References Cited

U.S. PATENT DOCUMENTS

| 5,508,133 A | 4/1996 | Bae |
| 5,945,740 A | 8/1999 | Kawazoe |

(Continued)

FOREIGN PATENT DOCUMENTS

| JP | H05-074701 A | 3/1993 |
| JP | 06-224118 A | 8/1994 |

(Continued)

OTHER PUBLICATIONS

Non-Final Office Action issued by the USPTO dated Mar. 27, 2018 in connection with U.S. Appl. No. 15/478,711.

(Continued)

*Primary Examiner* — Kathleen Duda
(74) *Attorney, Agent, or Firm* — Edwards Neils LLC; Jean C. Edwards, Esq.

(57) ABSTRACT

In a method for producing a wired circuit board includes a step (1), in which the insulating layer having an inclination face is provided; a step (2), in which a metal thin film is provided on the surface of the insulating layer including the inclination face; a step (3), in which a photoresist is provided on the surface of the metal thin film; a step (4), in which a photomask is disposed so that a first light exposure portion and a second light exposure portion in the photoresist are exposed to light, and the photoresist is exposed to light; a step (5), in which the first light exposure portion and the second light exposure portion are removed; and a step (6), in which the first wire and the second wire are provided on the surface of the metal thin film.

4 Claims, 30 Drawing Sheets

(51) Int. Cl.
*G03F 7/039* (2006.01)
*G03F 7/26* (2006.01)
*G03F 7/38* (2006.01)
*H05K 3/06* (2006.01)
*H05K 3/10* (2006.01)
*H05K 3/18* (2006.01)

(52) U.S. Cl.
CPC .................. *G03F 7/26* (2013.01); *G03F 7/38* (2013.01); *H05K 3/064* (2013.01); *H05K 3/108* (2013.01); *H05K 3/188* (2013.01); *H05K 2203/0557* (2013.01)

(56) References Cited

U.S. PATENT DOCUMENTS

| | | | |
|---|---|---|---|
| 6,252,176 | B1 | 6/2001 | Kuramochi et al. |
| 7,250,575 | B2 | 7/2007 | Nagao et al. |
| 8,610,000 | B2 | 12/2013 | Champion |
| 8,664,535 | B2 | 3/2014 | Kamei et al. |
| 9,226,395 | B2 | 12/2015 | Ihara |
| 10,143,088 | B2 * | 11/2018 | Sugimoto .............. G03F 7/2002 |
| 10,257,926 | B2 * | 4/2019 | Sugimoto ............ H05K 1/0284 |
| 2003/0026078 | A1 | 2/2003 | Komatsubara et al. |
| 2004/0234896 | A1 | 11/2004 | Takeo et al. |
| 2005/0122627 | A1 | 6/2005 | Kanagawa et al. |
| 2009/0114426 | A1 | 5/2009 | Tsunekawa et al. |
| 2009/0151994 | A1 | 6/2009 | Ohsawa et al. |
| 2009/0211787 | A1 | 8/2009 | Kamei et al. |
| 2013/0323924 | A1* | 12/2013 | DeVilliers ........... G03F 7/70466 438/637 |
| 2014/0177106 | A1 | 6/2014 | Shirafuji |
| 2015/0034369 | A1 | 2/2015 | Kashima et al. |
| 2015/0084208 | A1 | 3/2015 | Iida et al. |

FOREIGN PATENT DOCUMENTS

| | | |
|---|---|---|
| JP | H10-003632 A | 1/1998 |
| JP | H10-041302 A | 2/1998 |
| JP | 2004-191596 A | 7/2004 |
| JP | 2004-348846 A | 12/2004 |
| JP | 2009-129490 A | 6/2009 |
| JP | 2009-206281 A | 9/2009 |
| JP | 2012-089204 A | 5/2012 |
| JP | 2012-104210 A | 5/2012 |
| JP | 2012-128926 A | 7/2012 |
| JP | 2012-155802 A | 8/2012 |
| JP | 2013-033805 A | 2/2013 |
| JP | 2014-127216 A | 7/2014 |
| JP | 2015-149118 A | 8/2015 |

OTHER PUBLICATIONS

Final Office Action issued by the USPTO dated Apr. 30, 2018 in connection with U.S. Appl. No. 15/386,744.
Final Office Action issued by the USPTO dated Sep. 26, 2018 in connection with U.S. Appl. No. 15/478,711.
Final Office Action issued by the USPTO dated Jul. 23, 2018 in connection with U.S. Appl. No. 15/463,538.
Non-Final Office Action issued by the USPTO dated Dec. 27, 2017 in connection with U.S. Appl. No. 15/463,538.
Non-Final Office Action issued by the USPTO dated Dec. 28, 2017 in connection with U.S. Appl. No. 15/386,744.
Non-Final Office Action issued by the USPTO dated Feb. 26, 2018 in connection with U.S. Appl. No. 15/712,613.
Non-Final Office Action issued by the USPTO dated Feb. 8, 2019 in connection with U.S. Appl. No. 15/478,711.
Notification of Reasons for Refusal issued by the Japanese Patent Office dated Jun. 18, 2019, in connection with Japanese Patent Application No. 2015-254338.
Final Office Action issued by the USPTO dated Aug. 5, 2019 in connection with U.S. Appl. No. 15/478,711.
Notification of Reasons for Refusal issued by the Japanese Patent Office dated Oct. 1, 2019, in connection with Japanese Patent Application No. 2015-254338.
Non-Final Office Action issued by the U.S. Patent and Trademark Office in connection with related U.S. Appl. No. 15/478,711 dated Nov. 15, 2019.
Notification of Reasons for Refusal dated Dec. 17, 2019 in connection with Japanese Patent Application No. 2016-077551.

* cited by examiner

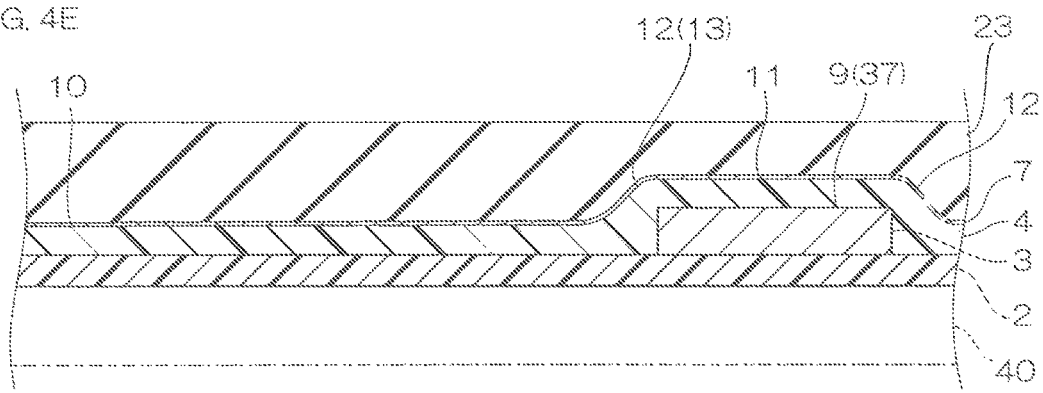
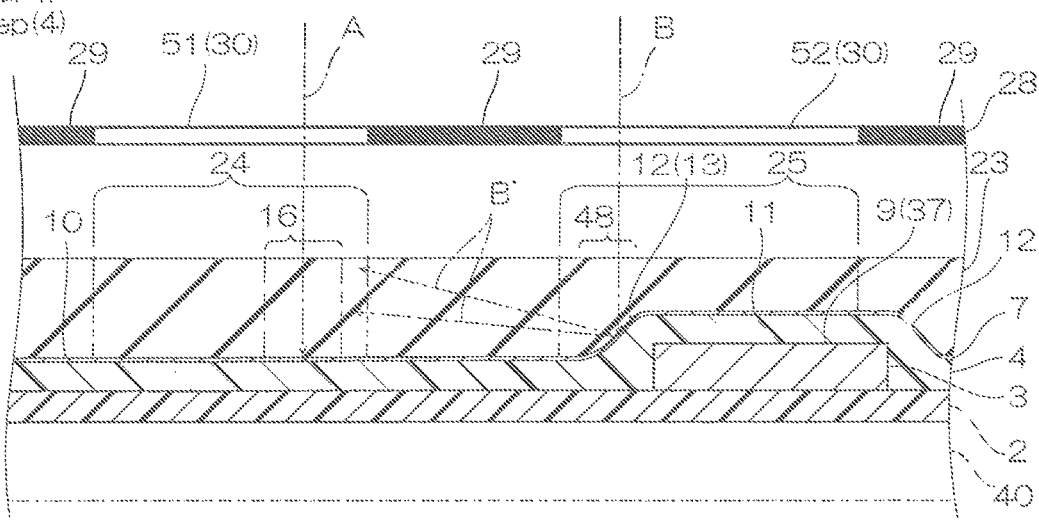
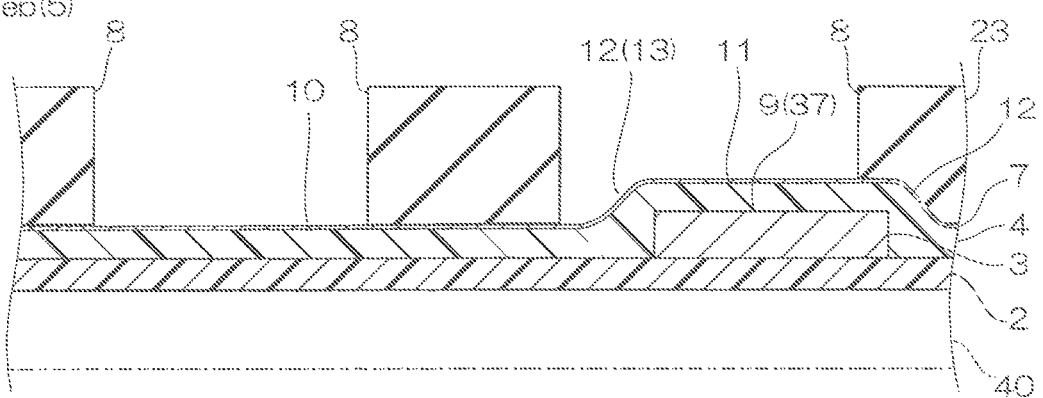

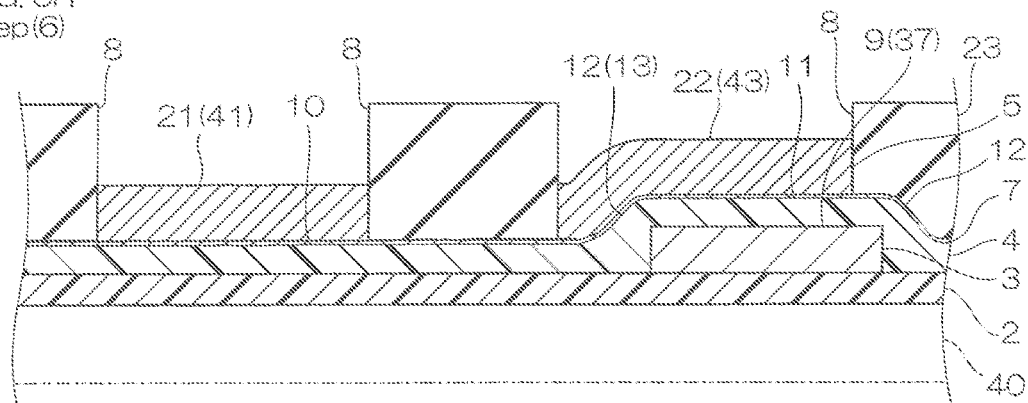
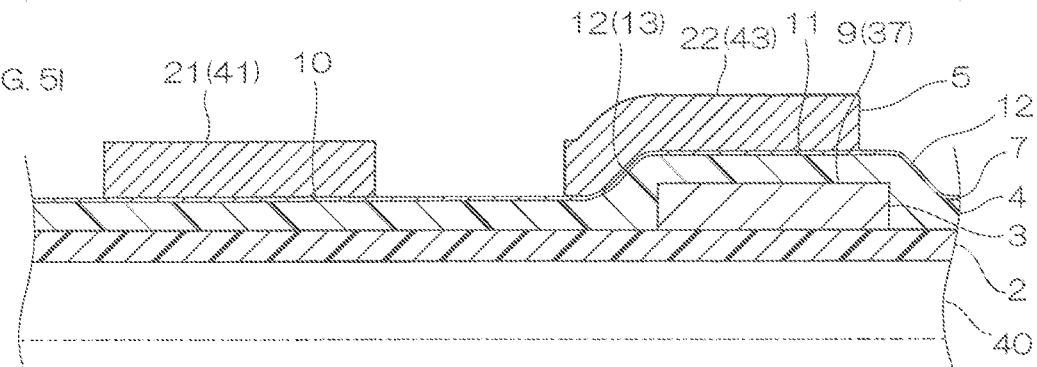
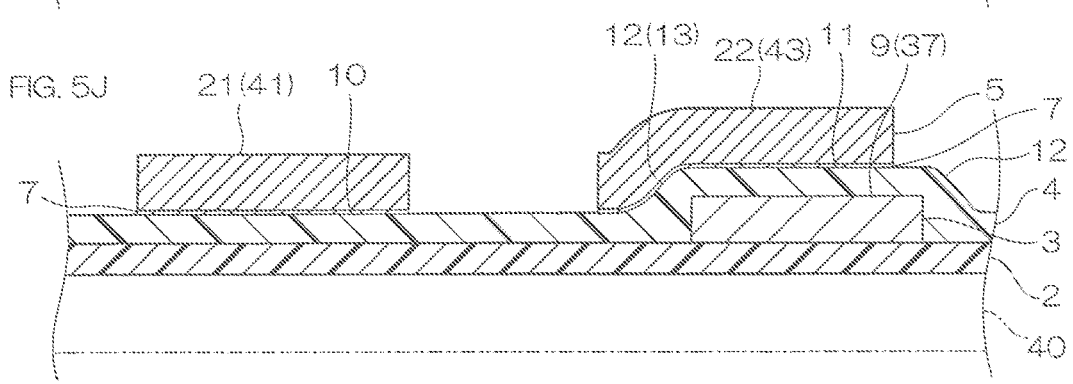
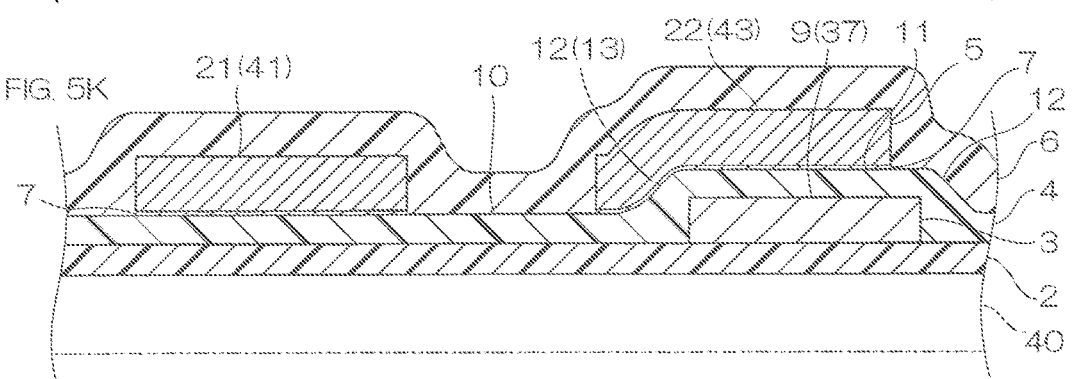

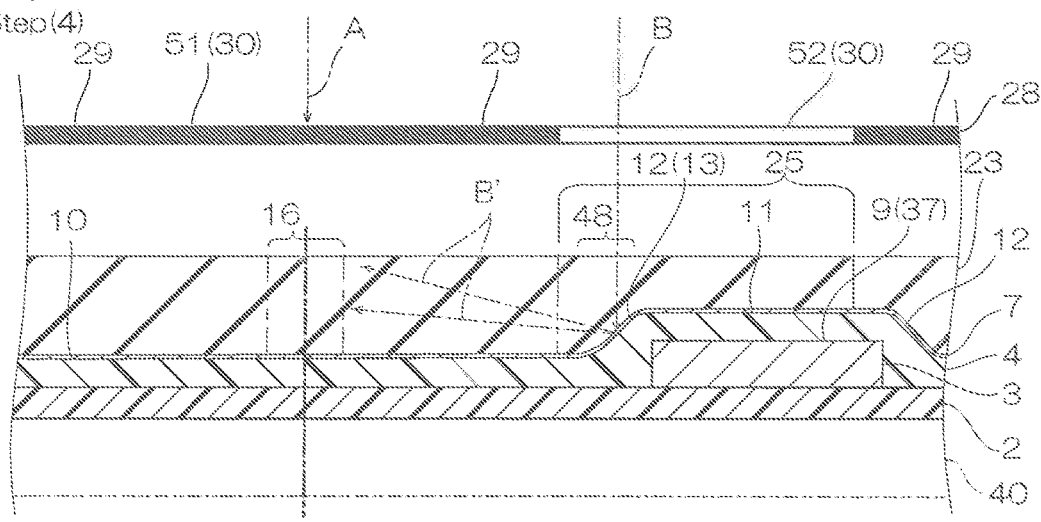
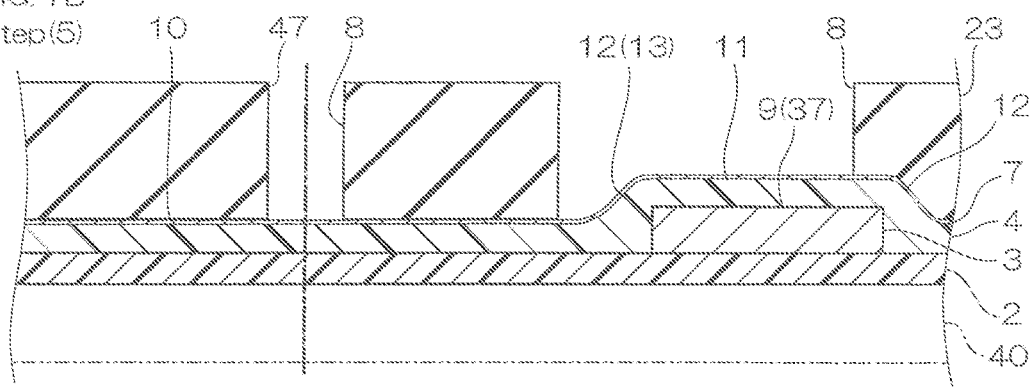
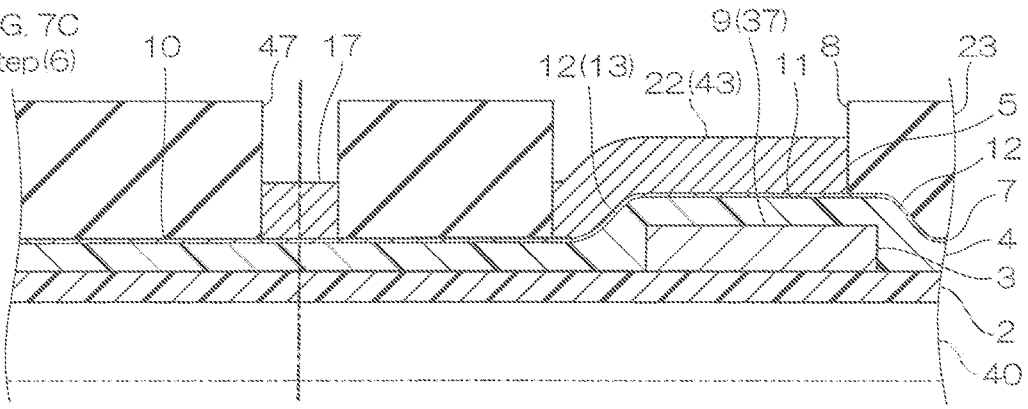

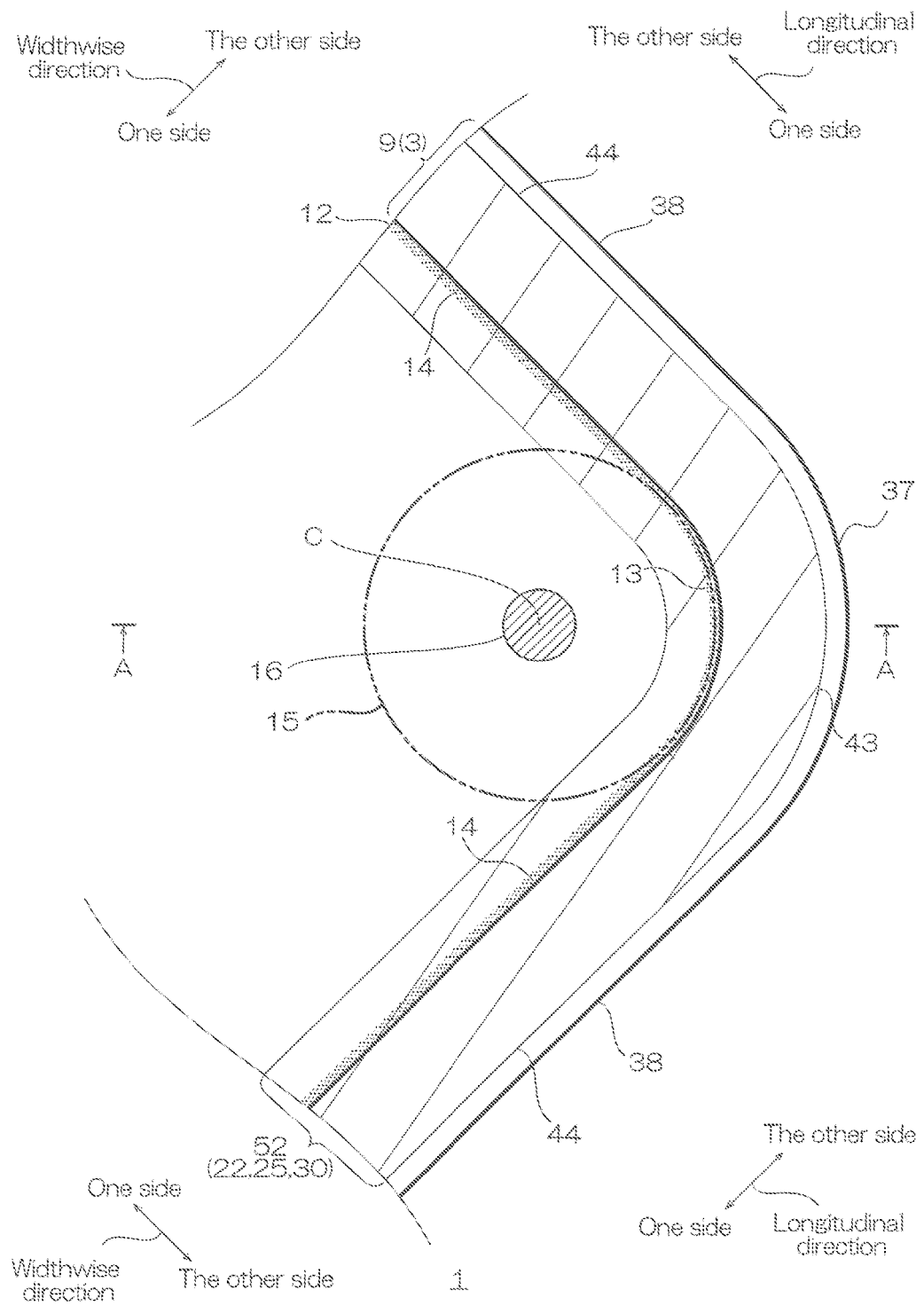

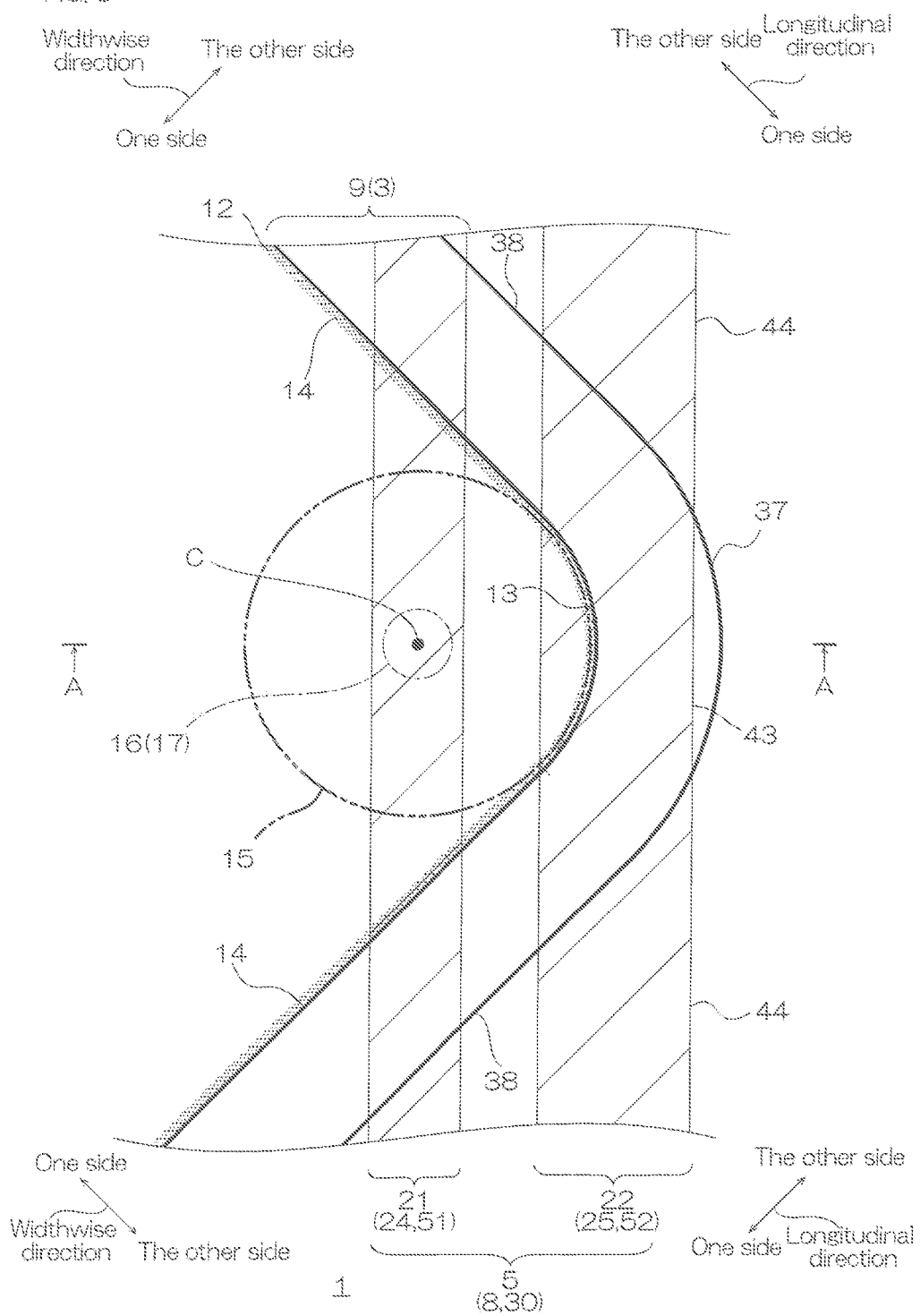

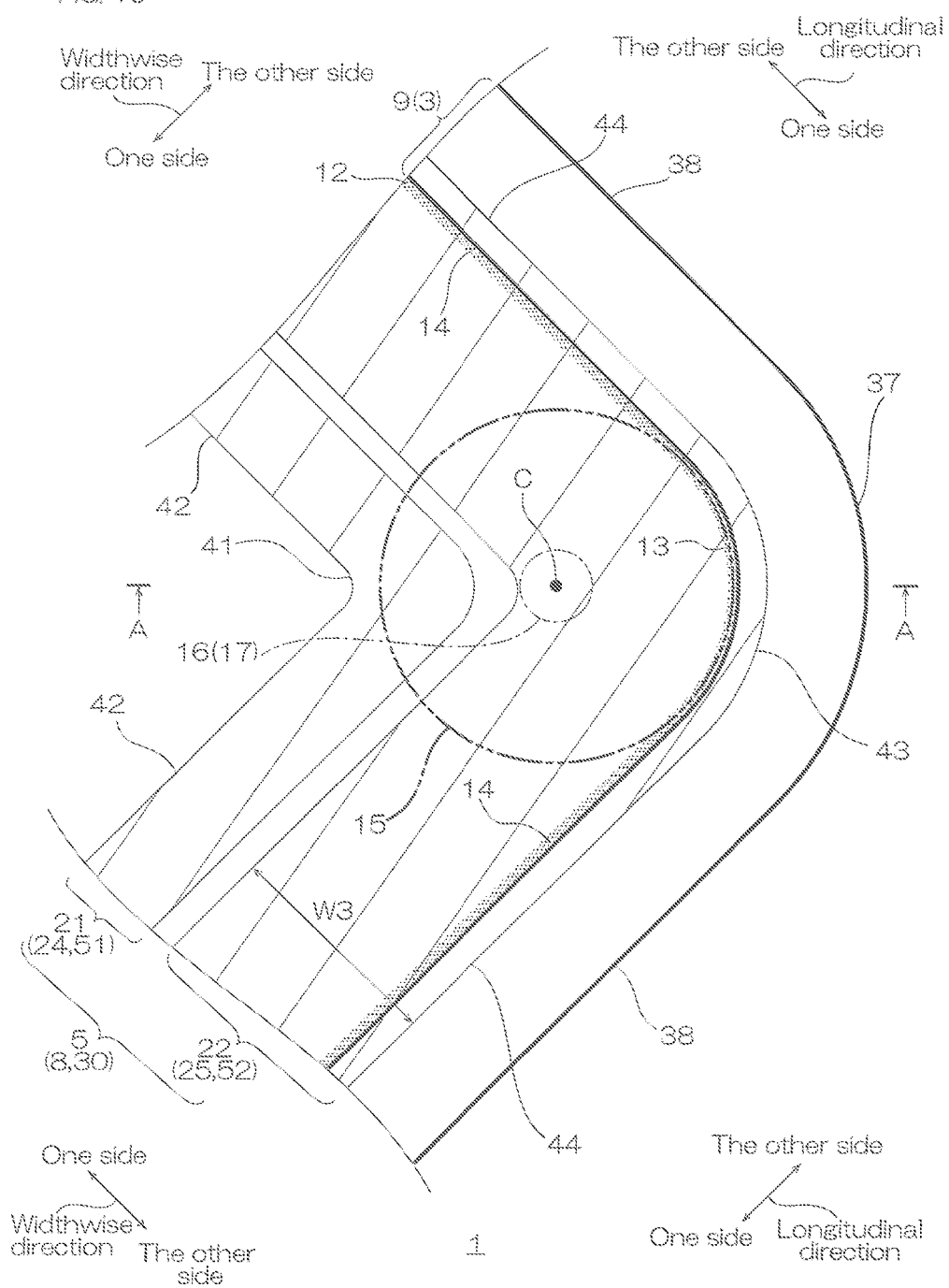

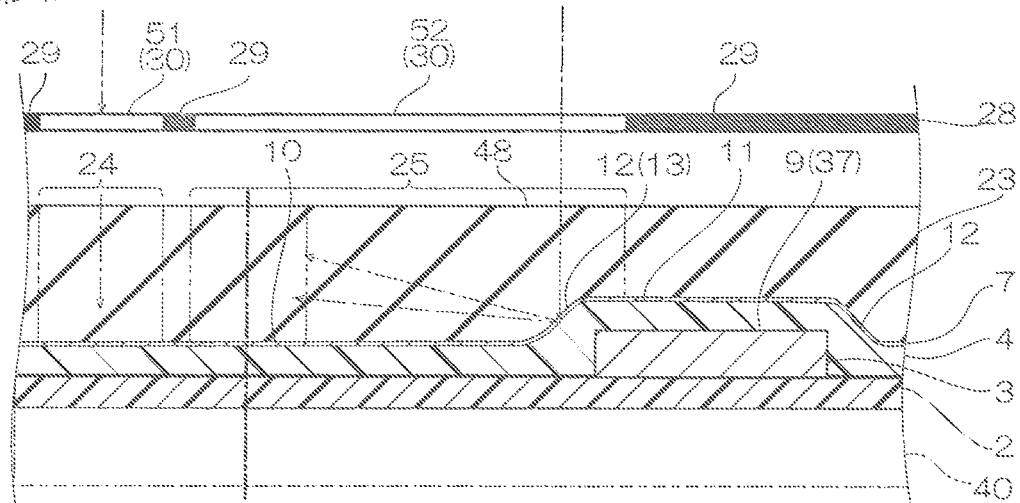
FIG. 12A Step(4)
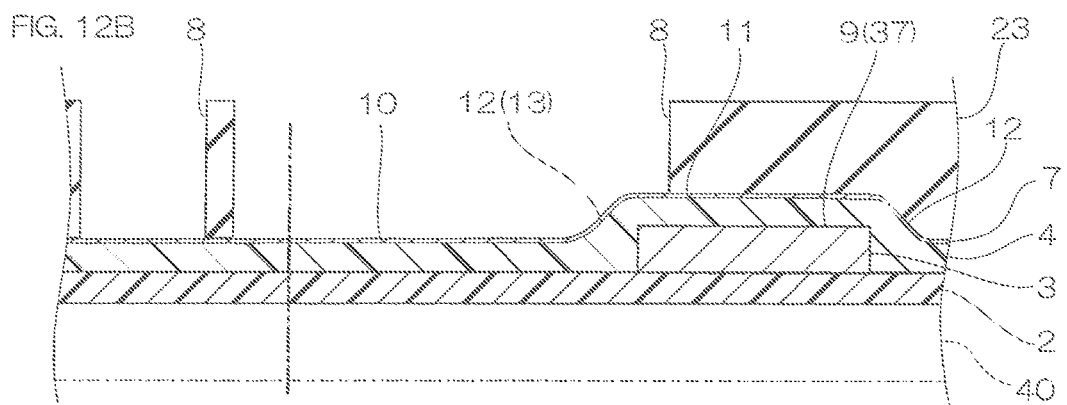
FIG. 12B
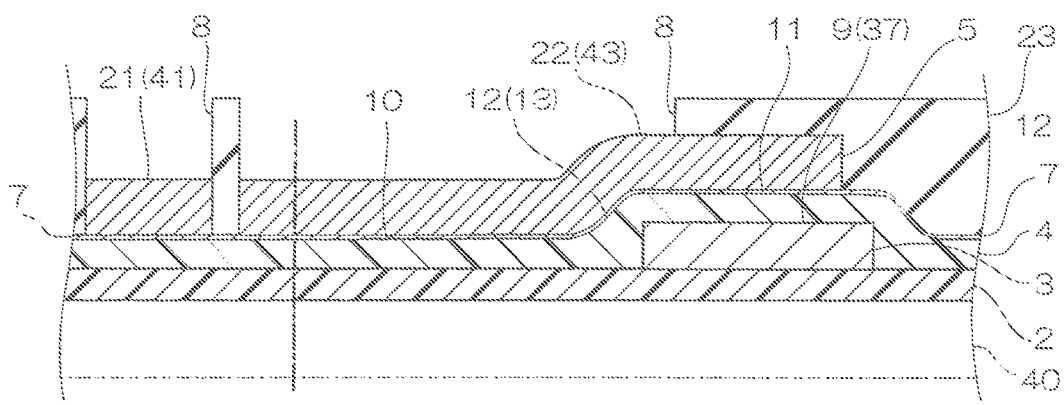
FIG. 12C

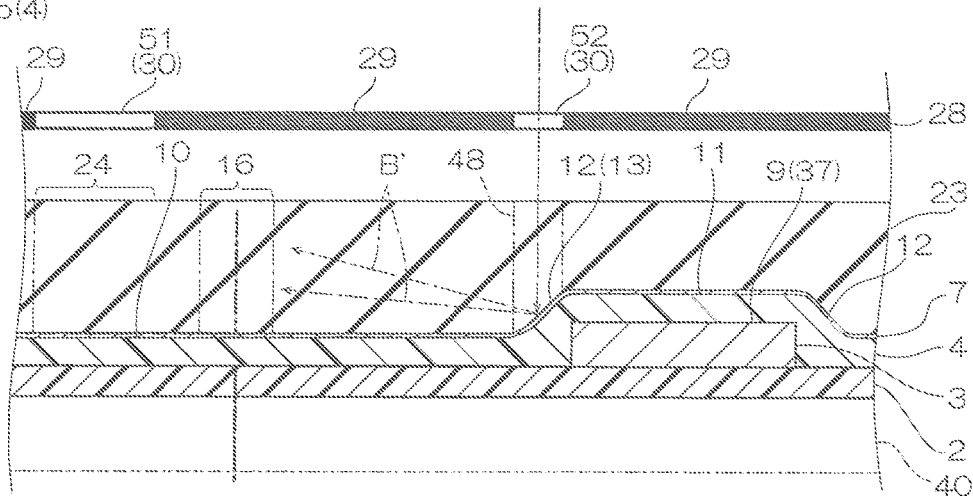
FIG. 14A Step(4)
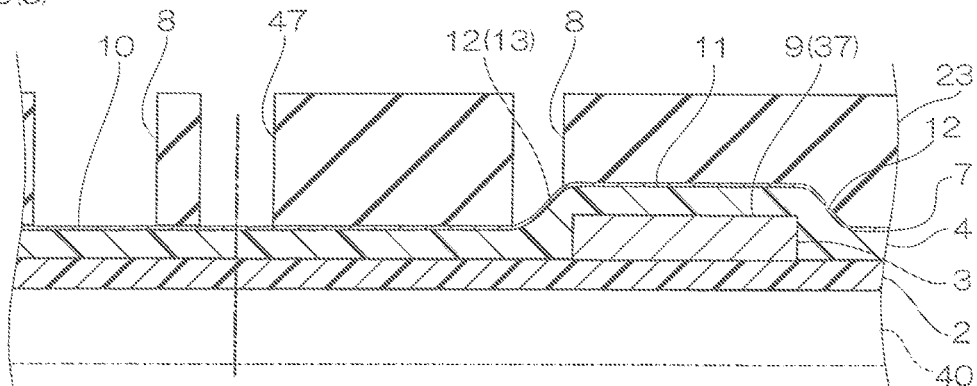
FIG. 14B Step(5)
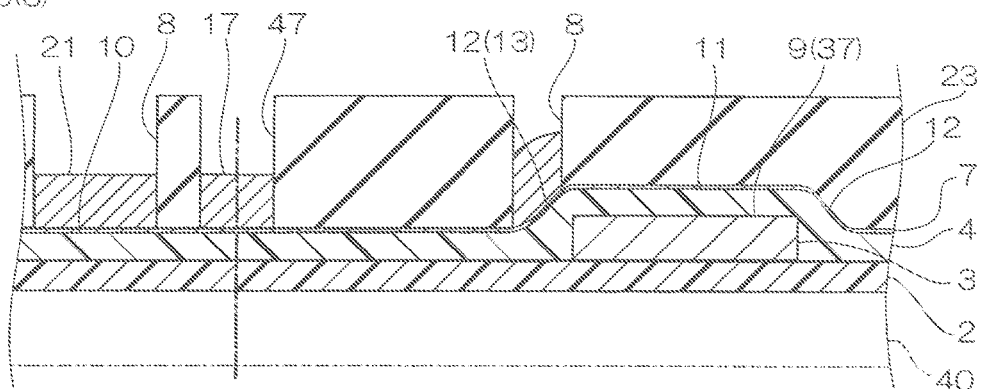
FIG. 14C Step(6)

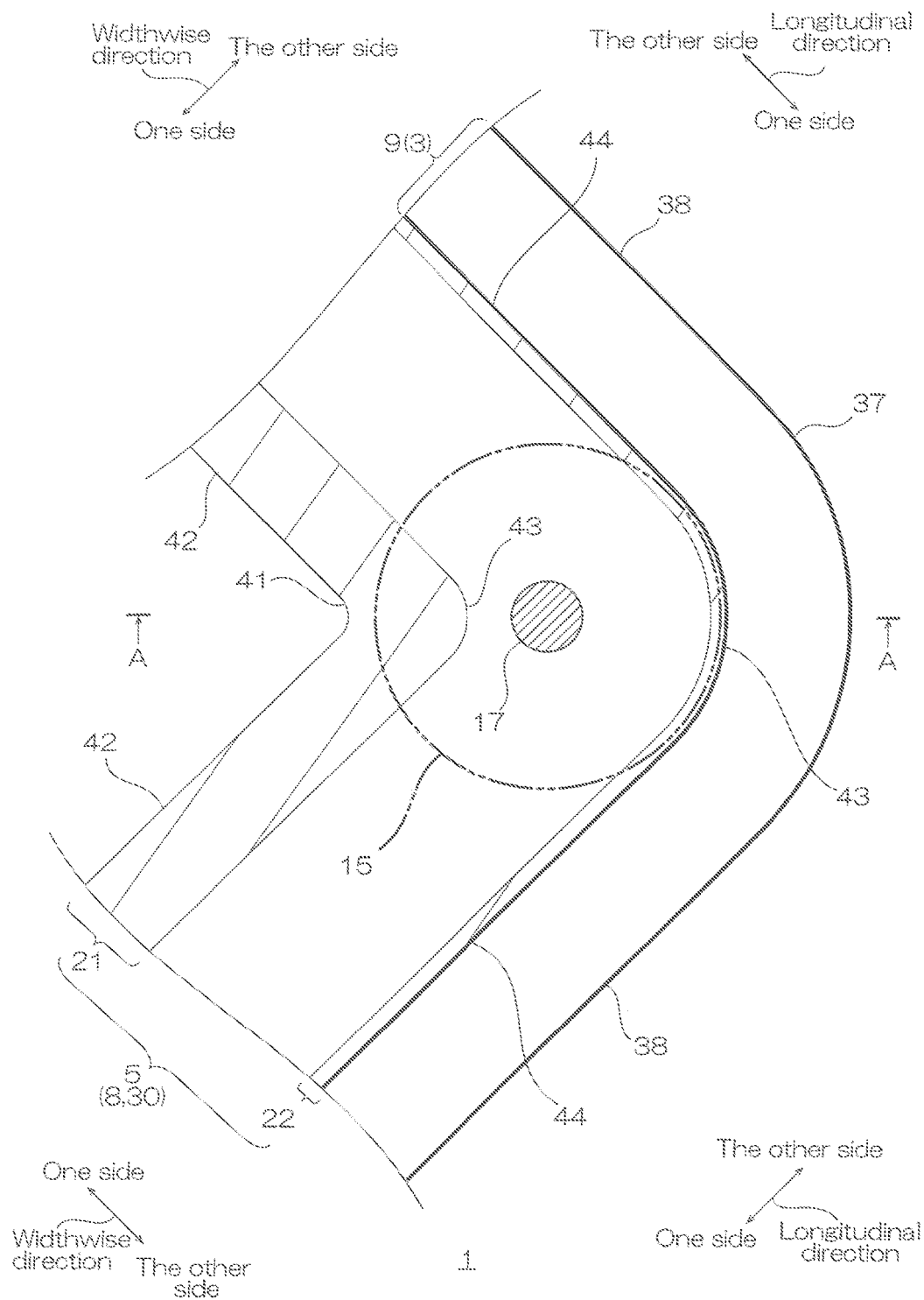

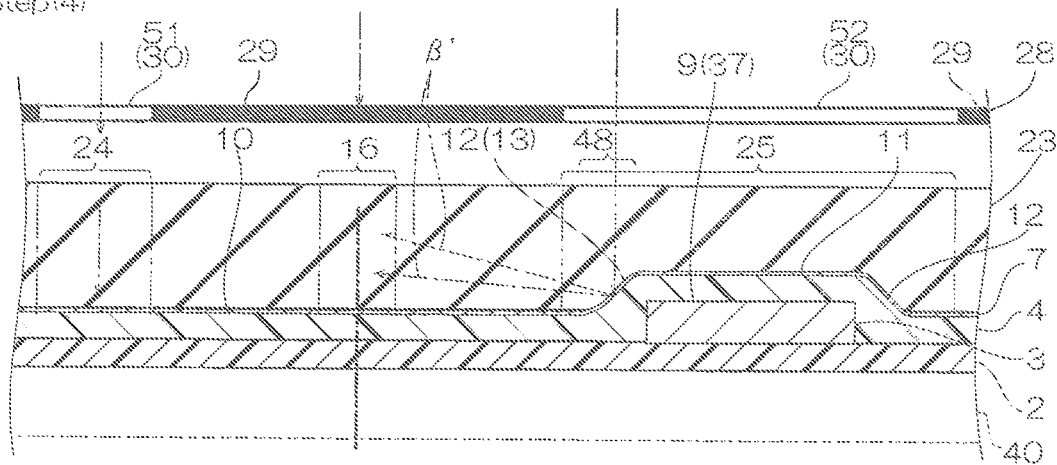
FIG. 19A Step(4)
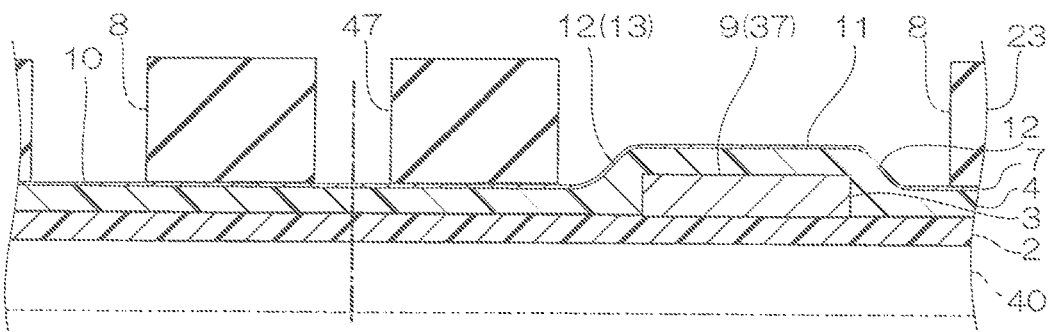
FIG. 19B
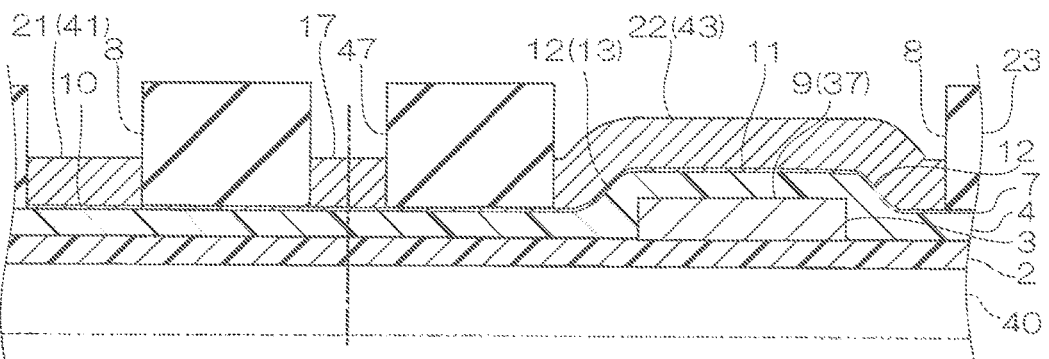
FIG. 19C

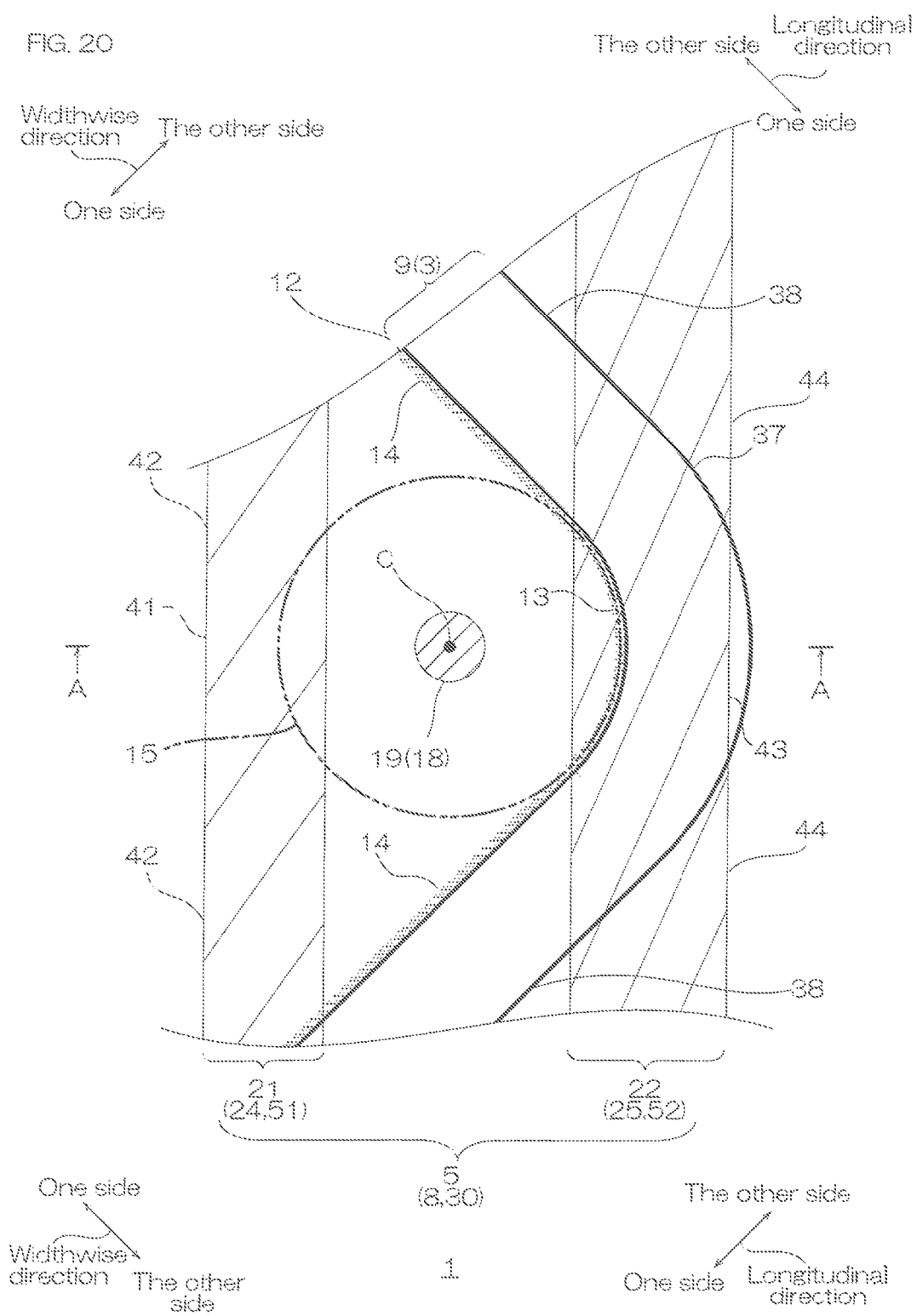

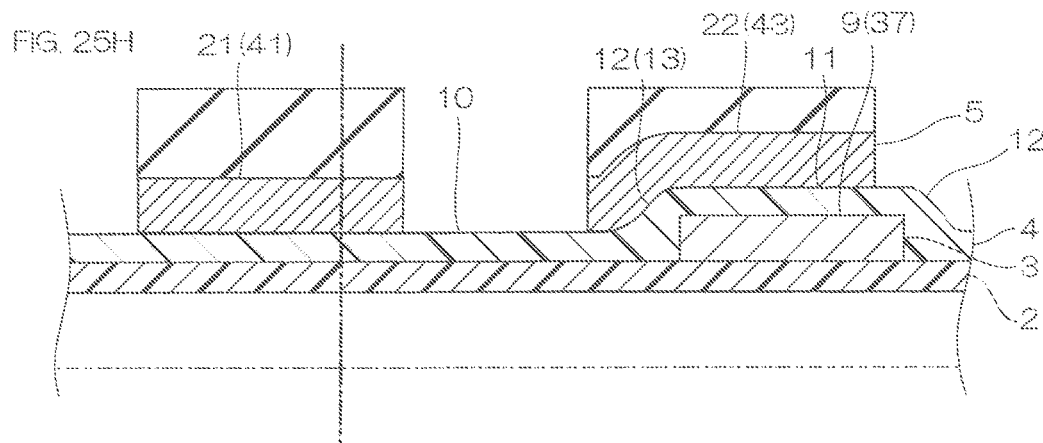
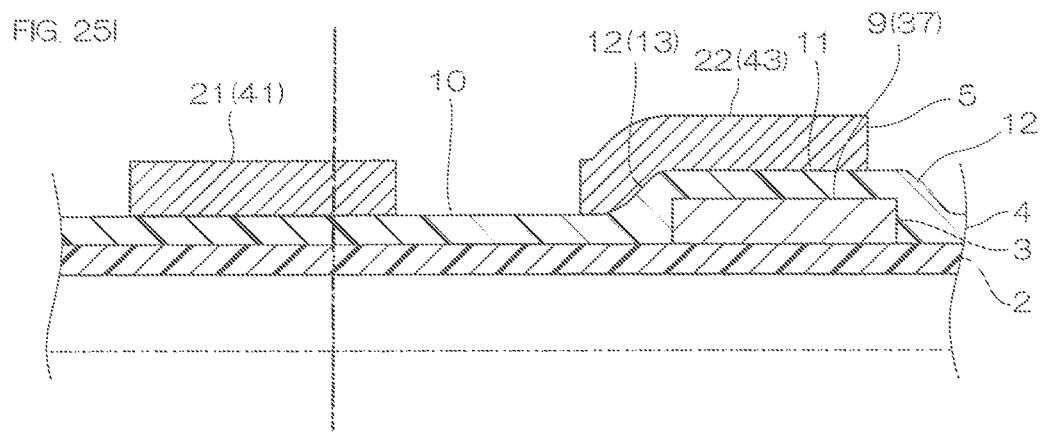
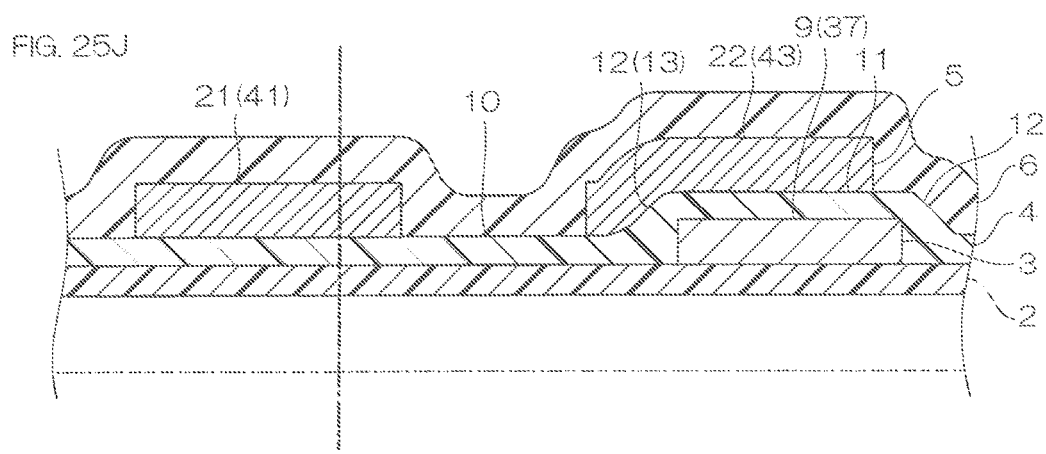

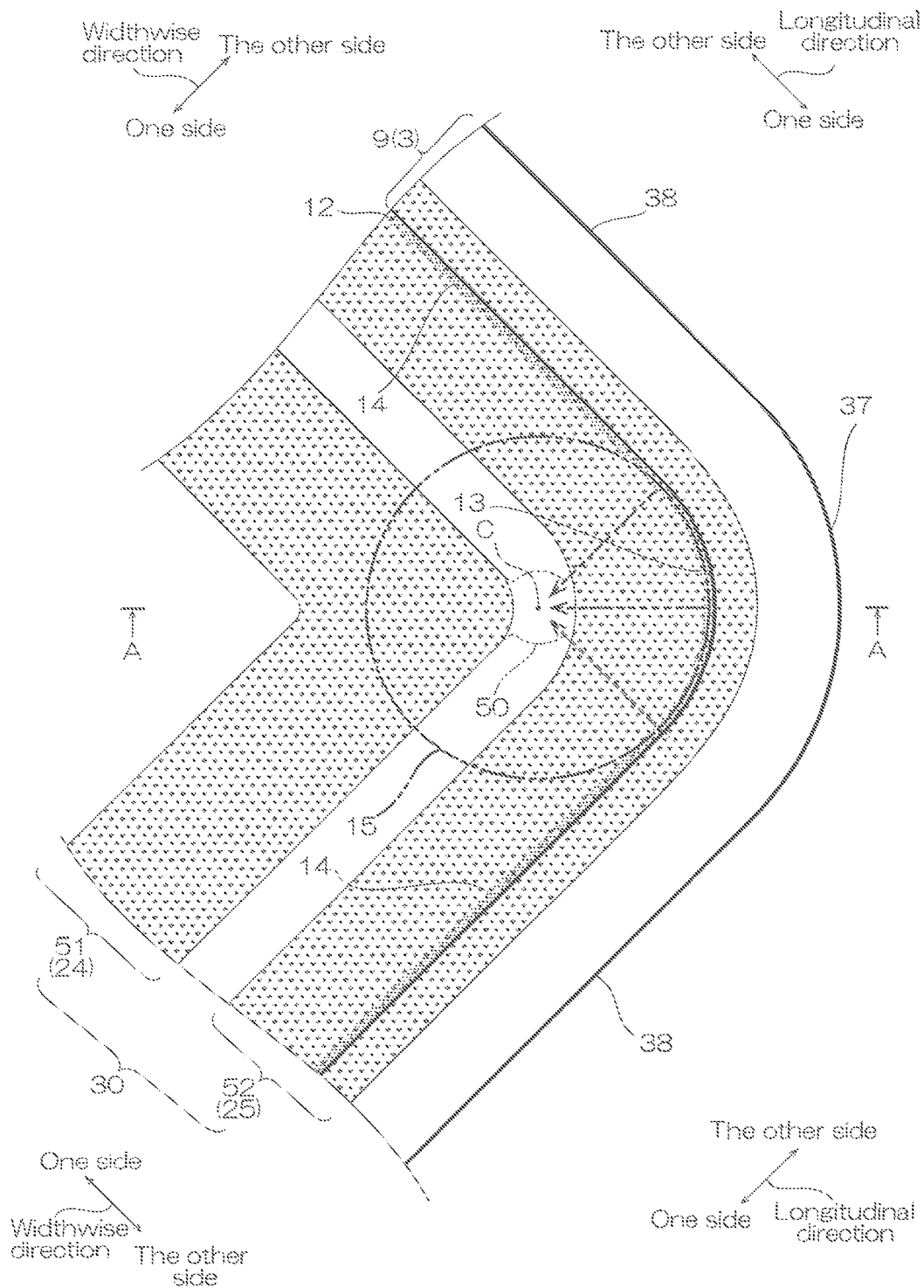

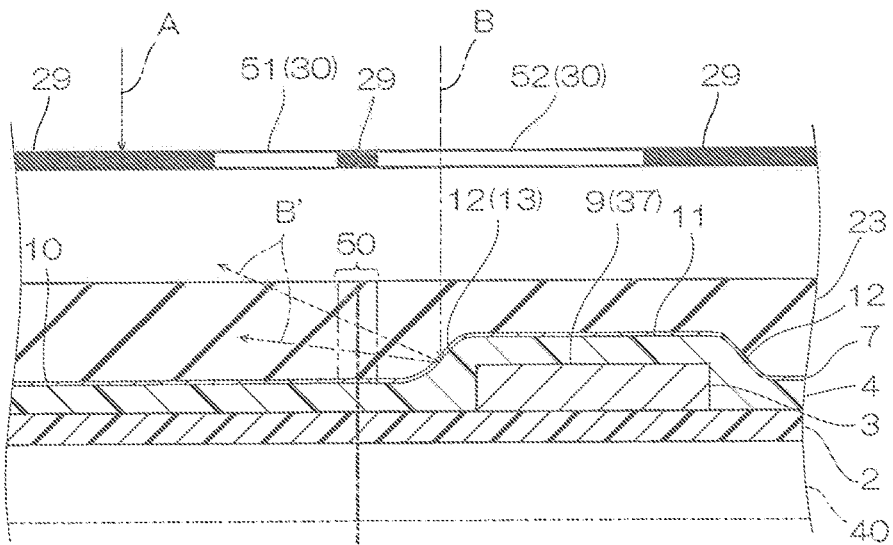
FIG. 28A Step (4)
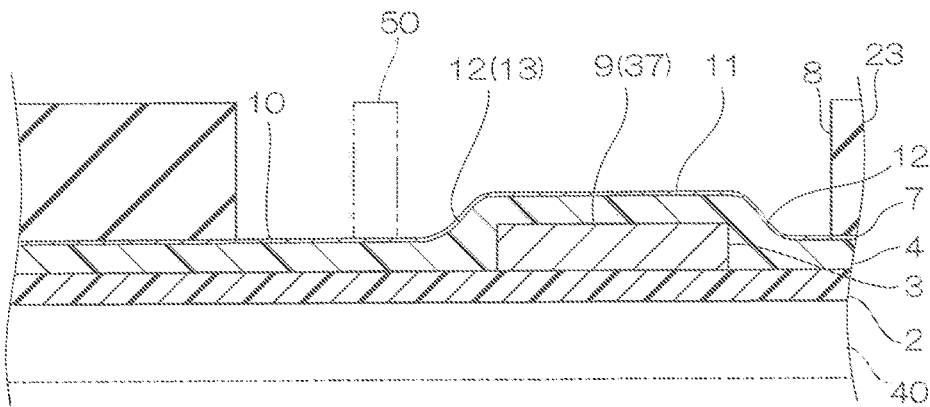
FIG. 28B Step (5)
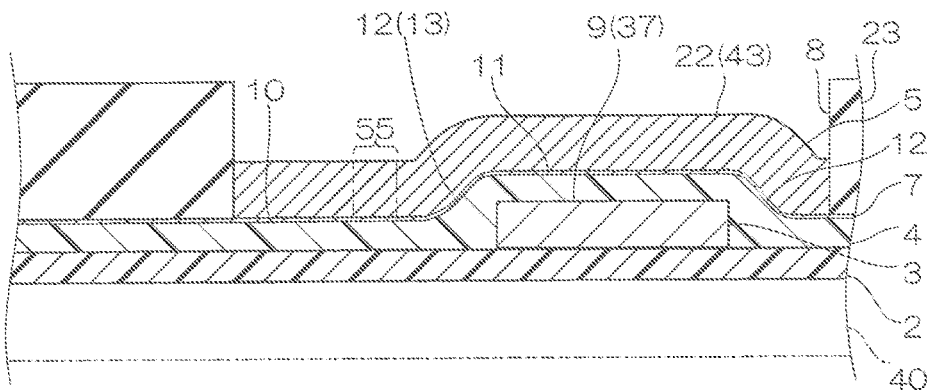
FIG. 28C Step (6)

PRODUCTION METHOD OF WIRED CIRCUIT BOARD

CROSS-REFERENCE TO RELATED APPLICATION

The present application claims priority from Japanese Patent Application No. 2016-113756 filed on Jun. 7, 2016, the contents of which are hereby incorporated by reference into this application.

BACKGROUND OF THE INVENTION

Field of the Invention

The present invention relates to a production method of a wired circuit board.

Description of Related Art

As a method for producing a wired circuit board, a method in which an insulating layer is prepared, and then, a wiring pattern is provided on the insulating layer has been known.

For example, Japanese Unexamined Patent Publication No. 2014-127216 has proposed a method for producing a suspension board with circuit: the method includes a step of forming a first portion having a first thickness and a second portion having a second thickness that is smaller than the first thickness in the insulating layer, and a step of forming a wiring pattern so as to extend on the first portion and the second portion of the insulating layer.

To be specific, in the production method described in Japanese Unexamined Patent Publication No. 2014-127216, in the step of forming the wiring pattern, the wiring pattern is formed on the top face of the insulating layer so that the boundary between the top face and the boundary face of the first portion extends in a first direction, the side of the wiring pattern extends in a second direction crossing the first direction, and the second direction forms an angle of 60 degrees or more and 90 degrees or less relative to the first direction.

Because the boundary face is formed between the top face of the first portion and the top face of the second portion, in the step of forming the wiring pattern on the insulating layer by photo lithography technology, reflection of exposure light is caused at the boundary face, and the reflected light applies indirectly to other regions. However, in the method described in Japanese Unexamined Patent Publication No. 2014-127216, the exposure light is reflected in a direction that is close to the direction in which the wiring pattern extends at the boundary face, and therefore, the reflected light substantially does not affect the pattern of the original exposure light. Thus, breakage or short circuit is prevented in the wiring pattern formed by the photo lithography technology.

SUMMARY OF THE INVENTION

Recently, when producing a small-sized wired circuit board, sometimes a wiring pattern is disposed with high density. In such a case, the wiring pattern may not be formed so as to form an angle between the second direction and the first direction to be 60 degrees or more and 90 degrees or less as in Japanese Unexamined Patent Publication No. 2014-127216. Then, there are disadvantages in that short circuit of the wiring pattern cannot be prevented.

The present invention provides a method for producing a wired circuit board in which short circuit of a first wire and a second wire can be prevented, while they are provided with high density.

The present invention (1) includes a method for producing a wired circuit board including an insulating layer, and a first wire and a second wire disposed next to each other in spaced-apart relation, the method including the steps of:

a step (1), in which the insulating layer having an inclination face is provided;

a step (2), in which a metal thin film is provided on the surface of the insulating layer including the inclination face;

a step (3), in which a photoresist is provided on the surface of the metal thin film;

a step (4), in which a photomask is disposed so that a first light exposure portion corresponding to the first wire in the photoresist and a second light exposure portion corresponding to the second wire in the photoresist are exposed to light, and the photoresist is exposed to light through the photomask;

a step (5), in which the first light exposure portion and the second light exposure portion in the photoresist are removed to expose the metal thin film corresponding to the first light exposure portion and the second light exposure portion; and a step (6), in which the first wire and the second wire are provided on the surface of the metal thin film, wherein the inclination face has a generally arc shape when viewed from the top, in the step (4), the second light exposure portion of the photoresist has a facing portion facing the inclination face, in the step (4), the reflected light reflected at the metal thin film corresponding to the arc is focused on the photoresist corresponding to the center of the virtual circle along the are, and in the step (4), the photomask is disposed so as to satisfy the following Conditions A to C.

Condition A: At least a portion of the first light exposure portion and at least a portion of the second light exposure portion are overlapped with the virtual circle when viewed from the top.

Condition B: In either assumption of Assumption 1 in which the first light exposure portion is not exposed to light and the second light exposure portion is exposed to light or Assumption 2 in which the first light exposure portion is exposed to light, a portion other than the facing portion in the second light exposure portion is not exposed to light, and the facing portion in the second light exposure portion is exposed to light, the photoresist has a light focused portion caused by light focus of the reflected light in the step (4) and removed in the step (5).

Condition C: In the Assumption 1, the light focused portion is disposed in spaced-apart relation to the second light exposure portion that is overlapped with the virtual circle when viewed from the top, and in the Assumption 2, the light focused portion is disposed in spaced-apart relation to the first light exposure portion that is overlapped with the virtual circle when viewed from the top.

With the method, in the step (4), the Condition A is satisfied, so that at least a portion of the first wire and at least a portion of the second wire provided in the step (6) are overlapped with the virtual circle of the inclination face when viewed from the top. Thus, the first wire and the second wire can be disposed with high density.

Meanwhile, in the Condition B, when the Assumption 1 in which a first light exposure portion 24 is not exposed to light and a second light exposure portion 25 is exposed to light is satisfied, as shown in the phantom line of FIG. 6, a light focused portion 16 caused by a reflected light B' generated by an inclination face 12 is generated. When a first wire 21 and a second wire 22 are disposed with high density, the light focused portion 16 is easily connected to the second light exposure portion 25 shown in the phantom line. Furthermore, in the Condition B, when the Assumption 2 in which the first light exposure portion 24 is exposed to light, a portion other than an inclination face facing portion 48 in the second light exposure portion 25 is not exposed to light, and the inclination face facing portion 48 in the second light exposure portion 25 is exposed to light is satisfied, as shown in the phantom line of FIG. 13, the light focused portion 16 is generated. When the first wire 21 and the second wire 22 are disposed with high density, the light focused portion 16 is easily connected to the first light exposure portion 24 shown in the phantom line. Then, as shown in FIG. 28C and FIG. 29, there is a disadvantage in that in the step (6), a short circuit portion 55 corresponding to the light focused portion 16 is connected to the first wire 21 and the second wire 22 to cause short circuit of the first wire 21 and the second wire 22.

However, the present invention satisfies the Assumption 1 of the Condition C, so that as shown in FIG. 6 and FIG. 7A, even when the Assumption 1 of the Condition B is satisfied, the light focused portion 16 is disposed in spaced-apart relation to the second light exposure portion 25 that is overlapped with a virtual circle 15 when viewed from the top. Thus, in the step (6), as shown in FIG. 7C and FIG. 8, an isolated conductive portion 17 corresponding to the light focused portion 16 is disposed in spaced-apart relation to the second wire 22 corresponding to the second light exposure portion 25. Thus, short circuit of the second wire 22 caused by the isolated conductive portion 17 can be prevented.

Or, the present invention satisfies the Assumption 2 of the Condition C, so that as shown in FIG. 13 and FIG. 14A, even when the Assumption 2 of the Condition B is satisfied, the light focused portion 16 is disposed in spaced-apart relation to the first light exposure portion 24 that is overlapped with the virtual circle 15 when viewed from the top. Thus, in the step (6), as shown in FIG. 14C and FIG. 15, the isolated conductive portion 17 corresponding to the light focused portion 16 is disposed in spaced-apart relation to the first wire 21 corresponding to the first light exposure portion 24. Thus, short circuit of the first wire 21 caused by the isolated conductive portion 17 can be prevented.

As a result, the wired circuit board can be obtained in which short circuit of the first wire and the second wire can be prevented, while they are provided with high density.

The present invention (2) includes a method for producing a wired circuit board including an insulating layer, and a first wire and a second wire disposed next to each other in spaced-apart relation, the method including the steps of:

a step (1), in which the insulating layer having an inclination face is provided;

a step (2), in which a conductive layer is provided on the surface of the insulating layer including the inclination face;

a step (3), in which a photoresist is provided on the surface of the conductive layer;

a step (4), in which a photomask is disposed so that a first light exposure portion corresponding to the first wire in the photoresist and a second light exposure portion corresponding to the second wire in the photoresist are exposed to light, and the photoresist is exposed to light through the photomask;

a step (5), in which a portion other than the first light exposure portion and the second light exposure portion in the photoresist is removed to expose the conductive layer from the portion other than the first light exposure portion and the second light exposure portion; and a step (6), in which the conductive layer exposed from the portion other than the first light exposure portion and the second light exposure portion is removed, and the first wire and the second wire are formed, wherein the inclination face has a generally arc shape when viewed from the top, in the step (4), the second light exposure portion of the photoresist has a facing portion facing the inclination face, in the step (4), the reflected light reflected at the conductive layer corresponding to the arc is focused on the photoresist corresponding to the center of the virtual circle along the arc, and in the step (4), the photomask is disposed so as to satisfy the following conditions A to C.

Condition A: At least a portion of the first light exposure portion and at least a portion of the second light exposure portion are overlapped with the virtual circle when viewed from the top.

Condition B: In either assumption of Assumption 1 in which the first light exposure portion is not exposed to light and the second light exposure portion is exposed to light or Assumption 2 in which the first light exposure portion is exposed to light, a portion other than the facing portion in the second light exposure portion is not exposed to light, and the facing portion in the second light exposure portion is exposed to light, the photoresist has a light focused portion caused by light focus of the reflected light in the step (4) and removed in the step (5).

Condition C: In the Assumption 1, the light focused portion is disposed in spaced-apart relation to the second light exposure portion that is overlapped with the virtual circle when viewed from the top, and in the Assumption 2, the light focused portion is disposed in spaced-apart relation to the first light exposure portion that is overlapped with the virtual circle when viewed from the top.

With the method, in the step (4), the Condition A is satisfied, so that at least a portion of the first wire and at least a portion of the second wire provided in the step (6) are overlapped with the virtual circle of the inclination face when viewed from the top. Thus, the first wire and the second wire can be disposed with high density.

Meanwhile, in the Condition B, when the Assumption 1 in which the first light exposure portion 24 is not exposed to light and the second light exposure portion 25 is exposed to light is satisfied, as shown in the phantom line of FIG. 6, the light focused portion 16 caused by the reflected light B' generated by the inclination face 12 is generated. When the first wire 21 and the second wire 22 are disposed with high density, the light focused portion 16 is easily connected to the second light exposure portion 25 shown in the phantom line. Furthermore, in the Condition B, when the Assumption 2 in which the first light exposure portion 24 is exposed to light, the portion other than the inclination face facing portion 48 in the second light exposure portion 25 is not exposed to light, and the inclination face facing portion 48 in the second light exposure portion 25 is exposed to light is satisfied, as shown in the phantom line of FIG. 13, the light focused portion 16 is generated. When the first wire 21 and the second wire 22 are disposed with high density, the light focused portion 16 is easily connected to the first light exposure portion 24 shown in the phantom line. Then, as shown in FIG. 28C and FIG. 29, there is a disadvantage in that in the step (6), the short circuit portion 55 corresponding to the light focused portion 16 is connected to the first wire 21 and the second wire 22 to cause short circuit of the first wire 21 and the second wire 22.

However, the present invention satisfies the Assumption 1 of the Condition C, so that as shown in FIG. 6 and FIG. 7A, even when the Assumption 1 of the Condition B is satisfied, the light focused portion 16 is disposed in spaced-apart relation to the second light exposure portion 25 that is overlapped with the virtual circle 15 when viewed from the top. Thus, in the step (6), as shown in FIG. 7C and FIG. 8, the isolated conductive portion 17 corresponding to the light focused portion 16 is disposed in spaced-apart relation to the second wire 22 corresponding to the second light exposure portion 25. Thus, short circuit of the second wire 22 caused by the isolated conductive portion 17 can be prevented.

Or, the present invention satisfies the Assumption 2 of the Condition C, so that as shown in FIG. 13 and FIG. 14A, even when the Assumption 2 of the Condition B is satisfied, the light focused portion 16 is disposed in spaced-apart relation to the first light exposure portion 24 that is overlapped with the virtual circle 15 when viewed from the top. Thus, in the step (6), as shown in FIG. 14C and FIG. 15, the isolated conductive portion 17 corresponding to the light focused portion 16 is disposed in spaced-apart relation to the first wire 21 corresponding to the first light exposure portion 24. Thus, short circuit of the first wire 21 caused by the isolated conductive portion 17 can be prevented.

As a result, the wired circuit board can be obtained in which short circuit of the first wire and the second wire can be prevented, while they are provided with high density.

The present invention (3) includes the method for producing a wired circuit board of (1) or (2), wherein in the step (4), either the first light exposure portion or the second light exposure portion includes the entire light focused portion.

According to the present invention, either the first light exposure portion or the second light exposure portion includes the entire light focused portion provided in the assumption, so that in the step (6), formation of the conductive portion caused by the light focused portion can be prevented. Thus, short circuit between the first wire and the second wire caused by the conductive portion can be more surely prevented.

With the present invention, the wired circuit board can be obtained in which short circuit of the first wire and the second wire can be prevented, while they are provided with high density.

BRIEF DESCRIPTION OF THE DRAWINGS

In FIG. 1, a translucent portion in a photomask disposed in the step (4) is shown in parentheses. Furthermore, in FIG. 1, a first light exposure portion and a second light exposure portion generated in a photoresist in the step (4) are shown in parentheses.

FIG. 3A illustrating a step (i), in which an insulating base layer is prepared,

FIG. 3B illustrating a step (ii), in which a lower-side conductive pattern is provided, FIG. 3C illustrating a step (1), in which an intermediate insulating layer is provided, and FIG. 3D illustrating a step (2), in which a metal thin film is provided.

FIG. 4E to FIG. 4G show, following FIG. 3D, a portion of process diagrams of the method for producing a wired circuit board shown in FIG. 2:

FIG. 4E illustrating a step (3), in which a photoresist is provided,

FIG. 4F illustrating a step (4), in which the photoresist is exposed to light, and FIG. 4G illustrating a step (5), in which the first light exposure portion and the second light exposure portion are removed.

FIG. 5H to FIG. 5K show, following FIG. 4C a portion of process diagrams of the method for producing a wired circuit board shown in FIG. 2:

FIG. 5H illustrating a step (6), in which an upper-side conductive pattern is provided, FIG. 5I illustrating a step (iii), in which the photoresist is removed, FIG. 5J illustrating a step (iv), in which the metal thin film corresponding to the photoresist is removed, and FIG. 5K illustrating a step (v), in which an insulating cover layer is provided.

FIG. 7A to FIG. 7C show a portion of process diagrams in the Assumption 1:

FIG. 7A illustrating a step (4), in which the second light exposure portion is exposed to light so as not to expose the first light exposure portion to light, FIG. 7B illustrating a step (5), in which the photoresist is developed, and FIG. 7C illustrating a step (6), in which electrolytic plating is performed.

FIG. 8 shows an enlarged plan view of the wired circuit board obtained by the Assumption 1.

FIG. 9 shows an enlarged plan view of a modified example (embodiment in which the first wire and the second wire have a generally linear shape when viewed from the top) of the wired circuit board of the first embodiment shown in FIG. 1.

FIG. 10 shows an enlarged plan view of an arc portion of a lower wire in a wired circuit board obtained in the method for producing a wired circuit board in a second embodiment of the present invention. In FIG. 10, a translucent portion in a photomask disposed in the step (4) is shown in parentheses. Furthermore, in FIG. 10, a first light exposure portion and a second light exposure portion generated in a photoresist in the step (4) are shown in parentheses.

FIG. 12A to FIG. 12C show a portion of process diagrams of the method for producing a wired circuit board shown in FIG. 11:

FIG. 12A illustrating a step (4), in which the photoresist is exposed to light,

FIG. 12B illustrating a step (5), in which the first light exposure portion and the second light exposure portion are removed, and FIG. 12C illustrating a step (6), in which the first wire and the second wire are provided.

FIG. 14A to FIG. 14C show a portion of process diagrams in Assumption 2:

FIG. 14A illustrating a step (4), in which the inclination face facing portion and the first light exposure portion are exposed to light so as not to expose the second light exposure portion other than the inclination face facing portion to light, FIG. 14B illustrating a step (5), in which the photoresist is developed, and FIG. 14C illustrating a step (6), in which electrolytic plating is performed.

FIG. 15 shows an enlarged plan view of the wired circuit board obtained by the Assumption 2.

In FIG. 17, a translucent portion in a photomask disposed in the step (4) is shown in parentheses. Furthermore, in FIG. 17, a first light exposure portion and a second light exposure portion generated in a photoresist in the step (4) are shown in parentheses.

FIG. 19A to FIG. 19C show a portion of process diagrams of the method for producing a wired circuit board shown in FIG. 18:

FIG. 19A illustrating a step (4), in which the photoresist is exposed to light,

FIG. 19B illustrating a step (5), in which a second light focused portion, the first light exposure portion, and the second light exposure portion are removed, and FIG. 19C illustrating a step (6), in which a second isolated conductive portion, the first wire, and the second wire are provided.

FIG. 20 shows an enlarged plan view of a modified example (embodiment in which the first wire and the second wire have a generally linear shape when viewed from the top) of the wired circuit board of the third embodiment shown in FIG. 17.

In FIG. 21, a translucent portion in a photomask disposed in the step (4) is shown in parentheses. Furthermore, in FIG. 21, a first light exposure portion and a second light exposure portion generated in a photoresist in the step (4) are shown in parentheses.

In FIG. 22, a translucent portion in a photomask disposed in the step (4) is shown in parentheses. Furthermore, in FIG. 22, a first light exposure portion and a second light exposure portion generated in a photoresist in the step (4) are shown in parentheses.

FIG. 23A illustrating a step (i), in which an insulating base layer is prepared, FIG. 23B illustrating a step (ii), in which a lower-side conductive pattern is provided, FIG. 23C illustrating a step (1), in which an intermediate insulating layer is provided, and FIG. 23D illustrating a step (2), in which a conductive layer is provided.

FIG. 24E illustrating a step (3), in which a photoresist is provided,

FIG. 24F illustrating a step (4), in which the photoresist is exposed to light, and FIG. 24G illustrating a step (5), in which the conductive layer is exposed from a first light exposure portion and a second light exposure portion.

FIG. 25H to FIG. 25J show, following FIG. 24G, a portion of process diagrams of the method for producing a wired circuit board in the sixth embodiment of the present invention:

FIG. 25H illustrating a step (6), in which the conductive layer exposed from the first light exposure portion and the second light exposure portion is removed, FIG. 25I illustrating a step (iii), in which the first light exposure portion and the second light exposure portion are removed, and FIG. 25J illustrating a step (v), in which an insulating cover layer is provided.

FIG. 27 shows an enlarged plan view of a translucent portion of a photomask in the step (4) in Comparative Example 1 or Comparative Example 2.

FIG. 28A to FIG. 28C show partial process diagrams of Comparative Example 1 in which an upper-side conductive pattern is provided using a positive type photoresist and electrolytic plating:

FIG. 28A illustrating a step (4), in which a first light exposure portion and a second light exposure portion are exposed to light, FIG. 28B illustrating a step (5), in which a light focused portion, the first light exposure portion, and the second light exposure portion are removed, and FIG. 28C illustrating a step (6), in which a short circuit portion, a first wire, and a second wire are provided.

FIG. 30A illustrating a step (4), in which a first light exposure portion and a second light exposure portion are exposed to light, FIG. 30B illustrating a step (5), in which a light focused portion, the first light exposure portion, and the second light exposure portion are left, and FIG. 30C illustrating a step (6), in which a short circuit portion, a first wire, and a second wire are provided.

DETAILED DESCRIPTION OF THE INVENTION

The wired circuit board obtained by the method for producing a wired circuit board of the present invention has a single layer or a plurality of layers of the conductive pattern, and its layer structure is not particularly limited. The wired circuit board includes a suspension board with circuit including a metal supporting board, and a flexible wired circuit board including no metal supporting board.

<First Embodiment>

In the following, a first embodiment of the method for producing a wired circuit board and the wired circuit board obtained by the method of the present invention are described with reference to FIG. 1 to FIG. 8.

Figure 1:
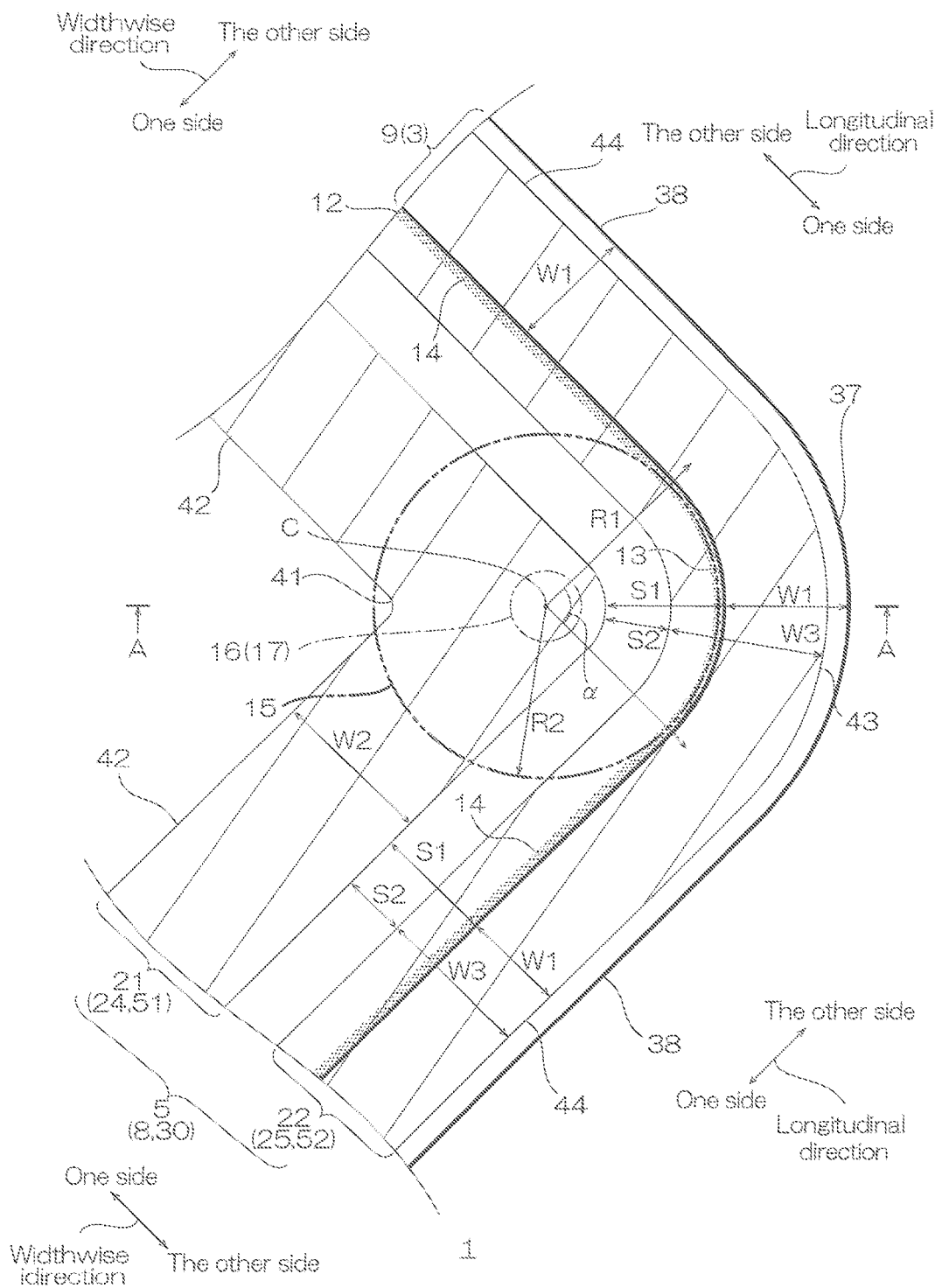
FIG. 1 shows an enlarged plan view of an arc portion of a lower wire in a wired circuit board obtained in a method for producing a wired circuit board in a first embodiment of the present invention.

In FIG. 1, direction in which a lower wire extends is defined as longitudinal direction (first direction), side toward lower side in the plane of the paper is defined as one side in the longitudinal direction (one side in the first direction), and side toward upper side in the plane of the paper is defined as the other side in the longitudinal direction (the other side in the first direction).

In FIG. 1, direction perpendicular to the longitudinal direction is defined as width direction of the lower wire (second direction perpendicular to the first direction), side toward left side in the plane of the paper is defined as one side in the width direction (one side in the second direction), and side toward right side in the plane of the paper is defined as the other side in the width direction (the other side in the second direction).

In FIG. 1, paper thickness direction in the plane of the paper is defined as up-down direction (third direction perpendicular to the first direction and the second direction, thickness direction), near side in the plane of the paper is defined as upper side (one side in the third direction, one side in the thickness direction), and further side in the plane of the paper is defined as lower side (the other side in the third direction, the other side in the thickness direction).

The directions are based on the directions shown in FIG. 1, and to be specific, in accordance with the direction arrows in the figures.

In FIG. 1 and FIG. 8, to clearly show the relative positions of a lower-side conductive pattern 3 and an upper-side conductive pattern 5 to be described later, an insulating base layer 2, an intermediate insulating layer 4, and an insulating cover layer 6 to be described later are omitted. However, only an inclination face 12 at one side in the width direction of the intermediate insulating layer 4 is shown in dotted hatching.

Furthermore, in FIG. 1 and FIG. 8, to clearly show the relative positions of a lower wire 9 and a second wire 22 to be described later, a visible outline of the lower wire 9 is shown in bold line.

1. Wired Circuit Board

Figure 2:
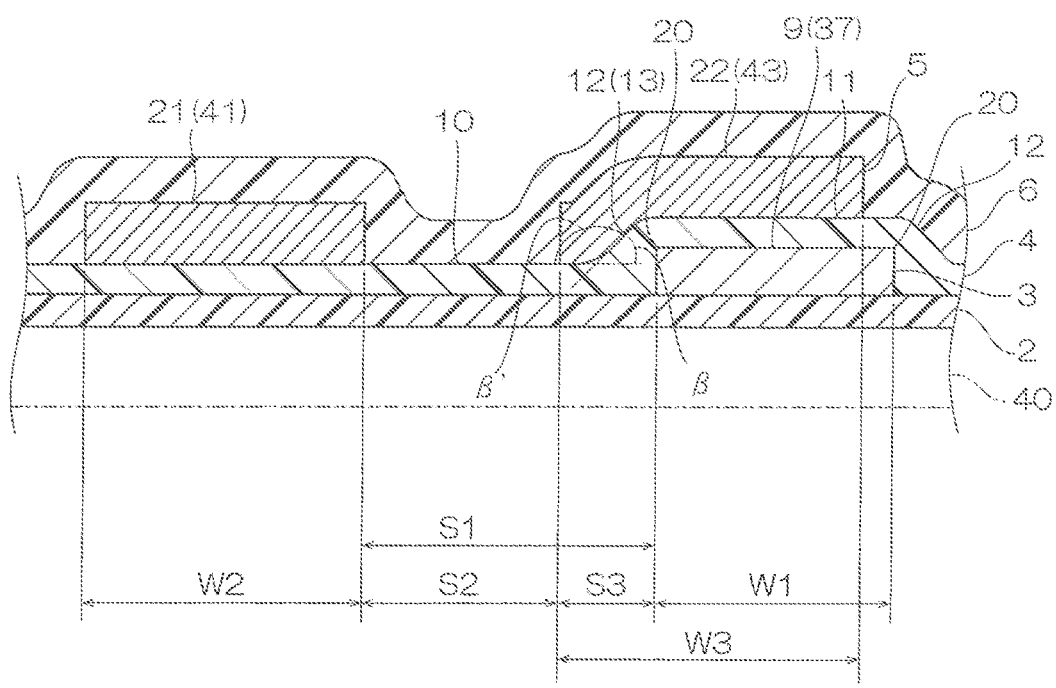
FIG. 2 shows a cross-sectional view crossing an arc portion along a width direction (line A-A) of the lower wire shown in FIG. 1.

A wired circuit board 1 has a generally flat plate (sheet) shape extending in the longitudinal direction. As shown in FIG. 2, the wired circuit board 1 includes the insulating base layer 2, the lower-side conductive pattern 3 provided on the insulating base layer 2, the intermediate insulating layer 4 as an example of the insulating layer disposed on the insulating base layer 2 and covering the lower-side conductive pattern 3, the upper-side conductive pattern 5 disposed on the intermediate insulating layer 4, and the insulating cover layer 6 disposed on the intermediate insulating layer 4 and covering the upper-side conductive pattern 5.

1-1. Insulating Base Layer

The insulating base layer 2 is the lowermost layer of the wired circuit board 1. The insulating base layer 2 has a generally flat plate (sheet) shape extending in the longitudinal direction. The insulating base layer 2 is made of an insulating material. Examples of the insulating material include synthetic resins such as polyimide resin, polyamide-imide resin, acrylic resin, polyether resin, nitrile resin, polyether sulfone resin, polyethylene terephthalate resin, polyethylenenaphthalate resin, and polyvinyl chloride resin, and preferably, polyimide resin is used. The insulating base layer 2 has a thickness of, for example, 1 µm or more, preferably 3 µm or more, and for example, 25 µm or less, preferably 15 µm or less.

1-2. Lower-side Conductive Pattern

Of the lower-side conductive pattern 3 and the upper-side conductive pattern 5, the lower-side conductive pattern 3 is a conductive pattern positioned at the lower side. The lower-side conductive pattern 3 is a conductive pattern positioned at the lower side of the intermediate insulating layer 4. Also, the lower-side conductive pattern 3 is positioned on the top face of the insulating base layer 2. The lower-side conductive pattern 3 integrally includes the lower wire 9, and a first terminal (not shown) continued from both ends in the longitudinal direction of the lower wire 9.

As shown in FIG. 1, the lower wire 9 has, at its portion, a generally L-shape when viewed from the top. To be specific, the lower wire 9 integrally includes an arc portion 37 having an arc shape when viewed from the top, and two linear portions 38 continued from both ends in the longitudinal direction of the arc portion 37.

The arc portion 37 has a generally arc shape when viewed from the top in which the central portion in the longitudinal direction thereof relative to both end portions in the longitudinal direction projects toward the other side in the width direction. The arc portion 37 is bent toward one side in the width direction as it approaches the other side in the longitudinal direction. The virtual circle along the arc portion 37 (to be specific, virtual circle of curvature along the center in width direction of the arc portion 37) has a radius (radius of curvature) R1 of, for example, 5 µm or more, preferably 15 µm or more, and for example, 300 µm or less, preferably 100 µm or less. The central angle α1 of the arc portion 37 is not particularly limited, and for example, more than 0 degree, preferably 30 degrees or more, more preferably 45 degrees or more, and for example, less than 90 degrees, preferably 75 degrees or less.

The two linear portions 38 are disposed so that their extension lines cross. Of the two linear portions 38, the linear portion 38 positioned at one side in the longitudinal direction extends from one end edge in the longitudinal direction of the arc portion 37 toward one side in the longitudinal direction when viewed from the top (same as "in the projected surface projected in the thickness direction", hereinafter the same). The linear portion 38 positioned at the other side in the longitudinal direction extends from the other end edge in the longitudinal direction of the arc portion 37 toward the other side in the longitudinal direction when viewed from the top.

As shown in FIG. 2, the lower wire 9 has a generally rectangular shape when viewed in cross section. The lower wire 9 has two ridgeline portions 20 at each of both end edges in the width direction of the upper end portion.

The lower-side conductive pattern 3 has a thickness of, for example, 1 µm or more, preferably 3 µm or more, and for example, 20 µm or less, preferably 12 µm or less. A width W1 of the lower wire 9 (width W1 of the linear portion 38 and width W1 of the arc portion 37) is, for example, 5 µm or more, preferably 8 µm or more, and for example, 200 µm or less, preferably 100 µm or less.

1-3. Intermediate Insulating Layer

Of the insulating base layer 2, the intermediate insulating layer 4, and the insulating cover layer 6, the intermediate insulating layer 4 is a layer positioned in the middle, and a layer sandwiched between the insulating base layer 2 and the insulating cover layer 6. The intermediate insulating layer 4 is disposed at the top face of the insulating base layer 2 so as to cover the side face and the top face of the lower-side conductive pattern 3. Although not shown, the intermediate insulating layer 4 allows the first terminal (not shown) of the lower-side conductive pattern 3 to expose.

The intermediate insulating layer 4 has a top face including a first flat face 10, a second flat face 11, and the inclination face 12.

The first flat face 10 is disposed to face above the insulating base layer 2 that is not overlapped with the lower-side conductive pattern 3 in spaced-apart relation. The first flat face 10 is a face parallel to a surface direction (direction along the top face of the insulating base layer 2, that is, direction along the longitudinal direction and the width direction).

The second flat face 11 corresponds to the top face of the lower wire 9. To be specific, the second flat face 11 is disposed to face above the top face of the lower wire 9 in spaced-apart relation. The second flat face 11 connects the upper end portion of the two inclination faces 12 to be described next. The second flat face 11 is parallel with the first flat face 10.

The inclination face 12 corresponds to the lower wire 9. The inclination face 12 continues from the first flat face 10 and the second flat face 11. The inclination face 12 is a face inclined relative to the surface direction. To be specific, the inclination face 12 is provided in correspondence with the two ridgeline portions 20 of the lower wire 9. The inclination face 12 is a face that inclines (elevates) inward in the width direction as it approaches the upper side from the first flat face 10 to then reach both end portions in the width direction of the second flat face 11.

The supplementary angle β to the angle β' formed with the inclination face 12 and the first flat face 10, that is, the gradient β of the inclination face 12 relative to the first flat face 10 is, for example, 5 degrees or more, preferably 20 degrees or more, and for example, less than 90 degrees, preferably 60 degrees or less.

As shown in the dotted hatching of FIG. 1, the inclination face 12 positioned at one side in the width direction continuously includes each of two insulating inclination face linear portions 14 corresponding to each of the two linear portions 38, and an insulating inclination face arc portion 13 corresponding to the arc portion 37.

Each of the two insulating inclination face linear portions 14 has the same linear shape as that of the ridgeline portion 20 (ref: FIG. 2) at one side in the width direction of each of the two linear portions 38 when viewed from the top.

The insulating inclination face arc portion 13 has an arc shape similar to the arc shape of the arc portion 37 when viewed from the top. A virtual circle 15 along the insulating inclination face arc portion 13 (phantom line of FIG. 1, to be specific, virtual circle 15 along the center in the width direction of the insulating inclination face arc portion 13) has a radius R2 of, for example, 5 μm or more, preferably 15 μm or more, and for example, 300 μm or less, preferably 100 μm or less.

1-4. Upper-side Conductive Pattern

As shown in FIG. 2, of the lower-side conductive pattern 3 and the upper-side conductive pattern 5, the upper-side conductive pattern 5 is a conductive pattern positioned at the upper side. The upper-side conductive pattern 5 is positioned on the top face of the intermediate insulating layer 4. The upper-side conductive pattern 5 has the first wire 21 and the second wire 22 disposed next to each other in spaced-apart relation in the width direction, and a second terminal (not shown) continued from both ends in the longitudinal direction of each of the first wire 21 and the second wire 22.

1-4.1. First Wire

As shown in FIG. 1, the first wire 21 is a wire positioned at one side in the width direction in the upper-side conductive pattern 5. The first wire 21 is positioned at one side in the width direction of the lower wire 9 in spaced-apart relation when viewed from the top. The first wire 21 has, at its portion, a generally L-shape when viewed from the top that is the same as the lower wire 9. To be specific, the lower wire 9 integrally includes a first wire bending portion 41, and two first wire linear portions 42 continued from both ends in the longitudinal direction of the first wire bending portion 41.

The first wire bending portion 41 is bent toward one side in the width direction as it approaches the other side in the longitudinal direction. The first wire bending portion 41 is disposed at one side in the width direction of the arc portion 37 of the lower wire 9 in spaced-apart relation when viewed from the top.

The first wire bending portion 41 is provided corresponding to the insulating inclination face arc portion 13. To be specific, the first wire bending portion 41 is disposed at one side in the width direction of the insulating inclination face arc portion 13 in spaced-apart relation when viewed from the top. The first wire bending portion 41 is overlapped with the virtual circle 15 along the insulating inclination face arc portion 13. To be more specific, the first wire bending portion 41 is included in the above-described virtual circle 15 when viewed from the top.

Furthermore, the first wire bending portion 41 includes a center C of the above-described virtual circle 15 when viewed from the top. To be specific, the central portion in the width direction of the first wire bending portion 41 is overlapped with the center C when viewed from the top.

The two first wire linear portions 42 are disposed so that their extension lines cross. Each of the two first wire linear portions 42 is positioned at one side in the width direction of each of the two linear portions 38 in the lower wire 9 in spaced-apart relation. Each of the two first wire linear portions 42 is parallel with each of the two linear portions 38 when viewed from the top. The first wire linear portion 42 positioned at one side in the longitudinal direction extends from one end portion in the longitudinal direction of the first wire bending portion 41 toward one side in the longitudinal direction when viewed from the top. The first wire linear portion 42 positioned at the other side in the longitudinal direction extends from the other end portion in the longitudinal direction of the first wire bending portion 41 toward the other side in the longitudinal direction when viewed from the top.

The other end portion in the longitudinal direction of the first wire linear portion 42 positioned at one side in the longitudinal direction and one end portion in the longitudinal direction of the first wire linear portion 42 positioned at the other side in the longitudinal direction are, along with the first wire bending portion 41, overlapped with the virtual circle 15 along the insulating inclination face arc portion 13. To be more specific, the other end portion in the longitudinal direction of the first wire linear portion 42 positioned at one side in the longitudinal direction and one end portion in the longitudinal direction of the first wire linear portion 42 positioned at the other side in the longitudinal direction are included in the above-described virtual circle 15.

A width W2 of the first wire 21 (width W2 of the first wire linear portion 42 and width W2 of the first wire bending portion 41) is, for example, 5 µm or more, preferably 8 µm or more, and for example, 200 µm or less, preferably 100 µm or less. An interval S1 between the first wire 21 and the lower wire 9 in the width direction (interval S1 between the first wire linear portion 42 and the linear portion 38, and interval S1 between the first wire bending portion 41 and the arc portion 37) is, for example, 20 µm or more, preferably 30 µm or more, and for example, 300 µm or less, preferably 150 µm or less.

1-4.2. Second Wire

The second wire 22 is a wire positioned at the other side in the width direction in the upper-side conductive pattern 5. The second wire 22 is positioned (disposed next to each other) at the other side in the width direction of the first wire 21 in spaced-apart relation when viewed from the top. The second wire 22 is independent from the first wire 21. That is, the second wire 22 is insulated from the first wire 21. The second wire 22 has, at its portion, a generally L-shape when viewed from the top.

The second wire 22 is overlapped with the lower wire 9 when viewed from the top. To be specific, the second wire 22 includes one end portion and the central portion in the width direction of the lower wire 9 when viewed from the top.

The second wire 22 is overlapped with the insulating inclination face arc portion 13 and the insulating inclination face linear portion 14 when viewed from the top. To be specific, the second wire 22 includes the insulating inclination face arc portion 13 and the insulating inclination face linear portion 14.

The second wire 22 integrally includes a second wire bending portion 43, and two second wire linear portions 44 continued from both ends in the longitudinal direction of the second wire bending portion 43.

As shown in FIG. 1 and FIG. 2, the second wire bending portion 43 corresponds to the first wire bending portion 41. The second wire bending portion 43 is positioned at the other side in the width direction of the first wire bending portion 41 in spaced-apart relation.

The second wire bending portion 43 is positioned between the two second wire linear portions 44 in the longitudinal direction. To be specific, the second wire bending portion 43 is continued from the rear end edge in the longitudinal direction of the second wire linear portion 44 positioned at one side in the longitudinal direction, and one end edge in the longitudinal direction of the second wire linear portion 44 positioned at the other side in the longitudinal direction, and connects them in the longitudinal direction.

The second wire bending portion 43 corresponds to the arc portion 37 of the lower wire 9. To be specific, the second wire bending portion 43 includes the arc portion 37 when viewed from the top.

Furthermore, the second wire bending portion 43 includes the entire insulating inclination face arc portion 13 when viewed from the top.

The shape of the second wire bending portion 43 when viewed from the top is similar to that of the arc portion 37 when viewed from the top. To be specific, the second wire bending portion 43 has a generally arc shape that is wider tan the are portion 37 when viewed from the top. The ratio (width W3/width W1) of a width W3 of the second wire bending portion 43 to the width W1 of the arc portion 37 is, for example, 1 or more, preferably 1.2 or more, more preferably 1.5 or more, and for example, 5 or less. To be specific, the width W3 of the second wire bending portion 43 is, for example, 5 µm or more, preferably 8 µm or more, and for example, 100 µm or less, preferably 50 µm or less.

One end portion in the width direction of the second wire bending portion 43 is overlapped with the virtual circle 15 (sectoral portion making a portion thereof).

Each of the two second wire linear portions 44 corresponds to each of the two first wire linear portions 42.

Each of the two second wire linear portions 44 corresponds to each of the two linear portions 38 of the lower wire 9. To be specific, each of the two second wire linear portions 44 includes one end portion and the central portion in the width direction of each of the two linear portions 38 when viewed from the top.

Each of the two second wire linear portions 44 includes each of the two insulating inclination face linear portions 14 when viewed from the top.

The other end portion in the longitudinal direction of the second wire linear portion 44 positioned at one side in the longitudinal direction, and one end portion in the longitudinal direction of the second wire linear portion 44 positioned at the other side in the longitudinal direction are overlapped with the virtual circle 15 when viewed from the top. To be specific, one end portion and the central portion in the width direction of the other end portion in the longitudinal direction of the second wire linear portion 44 positioned at one side in the longitudinal direction, and one end portion and the central portion in the width direction of one end portion in the longitudinal direction of the second wire linear portion 44 positioned at the other side in the longitudinal direction are included in the virtual circle 15 when viewed from the top.

An interval S2 between the second wire 22 and the first wire 21 (interval S2 between the second wire bending portion 43 and the first wire bending portion 41, and interval S2 between the second wire linear portion 44 and the first wire linear portion 42) is, for example, 5 µm or more, preferably 10 µm or more, and for example, 200 µm or less, preferably 100 µm or less.

An interval S3 between one end edge in the width direction of the second wire bending portion 43 and one end in the width direction of the arc portion 37 is narrower than the interval S1 between the first wire bending portion 41 and the arc portion 37. To be specific, the ratio (S3/S1) of the interval S3 to the interval S1 is, for example, less than 1, preferably 0.1 or less, more preferably 0.05 or less, and for example, 0 or more, preferably more than 0, more preferably 0.001 or more. To be more specific, the interval S3 between one end edge in the width direction of the second wire bending portion 43 and one end in the width direction of the arc portion 37 is, for example, 1 µm or more, preferably 15 µm or more, and for example, 100 µm or less, preferably 50 µm or less.

The upper-side conductive pattern 5 has a thickness of, for example, 1 µm or more, preferably 3 µm or more, and for example, 20 µm or less, preferably 12 µm or less.

1-5. Insulating Cover Layer

The insulating cover layer 6 is the uppermost layer of the wired circuit board 1. The insulating cover layer 6 is disposed on the top face of the intermediate insulating layer 4 so as to cover the side face and the top face of the upper-side conductive pattern 5. Although not shown, the insulating cover layer 6 allows the second terminal (not shown) of the upper-side conductive pattern 5 to expose. The insulating cover layer 6 is made of the insulating material illustrated in the insulating base layer 2. The insulating cover layer 6 has a thickness of, for example, 1 µm or more, preferably 3 µm or more, and for example, 40 µm or less, preferably 10 µm or less.

2. Method for Producing Wired Circuit Board

Figure 3A:
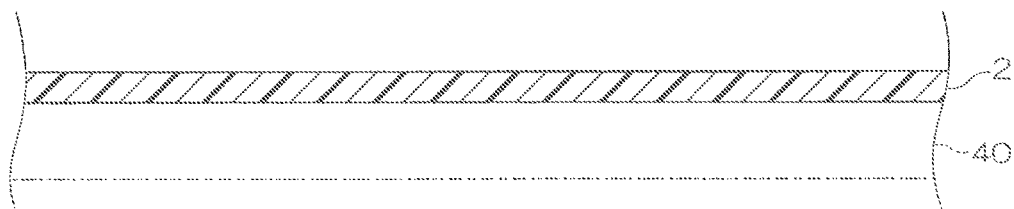
FIG. 3A to FIG. 3D show a portion of process diagrams of the method for producing a wired circuit board shown in FIG. 2.
Figure 3B:
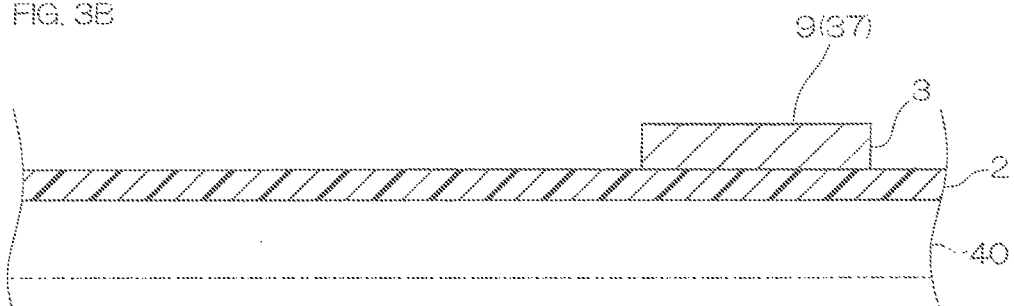
Figure 3C:
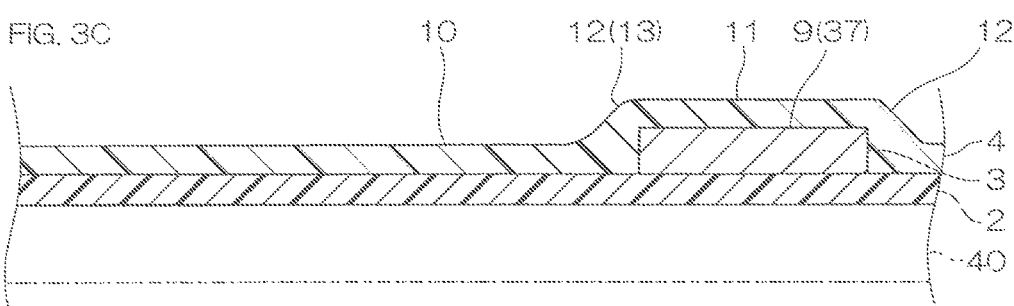
Figure 3D:
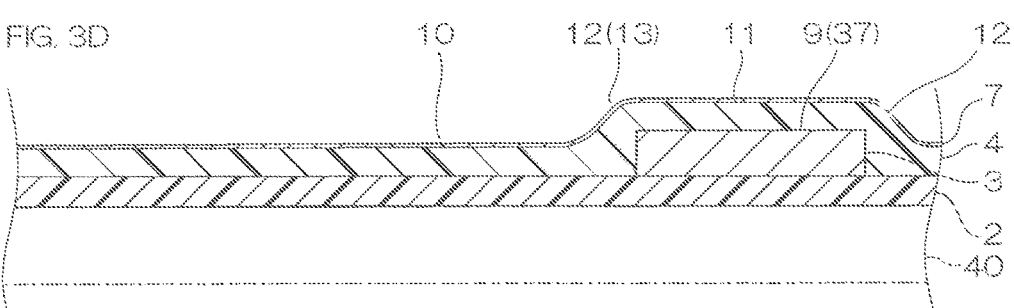

The production method of the wired circuit board 1 includes a step (i) (ref: FIG. 3A), in which the insulating base layer 2 is prepared, a step (ii) (ref: FIG. 3B), in which the lower-side conductive pattern 3 is provided on the top face of the insulating base layer 2, a step (1) (ref: FIG. 3C), in which the intermediate insulating layer 4 is provided on the top face of the insulating base layer 2 so as to cover the lower-side conductive pattern 3, and a step (2) (ref: FIG. 3D), in which a metal thin film 7 is provided on the top face of the intermediate insulating layer 4.

Furthermore, the production method of the wired circuit board 1 includes a step (3) (ref: FIG. 4E), in which a photoresist 23 is provided on the top face of the metal thin film 7, a step (4) (ref: FIG. 4F), in which the photoresist 23 is exposed to light through a photomask 28, and a step (5) (ref: FIG. 4G), in which in the photoresist 23, a first light exposure portion 24 corresponding to the first wire 21 and a second light exposure portion 25 corresponding to the second wire 22 are removed, and the metal thin film 7 corresponding to the first light exposure portion 24 and the second light exposure portion 25 is exposed.

Furthermore, the production method of the wired circuit board 1 includes a step (6) (ref: FIG. 5H), in which the upper-side conductive pattern 5 is provided on the top face of the metal thin film 7 exposed from the photoresist 23, a step (iii) (ref: FIG. 5I), in which the photoresist 23 is removed, a step (iv) (ref: FIG. 5J), in which the metal thin film 7 corresponding to the photoresist 23 is removed, and a step (v) (ref: FIG. 5K), in which the insulating cover layer 6 is provided on the top face of the intermediate insulating layer 4 so as to cover the upper-side conductive pattern 5.

In the production method of the wired circuit board 1, the step (i) to step (ii), the step (1) to step (6), and the step (iii) to step (v) are performed sequentially. In the following, the steps are described in detail.

2-1. Step (i)

As shown in FIG. 3A, in the step (i), the insulating base layer 2 is prepared.

2-2. Step (ii)

As shown in FIG. 3B, in the step (ii), the lower-side conductive pattern 3 is provided on the top face of the insulating base layer 2 by additive method, subtractive method, or the like.

2-3. Step (1)

As shown in FIG. 3C, in the step (1), the intermediate insulating layer 4 is provided on the top face of the insulating base layer 2 so as to cover the lower-side conductive pattern 3.

To provide the intermediate insulating layer 4 on the insulating base layer 2, for example, varnish of a photosensitive insulating material is applied to the top face of the insulating base layer 2, exposed to light and developed, and thereafter, as necessary, heated. Alternatively, the intermediate insulating layer 4 preformed into a pattern which allows the first terminal, which is not shown, to be exposed is allowed to adhere onto the insulating base layer 2 with an adhesive, which is not shown, interposed therebetween.

At this time, on the top face of the intermediate insulating layer 4 corresponding to the lower-side conductive pattern 3, the inclination face 12 and the second flat face 11 are formed.

Also, on the top face of the intermediate insulating layer 4 apart from the lower-side conductive pattern 3, the first flat face 10 is formed.

In this manner, the intermediate insulating layer 4 having the first flat face 10, the second flat face 11, and the inclination face 12 on the top face thereof is provided.

2-4. Step (2)

As shown in FIG. 3D, in the step (2), the metal thin film 7 is provided on the top face of the intermediate insulating layer 4.

The metal thin film 7 can serve as a seed film (feeding layer) in the additive method of the step (6) (described later, ref: FIG. 5H). The metal thin film 7 is a layer that can be integrated with the upper-side conductive pattern 5 when the upper-side conductive pattern 5 is obtained in the additive method (ref: FIG. 2).

The metal thin film 7 is provided on the entire surface of, for example, the top face (top face including the first flat face 10, the inclination face 12, and the second flat face 11) of the intermediate insulating layer 4.

The metal thin film 7 is made of a metal material. Examples of the metal material include copper, chromium, nickel, and an alloy thereof, and preferably, copper and chromium are used. The metal thin film 7 can be made of a single or a plurality of layers (not shown in FIG. 3D). Preferably, the metal thin film 7 is made of two layers of a first thin film (to be specific, chromium thin film), and a second thin film (copper thin film) provided thereon.

The metal thin film 7 is in conformity with the top face of the intermediate insulating layer 4.

Therefore, in the metal thin film 7, the top face of the portion corresponding to the first flat face 10 and the second flat face 11 of the intermediate insulating layer 4 is parallel with the first flat face 10 and the second flat face 11, that is, is along the surface direction.

Meanwhile, in the metal thin film 7, the top face of the portion corresponding to the inclination face 12 is parallel with the inclination face 12 of the intermediate insulating layer 4, that is, is inclined relative to the surface direction.

The metal thin film 7 has a thickness of, for example, 10 nm or more, preferably 30 nm or more, and for example, 300 nm or less, preferably 200 nm or less. When the metal thin film 7 is made of two layers of the first thin film and the second thin film, the first thin film has a thickness of, for example, 10 nm or more, and 100 nm or less, and the second thin film has a thickness of, for example, 50 nm or more, and 200 nm or less.

To provide the metal thin film 7 on the top face of the intermediate insulating layer 4, for example, a sputtering method and a plating method are used, and preferably, a sputtering method is used.

The surface reflectivity of the metal thin film 7 relative to light with a wavelength of 400 nm with the incident angle of 45 degrees is, for example, 60% or more, preferably 70% or more, more preferably 80% or more, and for example, 99% or less. The surface reflectivity is, for example, calculated in conformity with the method described in JIS Z8741 (in 1997). When the surface reflectivity of the metal thin film 7 is less than the above-described lower limit, the reflected light B' (ref: FIG. 4F) to be described later is not generated, and the problem of the present invention may not be solved.

2-5. Step (3)

As shown in FIG. 4E, in the step (3), the photoresist 23 is provided on the metal thin film 7.

The photoresist 23 is a positive type photoresist (positive photoresist). The positive type photoresist is a resist that allows a portion to which (a predetermined amount or more of) light is exposed to be removed in developing thereafter, and meanwhile, a portion which is shielded from light at the time of exposure (portion to which light is not applied, to be specific, portion failing to reach a predetermined amount of light) to remain in developing thereafter. The photoresist 23 includes, for example, dry film photoresist (DFR). The photoresist 23 can serve as, as shown in FIG. 5H, a plating resist in the plating in the step (6).

The photoresist 23 can allow the light in the step (4) (ref: FIG. 4F) (e.g., ultraviolet ray, etc.) to partially pass through, to be specific, the photoresist 23 has an ultraviolet ray transmissivity of, for example, 10% or more, preferably 20% or more, and for example, 60% or less, preferably 50% or less.

The above-described photoresist 23 is disposed on the entire top face of the metal thin film 7.

At that time, the dry film photoresist is pressed (pushed onto) using, for example, a flat plate. Therefore, the top face of the photoresist 23 is a flat face.

The photoresist 23 has a thickness of, for example, 10 μm or more, and for example, 50 μm or less, preferably 30 μm or less.

2-6. Step (4)

As shown in FIG. 4F, in the step (4), first, the photomask 28 is disposed, thereby exposing the photoresist 23 to light through the photomask 28.

The photomask 28 includes a light shield portion 29 and a translucent portion 30.

The light shield portion 29 shields light applied from the light source (not shown) positioned at the upper side of the photomask 28. In this manner, the photoresist 23 corresponding to the light shield portion 29 is shielded from light.

As shown in FIG. 4F and FIG. 4G, the light shield portion 29 has the same pattern as that of the photoresist 23 after the step (5) when viewed from the top. Furthermore, as shown in FIG. 4F and FIG. 5H, the light shield portion 29 has the opposite (inverted) pattern to that of the first wire 21 and the second wire 22 provided in the step (6) when viewed from the top.

The translucent portion 30 is constituted so that light applied from the light source passes through to allow the light to reach the photoresist 23.

As shown in FIG. 1, FIG. 4F, and FIG. 4G, the translucent portion 30 has the same pattern as that of an opening portion 8 of the photoresist 23 after the step (5). Furthermore, as shown in FIG. 1, FIG. 4F, and FIG. 5H, the translucent portion 30 has the same pattern as that of the first wire 21 and the second wire 22 provided in the step (6) when viewed from the top. The translucent portion 30 independently has a first translucent portion 51 in the same pattern as that of the first wire 21 and a second translucent portion 52 in the same pattern as that of the second wire 22 when viewed from the top.

In the step (4), the photomask 28 is disposed at the upper side of the photoresist 23. The photomask 28 is positioned so that in the photoresist 23, light passing through the first translucent portion 51 and light passing through the second translucent portion 52 produce the first light exposure portion 24 and the second light exposure portion 25, respectively.

Thereafter, in the step (4), as shown in the arrow of FIG. 4F, the photoresist 23 is exposed to light through the photomask 28.

To expose the photoresist 23 to light, light is applied to the photomask 28 from the light source disposed above the photomask 28. The wavelength of the light is, for example, 100 nm or more, preferably 350 nm or more, and for example, 800 nm or less, preferably 450 nm or less. The application (exposure) amount is, for example, 100 mJ/cm$^2$ or more and 800 mJ/cm$^2$ or less.

Light A passing through the first translucent portion 51 generates the first light exposure portion 24 in the photoresist 23. The first light exposure portion 24 has the same shape as that of the first wire 21 (ref: FIG. 1 and FIG. 5H) to be provided later when viewed from the top.

To be more specific, as shown in FIG. 1, the first light exposure portion 24 corresponding to the first wire bending portion 41, the other end portion in the longitudinal direction of the first wire linear portion 42 positioned at one side in the longitudinal direction, and one end portion in the longitudinal direction of the first wire linear portion 42 positioned at the other side in the longitudinal direction in the first wire 21 is overlapped with the virtual circle 15 when viewed from the top (example satisfying "a portion of the first light exposure portion is overlapped with the virtual circle when viewed from the top" in the Condition A).

Meanwhile, light B passing through the second translucent portion 52 generates the second light exposure portion 25 in the photoresist 23. The second light exposure portion 25 has the same shape as that of the second wire 22 (ref: FIG. 1 and FIG. 5H) to be provided later when viewed from the top.

To be more specific, the second light exposure portion 25 corresponding to one end portion and the central portion in the width direction of the second wire bending portion 43, one end portion and the central portion in the width direction of the other end portion in the longitudinal direction of the second wire linear portion 44 positioned at one side in the longitudinal direction, and one end portion and the central portion in the width direction of one end portion in the longitudinal direction of the second wire linear portion 44 positioned at the other side in the longitudinal direction in the second wire 22 is overlapped with the virtual circle 15 when viewed from the top (example satisfying "a portion of the second light exposure portion is overlapped with the virtual circle when viewed from the top" in the Condition A).

As shown in FIG. 4F, the second light exposure portion 25 includes an inclination face facing portion 48 as an example of the facing portion facing the insulating inclination face arc portion 13.

A portion of the light B passing through the second translucent portion 52 passes through the inclination face facing portion 48 of the photoresist 23 and generates reflected light B' in the metal thin film 7 corresponding to the insulating inclination face arc portion 13.

The reflected light B' generates a light focused portion 16 to be described later in the first light exposure portion 24. That is, the light focused portion 16 is generated by being exposed to light with sufficient amount of light by the light A passing through the first translucent portion 51 and the reflected light B' generated in the metal thin film 7 corresponding to the insulating inclination face arc portion 13.

2-7. Step (5)

As shown in FIG. 4G, in the step (5), the first light exposure portion 24 (including the light focused portion 16) in the photoresist 23 and the second light exposure portion 25 are removed.

To be specific, first, as necessary, the photoresist 23 after exposure to light is heated (heating after exposure).

Then, the photoresist 23 is developed with a developer. In this manner, the portion other than the first light exposure portion 24 and the second light exposure portion 25 in the photoresist 23 is left, and only the first light exposure portion 24 and the second light exposure portion 25 are removed. That is, in the photoresist 23, the opening portions 8 corresponding to the first light exposure portion 24 and the second light exposure portion 25 are formed. The opening portions 8 penetrate the photoresist 23 in the thickness direction.

In this manner, the metal thin film 7 corresponding to the first light exposure portion 24 and the second light exposure portion 25 is exposed from the opening portion 8.

Thereafter, as necessary, the photoresist 23 is cured by heating.

2-8. Step (6)

As shown in FIG. 5H, in the step (6), first, the upper-side conductive pattern 5 is provided on the top face of the metal thin film 7 exposed from the opening portion 8 of the photoresist 23.

To provide the upper-side conductive pattern 5 on the top face of the metal thin film 7, electrolytic plating in which electricity is supplied from the metal thin film 7 is used.

At this time, the photoresist 23 is used as a plating resist. The metal thin film 7 is used as a feeding layer.

In this manner, the upper-side conductive pattern 5 is formed as a pattern having the first wire 21 and the second wire 22 that are independently next to each other.

2-9. Step (iii)

As shown in FIG. 5I, in the step (iii), the photoresist 23 is removed.

To be specific, the photoresist 23 is removed, for example, by wet etching.

2-10. Step (iv)

As shown in FIG. 5J, in the step (iv), the metal thin film 7 corresponding to the photoresist 23 (ref: FIG. 5H) is removed.

To be specific, the metal thin film 7 positioned below the photoresist 23 is removed, for example, by peeling.

2-11. Step (v)

As shown in FIG. 5K, in the step (v), the insulating cover layer 6 is provided in a pattern such that the first wire 21 and the second wire 22 of the upper-side conductive pattern 5 are covered and the second terminal (not shown) is exposed. The insulating cover layer 6 is provided by the same method as that of the intermediate insulating layer 4.

The wired circuit board 1 including the insulating base layer 2, the lower-side conductive pattern 3, the intermediate insulating layer 4, the metal thin film 7, the upper-side conductive pattern 5, and the insulating cover layer 6 is produced in this manner In the wired circuit board 1, the metal thin film 7 can be integrated with the upper-side conductive pattern 5, to be specific, the metal thin film 7 can be incorporated as a portion of the upper-side conductive pattern 5. At that time, as shown in FIG. 2, there may be a case where the metal thin film 7 cannot be distinguished with the upper-side conductive pattern 5 clearly.

Use of such a wired circuit board 1 is not particularly limited, and for example, it is used as various wired circuit boards: a suspension board with circuit included in a hard disk drive and including a metal supporting board 40 (metal supporting board 40 disposed on the lower face of the insulating base layer 2, ref: phantom line in FIG. 2), and a flexible wired circuit board not including the metal supporting board and having flexibility. In particular, the wired circuit board 1 is suitably used in a suspension board with circuit that requires a high density wire (conductive pattern), and in a suspension board with circuit having the arc portion 37, the first wire bending portion 41, and the second wire bending portion 43 in the head mounting region.

3. Assumption 1 Corresponding to First Embodiment

Figure 6:
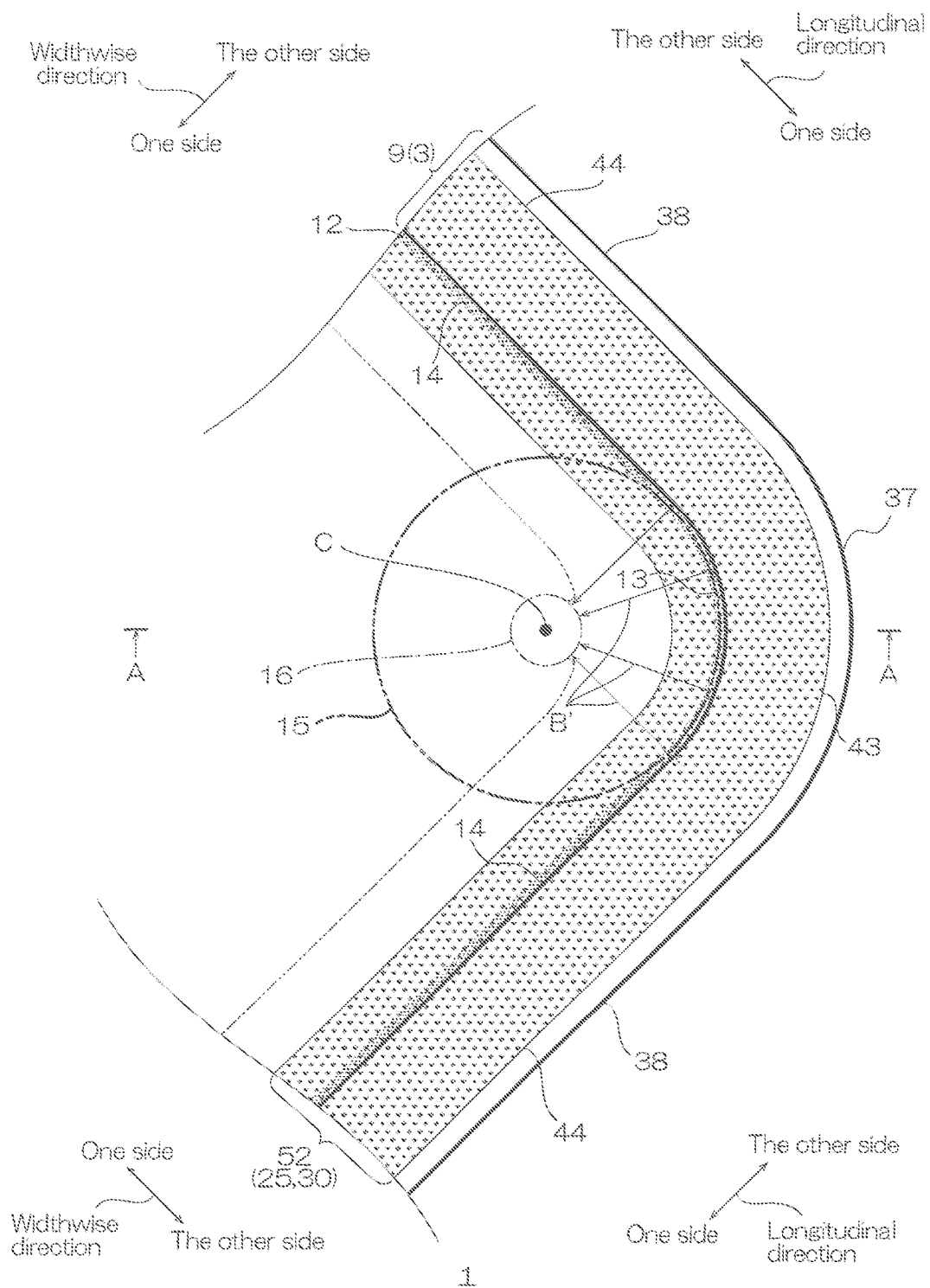
FIG. 6 shows Assumption 1 corresponding to the first embodiment, illustrating an enlarged plan view of a second translucent portion of the photomask in the step (4).

As the Assumption 1 corresponding to the first embodiment, the method for producing the wired circuit board 1 including the step (4) in which the first light exposure portion 24 in the first embodiment is not exposed to light is considered with reference to FIG. 6 to FIG. 8.

3-1. Step (4) in Assumption 1

As shown in FIG. 6 and FIG. 7A, in the photomask 28 disposed in the step (4), the translucent portion 30 does not have the first translucent portion 51 (ref: FIG. 1 and FIG. 4F), and has the second translucent portion 52. Preferably, the translucent portion 30 consists of only the second translucent portion 52. That is, in the Assumption 1, the portion that is the first translucent portion 51 in the first embodiment (pattern in which the first wire 21 is planned to be formed) is included in the light shield portion 29.

As shown in the arrow of FIG. 7A, in the step (4) of the Assumption 1, when the photoresist 23 is exposed to light through the above-described photomask 28, the light B passing through the second translucent portion 52 generates the second light exposure portion 25 in the photoresist 23 in the same manner as that of the first embodiment.

Furthermore, the light B passing through the inclination face facing portion 48 generates the reflected light B' in the metal thin film 7 corresponding to the insulating inclination face arc portion 13. The reflected light B' passes through the photoresist 23 toward obliquely and upwardly one side in the width direction when viewed in cross section, and reaches the light focused portion 16 in the photoresist 23.

Furthermore, as shown in the arrow of FIG. 6, the reflected light B' generated in the metal thin film 7 (ref: FIG. 7A) corresponding to the insulating inclination face arc portion 13 is focused toward the center C of the virtual circle 15 along the insulating inclination face arc portion 13 when viewed from the top. That is, when viewed from the top, the metal thin film 7 corresponding to the insulating inclination face arc portion 13 works as a concave lens, and the reflected light B' is focused on the point of the center C. Therefore, the amount of light at the light focused portion 16 including the center C and its periphery is relatively high. To be specific, the amount of light at the light focused portion 16 is the marginal amount of light that allows the light focused portion 16 to be removed in the step (5), or even more. The marginal amount of light is the boundary value in which in the light focused portion 16, when the amount of light not less than its boundary is applied, the light focused portion 16 is removed (ref: FIG. 7B), and when the amount of light below its boundary is applied, the light focused portion 16 is left.

The light focused portion 16 has a generally circular shape when viewed from the top with the center C of the virtual circle 15 along the insulating inclination face arc portion 13 as the center when viewed from the top. The diameter of the circle of the light focused portion 16 is appropriately set in accordance with the amount of light applied to the photoresist 23, the gradient β of the inclination face 12, the radius of curvature of the insulating inclination face arc portion 13, or the like, and for example, 2 μm or more, preferably 5 μm or more, and for example, 50 μm or less, preferably 20 μm or less.

As shown in FIG. 6, the light focused portion 16 is disposed in spaced-apart relation to the second light exposure portion 25 that is overlapped with the virtual circle 15 when viewed from the top. To be specific, the light focused portion 16 is disposed in spaced-apart relation to the light exposure portion corresponding to the second wire bending portion 43 (ref: FIG. 1) in the second light exposure portion 25 when viewed from the top.

Meanwhile, the light shield portion 29 corresponding to the light focused portion 16 (light shield portion 29 disposed at the upper side of the light focused portion 16) is shielded from the light A (in the first embodiment, the light A passing through the first translucent portion 51). Thus, the light focused portion 16 is not directly exposed to light from above.

That is, the light focused portion 16 is generated caused by only light focus of the reflected light B' generated in the metal thin film 7 (ref: FIG. 7A) corresponding to the insulating inclination face arc portion 13.

3-2. Step (5) in Assumption 1

As shown in FIG. 7B, in the step (5), the photoresist 23 after exposure to light is developed.

Then, the second light exposure portion 25 and the light focused portion 16 (ref: FIG. 7A) are removed. In the photoresist 23, the opening portions 8 corresponding to the second light exposure portion 25, and a light focused opening portion 47 corresponding to the light focused portion 16 are formed.

3-3. Step (6) in Assumption 1

As shown in FIG. 7C and FIG. 8, for example, electrolytic plating in which electricity is supplied from the metal thin film 7 is performed. In this manner, the second wire 22 is formed on the metal thin film 7 exposed from the opening portion 8. At the same time with this, the isolated conductive portion 17 is formed on the metal thin film 7 exposed from the light focused opening portion 47.

The isolated conductive portion 17 has the same shape as that of the light focused portion 16 (ref: FIG. 1) when viewed from the top.

The isolated conductive portion 17 is disposed in spaced-apart relation to the second wire 22 (including the second wire bending portion 43) in the width direction. The isolated conductive portion 17 is insulated from the second wire 22.

In the Assumption 1, as shown in FIG. 8, the isolated conductive portion 17 is formed by the production method including the step (4) (ref FIG. 7A) in which the first light exposure portion 24 is not exposed to light.

Meanwhile, in the first embodiment, as shown in FIG. 1, by the production method including the step (5) (ref: FIG. 4F) in which the first light exposure portion 24 is exposed to light, the first wire 21 (first wire bending portion 41) having a shape including the isolated conductive portion 17 when viewed from the top is formed when viewed from the top. The first wire 21 is insulated from the second wire 22.

4.

In the first embodiment, in the step (4), the Condition A is satisfied. To be specific, the first wire bending portion 41, the other end portion in the longitudinal direction of the linear portion 38 positioned at one side in the longitudinal direction, and one end portion in the longitudinal direction of the linear portion 38 positioned at the other side in the longitudinal direction in the first wire 21, and the second wire bending portion 43, one end portion in the longitudinal direction of the second wire linear portion 44 at one side in the longitudinal direction, and the other end portion in the longitudinal direction of the second wire linear portion 44 at the other side in the longitudinal direction in the second wire 22 are overlapped with the virtual circle 15 along the insulating inclination face arc portion 13 when viewed from the top. Thus, the first wire 21 and the second wire 22 can be disposed with high density.

Figure 29:
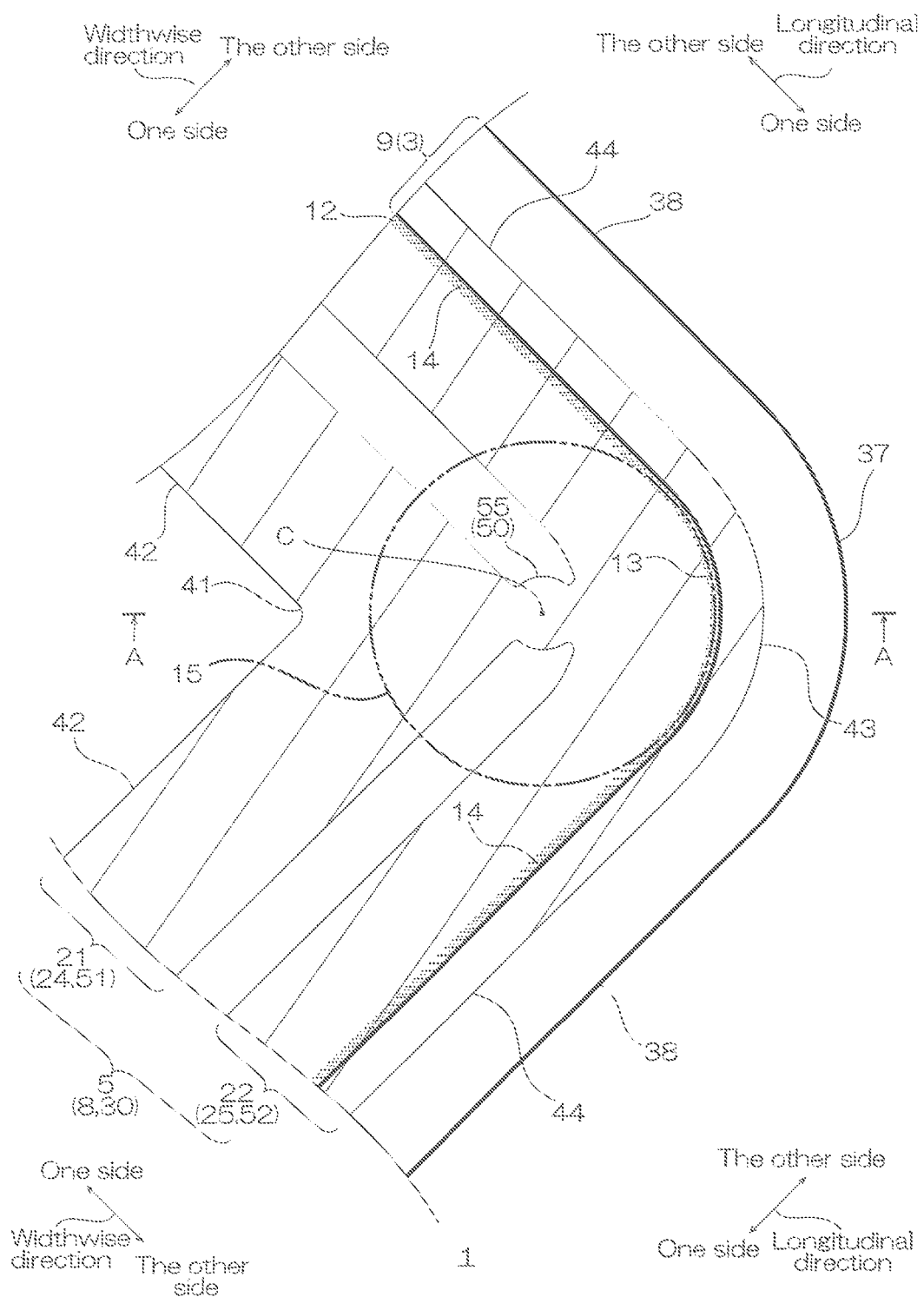
FIG. 29 shows an enlarged plan view of the wired circuit board obtained in Comparative Example 1 or Comparative Example 2.

Meanwhile, in the condition B, when the Assumption 1 in which the first light exposure portion 24 is not exposed to light and the second light exposure portion 25 is exposed to light is satisfied, as shown in the phantom line of FIG. 6, the light focused portion 16 caused by the reflected light B' generated by the inclination face 12 is generated. When the first wire 21 and the second wire 22 are disposed with high density, the light focused portion 16 is easily connected to the second light exposure portion 25 shown in the phantom line. Then, as shown in FIG. 28C and FIG. 29, there is a disadvantage in that in the step (6), the short circuit portion 55 corresponding to the light focused portion 16 is connected to the first wire 21 and the second wire 22 to cause short circuit of the first wire 21 and the second wire 22.

However, the present invention satisfies the Assumption 1 of the Condition C, so that as shown in FIG. 6 and FIG. 7A, even when the Assumption 1 of the Condition B is satisfied, the light focused portion 16 is disposed in spaced-apart relation to the second light exposure portion 25 that is overlapped with the virtual circle 15 when viewed from the top. Thus, in the step (6), as shown in FIG. 7C and FIG. 8, the isolated conductive portion 17 corresponding to the light focused portion 16 is disposed in spaced-apart relation to the second wire 22 corresponding to the second light exposure portion 25. Thus, short circuit of the second wire 22 caused by the isolated conductive portion 17 can be prevented.

As a result, the wired circuit board 1 can be obtained in which short circuit of the first wire 21 and the second wire 22 can be prevented, while they are provided with high density Furthermore, in the first embodiment, as shown in FIG. 1, the first light exposure portion 24 includes the entire light focused portion 16 (ref: phantom line of FIG. 1) provided in the Assumption 1. Thus, the first wire 21 includes the entire isolated conductive portion 17. Thus, short circuit of the first wire 21 and the second wire 22 caused by the isolated conductive portion 17 can be more surely prevented.

<Modified Example of First Embodiment>

In the modified example, for the members and steps that are the same as the first embodiment, the same reference numerals are given and detailed descriptions thereof are omitted.

In the first embodiment, as shown in FIG. 1, each of the first wire 21 and the second wire 22 has, at its portion, a generally L-shape (bent shape) when viewed from the top. However, the shape of the first wire 21 and the second wire 22 when viewed from the top is not limited to the description above.

As shown in FIG. 9, for example, in the modified example, each of the first wire 21 and the second wire 22 has, at its portion, a generally linear shape when viewed from the top.

The central portion in the direction in which the first wire 21 extends is overlapped with the virtual circle 15 along the insulating inclination face arc portion 13. The first light exposure portion 24 generated in the step (4) and corresponding to the first wire 21 has a pattern including the light focused portion 16 generated in the step (4) of the Assumption 1 when viewed from the top.

The second wire 22 is overlapped with the virtual circle 15 along the insulating inclination face arc portion 13. Also, one end portion in the width direction of the central portion in the direction in which the second wire 22 extends is overlapped with the insulating inclination face arc portion 13 when viewed from the top.

The modified example can also achieve the same operations and effects as those of the first embodiment.

<Second Embodiment>

In the second embodiment, for the members and steps that are the same as the first embodiment, the same reference numerals are given and detailed descriptions thereof are omitted.

In the first embodiment, as shown in FIG. 6 and FIG. 7B, the light focused portion 16 generated in the step (4) of the Assumption 1 is disposed in spaced-apart relation to the second light exposure portion 25.

Figure 13:
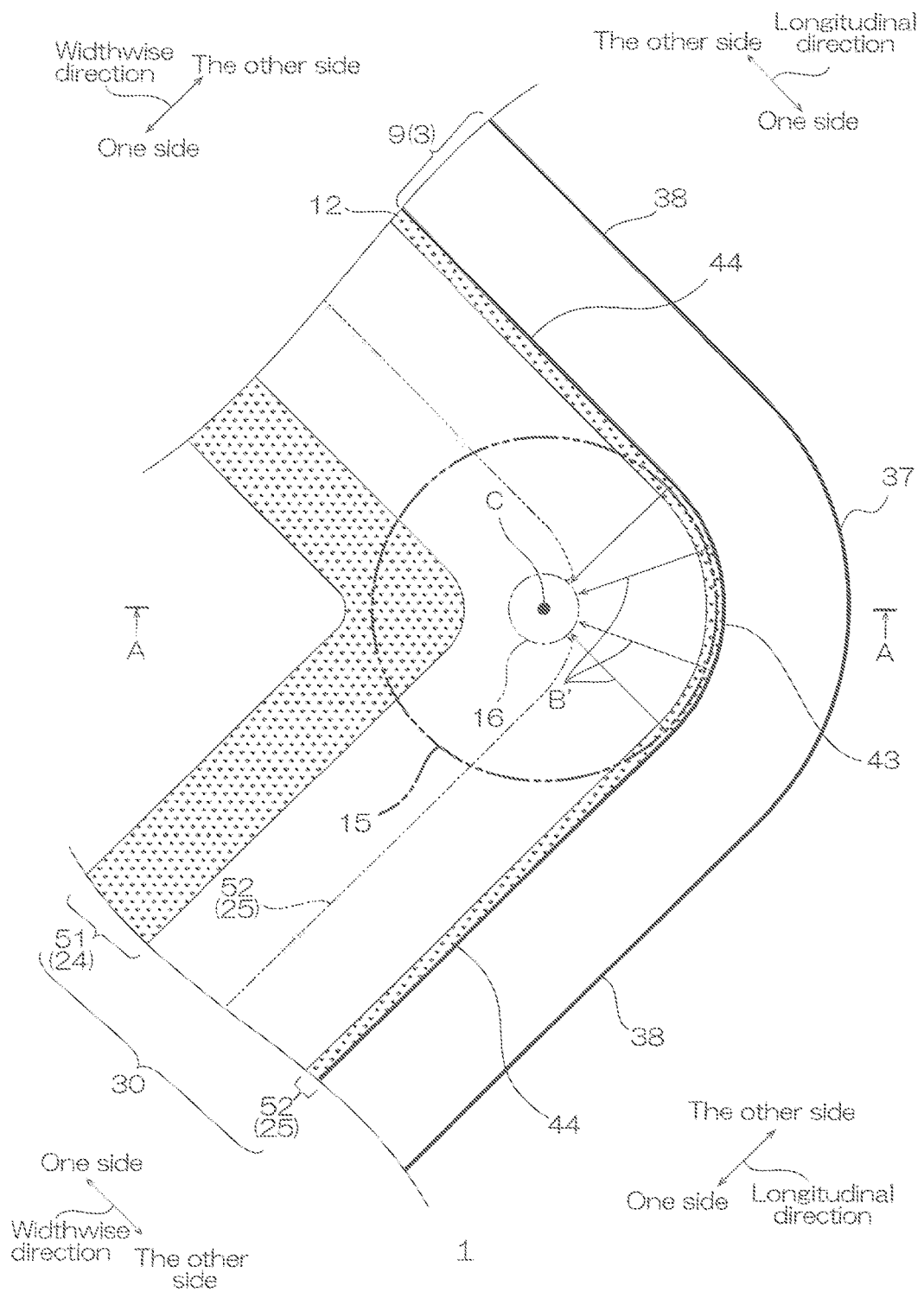
FIG. 13 shows Assumption 2 corresponding to the second embodiment, illustrating an enlarged plan view of a first translucent portion of the photomask in the step (4) and a second translucent portion corresponding to an inclination face facing portion.

However, in the second embodiment, as shown in FIG. 13 and FIG. 14A, the light focused portion 16 generated in the step (4) of the Assumption 2 is disposed in spaced-apart relation to the first light exposure portion 24.

1. Wired Circuit Board

Figure 11:
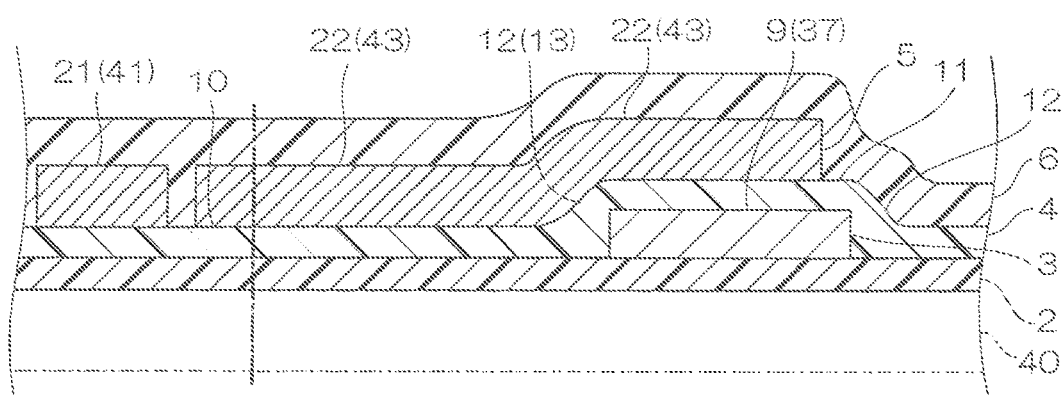
FIG. 11 shows a cross-sectional view crossing the arc portion along the width direction (line A-A) of the lower wire shown in FIG. 10.

As shown in FIG. 10 and FIG. 11, in the wired circuit board 1, the second wire bending portion 43 of the second wire 22 includes the center C of the virtual circle 15 along the insulating inclination face arc portion 13.

The other end edge in the width direction of the second wire 22 is not overlapped with one end edge and the other end edge in the width direction of the lower wire 9 when viewed from the top.

2. Method for Producing Wired Circuit Board

The production method of the wired circuit board of the second embodiment is in conformity with the production method of the wired circuit board of the first embodiment.

In the production method of the second embodiment, the step (4) shown in FIG. 12A corresponds to the step (4) shown in FIG. 4F of the first embodiment.

In the production method of the second embodiment, the step (5) shown in FIG. 12B corresponds to the step (5) shown in FIG. 4G of the first embodiment.

In the production method of the second embodiment, the step (6) shown in FIG. 12C corresponds to the step (6) shown in FIG. 5H of the first embodiment.

3. Assumption 2 Corresponding to Second Embodiment

As the Assumption 2 corresponding to the second embodiment, the method for producing the wired circuit board 1 including the step (4) in which the inclination face facing portion 48 in the second light exposure portion 25 in the second embodiment is not exposed to light is considered with reference to FIG. 13 to FIG. 15.

3-1. Step (4) in Assumption 2

As shown in FIG. 13 and FIG. 14A, in the photomask 28 disposed in the step (4), the second translucent portion 52 has a pattern capable of generating the inclination face facing portion 48 in the photoresist 23. That is, the second translucent portion 52 has the same shape as that of the insulating inclination face arc portion 13 when viewed from the top. As shown in FIG. 12A, in the second embodiment, a portion in which the light B passes through in the second translucent portion 52 is the light shield portion 29 in the Assumption 2.

As shown in the arrow of FIG. 14A, in the Assumption 2, as shown in FIG. 14A, when the photoresist 23 is exposed to light through the photomask 28, the light B passing through the second translucent portion 52 generates only the inclination face facing portion 48 in the photoresist 23.

In the metal thin film 7 corresponding to the inclination face facing portion 48, the reflected light B' is generated. Thereafter, the reflected light B' reaches the light focused portion 16. Furthermore, as shown in the arrow of FIG. 13, the reflected light B' is focused toward the above-described center C.

In the light shield portion 29 between the first translucent portion 51, and the second translucent portion 52 corresponding to the inclination face facing portion 48, the photoresist 23 corresponding to the light focused portion 16 (portion that is the first light exposure portion 24 (ref: FIG. 12A) in the first embodiment) is shielded from light. Thus, the light focused portion 16 is not directly exposed to light from above.

That is, the light focused portion 16 is generated caused by only light focus of the reflected light B' generated in the metal thin film 7 (ref: FIG. 7A) corresponding to the insulating inclination face arc portion 13.

Meanwhile, the light A passing through the first translucent portion 51 generates the first light exposure portion 24.

As shown in FIG. 13 and FIG. 14A, the light focused portion 16 is disposed in spaced-apart relation to the first light exposure portion 24 that is overlapped with the virtual circle 15. To be specific, the light focused portion 16 is disposed in spaced-apart relation to the light exposure portion corresponding to the first wire bending portion 41 (ref: FIG. 10) in the first light exposure portion 24 when viewed from the top.

3-2. Step (5) in Assumption 2

As shown in FIG. 14B, in the step (5), the photoresist 23 after exposure to light is developed.

Then, the first light exposure portion 24, the inclination face facing portion 48, and the light focused portion 16 (ref: FIG. 14A) are removed. In the photoresist 23, the opening portions 8 corresponding to the first light exposure portion 24 and the inclination face facing portion 48, and the light focused opening portion 47 corresponding to the light focused portion 16 are formed.

3-3. Step (6) in Assumption 2

As shown in FIG. 14C and FIG. 15, for example, electrolytic plating in which electricity is supplied from the metal thin film 7 is performed. In this manner, the first wire 21 is formed.

At the same time with this, the isolated conductive portion 17 is formed. Corresponding to the inclination face facing portion 48, a portion of the second wire 22 having the same shape as that of the inclination face facing portion 48 when viewed from the top is also formed.

The isolated conductive portion 17 has the same shape as that of the light focused portion 16 (ref: FIG. 14A) when viewed from the top. The isolated conductive portion 17 is disposed in spaced-apart relation to the first wire 21 in the width direction.

The isolated conductive portion 17 is disposed in spaced-apart relation to the first wire 21 (including the first wire bending portion 41) in the width direction. The isolated conductive portion 17 is insulated from the first wire 21.

In the Assumption 2, the isolated conductive portion 17 is formed by the production method including the step (4) (ref: FIG. 14A) in which the inclination face facing portion 48 in the photoresist 23 is not exposed to light.

Meanwhile, in the second embodiment, as shown in FIG. 10, by the production method including the step (5) (ret FIG. 4F) in which the inclination face facing portion 48 is exposed to light, the first wire 21 (first wire bending portion 41) having a shape including the isolated conductive portion 17 when viewed from the top is formed when viewed from the top. The second wire 22 is insulated from the first wire 21.

4.

With the second embodiment, in the step (4), the Condition A is satisfied, so that at least a portion of the first wire 21 provided in the step (6) is overlapped with the virtual circle 15 of the insulating inclination face arc portion 13 when viewed from the top. Thus, the first wire 21 and the second wire 22 can be disposed with high density.

Meanwhile, in the Condition B, when the Assumption 2 in which the first light exposure portion 24 is exposed to light, a portion other than the inclination face facing portion 48 in the second light exposure portion 25 is not exposed to light, and the inclination face facing portion 48 in the second light exposure portion 25 is exposed to light is satisfied, as shown in the phantom line of FIG. 13, the light focused portion 16 is generated. When the first wire 21 and the second wire 22 are disposed with high density, the light focused portion 16 is easily connected to the first light exposure portion 24 shown in the phantom line. Then, as shown in FIG. 28C and FIG. 29, there is a disadvantage in that in the step (6), the short circuit portion 55 corresponding to the light focused portion 16 is connected to the first wire 21 and the second wire 22 to cause short circuit of the first wire 21 and the second wire 22.

However, in the second embodiment, the Assumption 2 of the Condition C is satisfied, so that as shown in FIG. 13 and FIG. 14A, even when the Assumption 2 of the Condition B is satisfied, the light focused portion 16 is disposed in spaced-apart relation to the first light exposure portion 24 that is overlapped with the virtual circle 15 when viewed from the top. Thus, in the step (6), as shown in FIG. 14C and FIG. 15, the isolated conductive portion 17 corresponding to the light focused portion 16 is disposed in spaced-apart relation to the first wire 21 corresponding to the first light exposure portion 24. Thus, short circuit of the first wire 21 caused by the isolated conductive portion 17 can be prevented.

As a result, the wired circuit board 1 can be obtained in which short circuit of the first wire 21 and the second wire 22 can be prevented, while they are provided with high density.

According to the second embodiment, as shown in FIG. 10, the second light exposure portion 25 includes the entire light focused portion 16 (ref: phantom line of FIG. 10) provided in the Assumption 2. Thus, in the step (6), formation of a projection portion 49 caused by the light focused portion 16 can be prevented. As a result, short circuit of the first wire 21 and the second wire 22 caused by the isolated conductive portion 17 can be more surely prevented.

Furthermore, in the second embodiment, as shown in FIG. 10, the second light exposure portion 25 includes the entire light focused portion 16 (ref: phantom line of FIG. 1) provided in the Assumption 1. Thus, the second wire 22 includes the entire isolated conductive portion 17. Thus, short circuit of the first wire 21 and the second wire 22 caused by the isolated conductive portion 17 can be more surely prevented.

<Modified Example of Second Embodiment>

In the modified example, for the members and steps that are the same as the second embodiment, the same reference numerals are given and detailed descriptions thereof are omitted.

In the second embodiment, as shown in FIG. 10, each of the first wire 21 and the second wire 22 has, at its portion, a generally L-shape (bent shape) when viewed from the top. However, the shape of the first wire 21 and the second wire 22 when viewed from the top is not limited to the description above.

Figure 16:
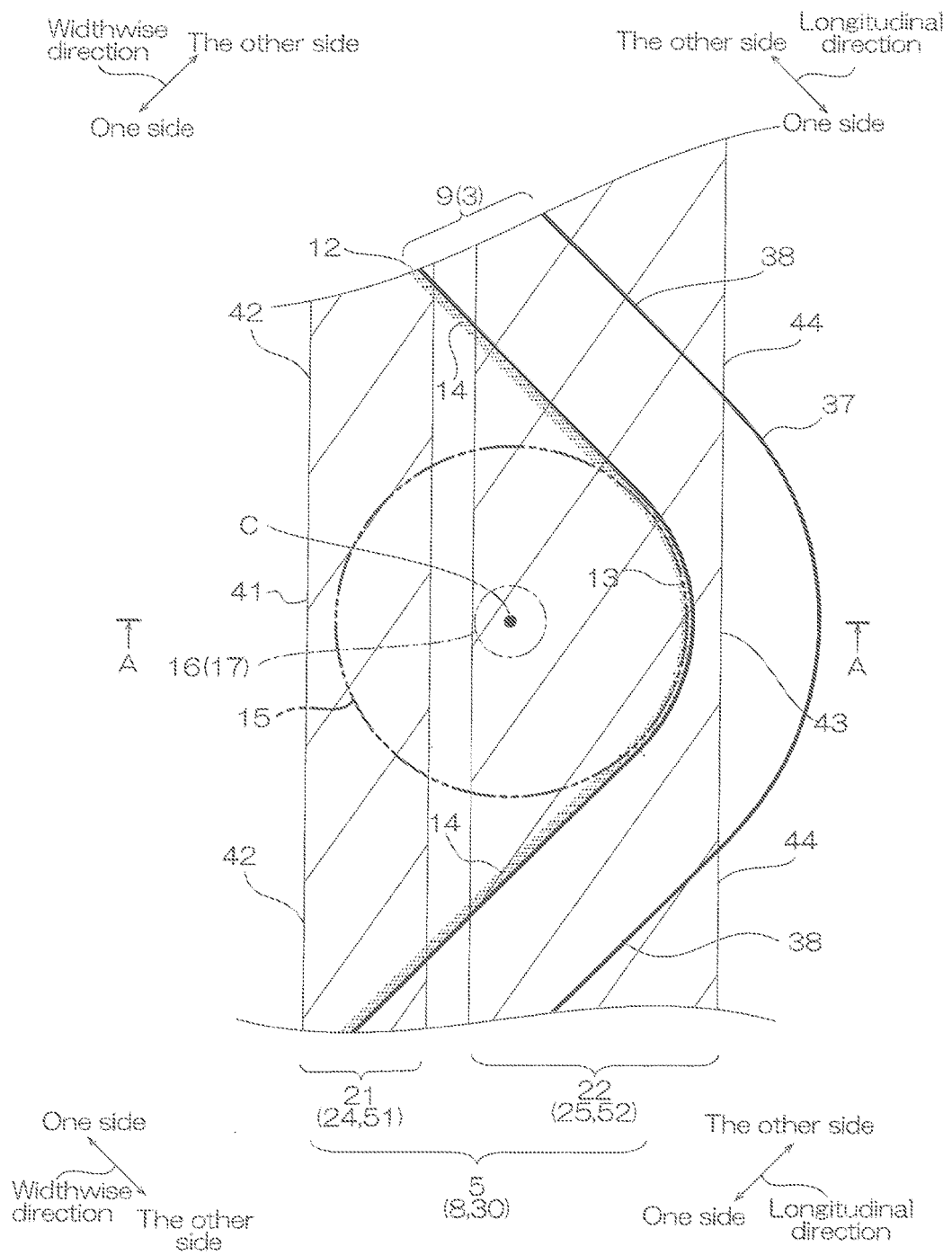
FIG. 16 shows an enlarged plan view of a modified example (embodiment in which the first wire and the second wire have a generally linear shape when viewed from the top) of the wired circuit board of the second embodiment shown in FIG. 10.

As shown in FIG. 16, for example, in the modified example, each of the first wire 21 and the second wire 22 has, at its portion, a generally linear shape when viewed from the top.

The second light exposure portion 25 generated in the step (4) and corresponding to the second wire 22 has a pattern including the light focused portion 16 generated in the step (4) of the Assumption 2 when viewed from the top.

The modified example can also achieve the same operations and effects as those of the second embodiment.

<Third Embodiment>

In the third embodiment, for the members and steps that are the same as the first and second embodiments, the same reference numerals are given and detailed descriptions thereof are omitted.

In the production method of the first embodiment, as shown in FIG. 7A, in the Assumption 1, when the first light exposure portion 24 is not exposed to light and the second light exposure portion 25 is exposed to light in the step (4), as shown in FIG. 6 and FIG. 7B, thereafter, the light focused portion 16 is generated in the step (5).

In the production method of the second embodiment, as shown in FIG. 14A, in the Assumption 2, when the photoresist 23 around the inclination face facing portion 48 is not exposed to light, and only the first light exposure portion 24 and the inclination face facing portion 48 are exposed to light in the step (4), as shown in FIG. 13 and FIG. 14B, thereafter, the light focused portion 16 is generated in the step (5).

Figure 17:
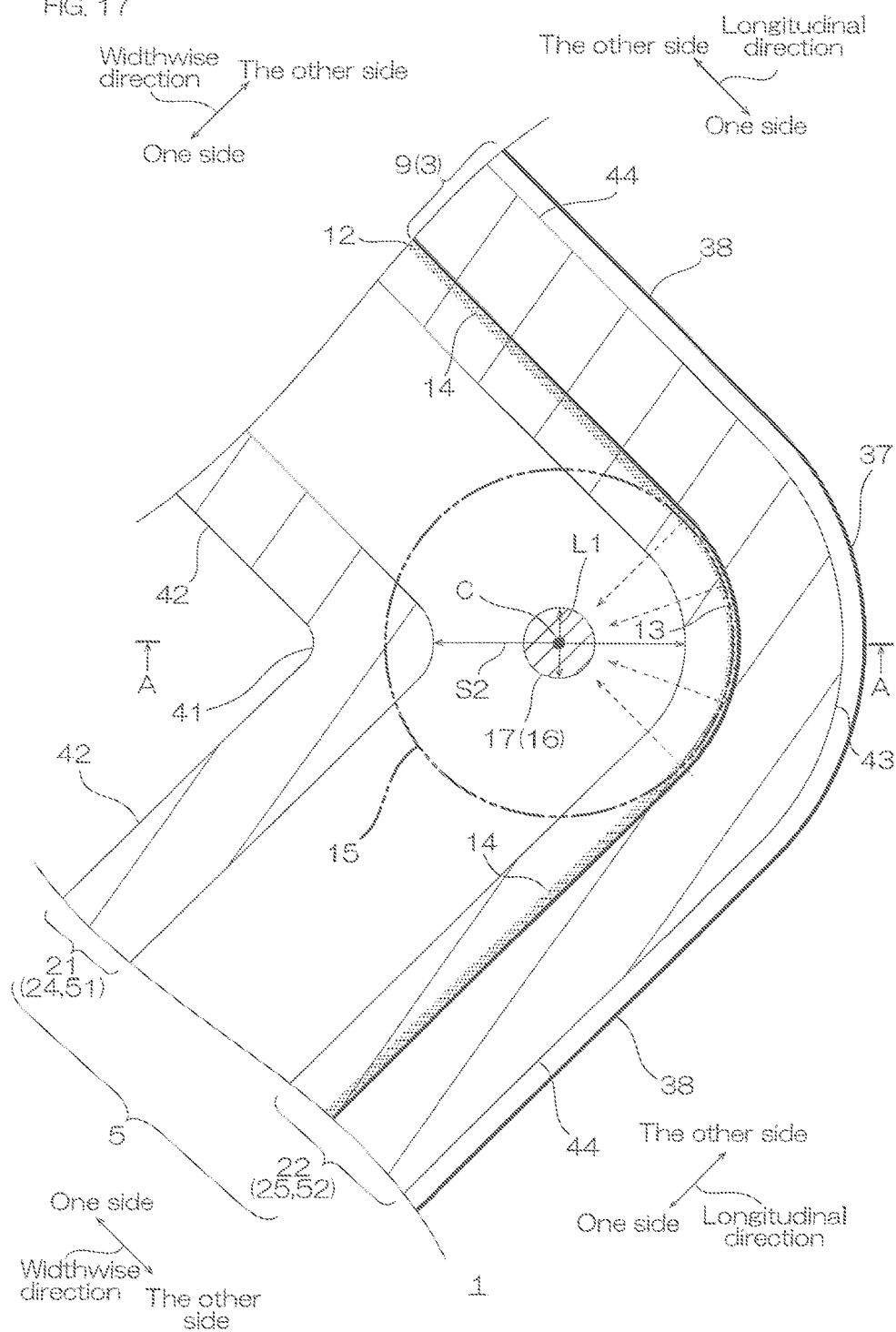
FIG. 17 shows an enlarged plan view of an arc portion of a lower wire in a wired circuit board obtained in the method for producing a wired circuit board in a third embodiment of the present invention.

However, in the third embodiment, as shown in FIG. 17 and FIG. 19A, the light focused portion 16 is generated in the photoresist 23 without considering the above-described Assumption 1 or Assumption 2 in which a portion of the photoresist 23 is not exposed to light.

1. Wired Circuit Board

Figure 18:
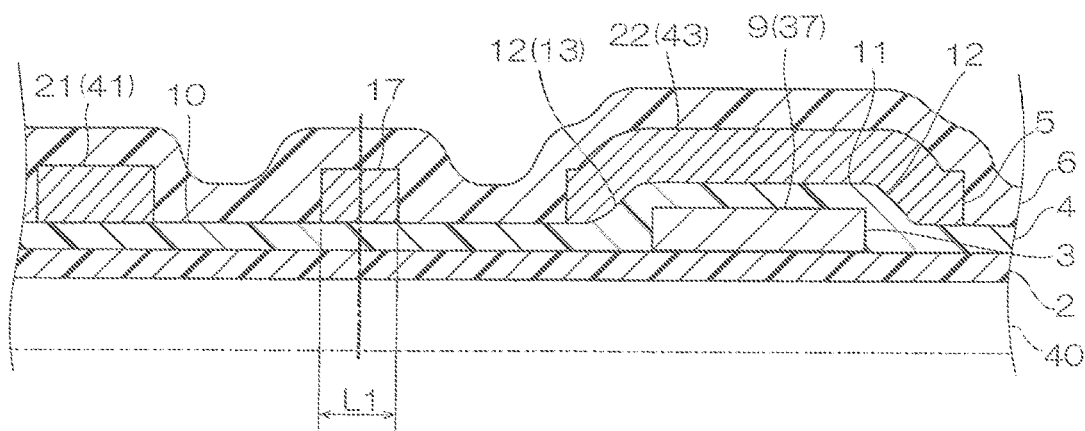
FIG. 18 shows a cross-sectional view crossing the arc portion along the width direction (line A-A) of the lower wire shown in FIG. 17.

As shown in FIG. 17 and FIG. 18, the upper-side conductive pattern 5 includes the insolated conductive portion 17 in addition to the first wire 21 and the second wire 22.

The isolated conductive portion 17 is positioned between the first wire bending portion 41 and the second wire bending portion 43. To be specific, the isolated conductive portion 17 is positioned at the other side in the width direction relative to the other end edge in the width direction of the first wire bending portion 41, and also positioned at one side in the width direction relative to one end edge in the width direction of the second wire bending portion 43.

The isolated conductive portion 17 has a generally circular shape with the center C of the virtual circle 15 along the insulating inclination face arc portion 13 as the center when viewed from the top. A diameter L1 of the isolated conductive portion 17 is appropriately set in accordance with the amount of light applied to the photoresist 23 in the step (4), the gradient β of the inclination face 12, the radius of curvature of the insulating inclination face arc portion 13, or the like, and for example, 2 μm or more, preferably 5 μm or more, and for example, 50 μm or less, preferably 20 μm or less.

The isolated conductive portion 17 is originally an unnecessary pattern in the upper-side conductive pattern 5. However, the isolated conductive portion 17 is a conductive portion that is permitted to exist in the upper-side conductive pattern 5 because of no contact with the first wire 21 and the second wire 22 when viewed from the top.

2. Method for Producing Wired Circuit Board

The production method of the wired circuit board of the third embodiment is in conformity with the production method of the wired circuit board of the first and second embodiments.

In the production method of the third embodiment, the step (4) shown in FIG. 19A corresponds to the step (4) shown in FIG. 4F of the first embodiment.

In the production method of the third embodiment, the step (5) shown in FIG. 19B corresponds to the step (5) shown in FIG. 4G of the first embodiment.

In the production method of the third embodiment, the step (6) shown in FIG. 19C corresponds to the step (6) shown in FIG. 5H of the first embodiment.

2-1. Step (4)

As shown in FIG. 19A, in the step (4), first, the photomask 28 is disposed, and next, the photoresist 23 is exposed to light through the photomask 28.

The light A passing through the first translucent portion 51 generates the first light exposure portion 24 in the photoresist 23. The first light exposure portion 24 has the same shape as that of the first wire 21 provided in the step (6) (ref: FIG. 17 and FIG. 19C) when viewed from the top.

The light B passing through the second translucent portion 52 generates the second light exposure portion 25 in the photoresist 23. The second light exposure portion 25 has the same shape as that of the second wire 22 provided in the step (6) (ref: FIG. 17 and FIG. 19C) when viewed from the top.

Furthermore, a portion of the light B passing through the second translucent portion 52 passes through the inclination face facing portion 48 of the photoresist 23 and generates the reflected light B' in the metal thin film 7 corresponding to the insulating inclination face are portion 13.

The reflected light B' generates the light focused portion 16 between the first light exposure portion 24 and the second light exposure portion 25 in the photoresist 23. Furthermore, as shown in the arrow of FIG. 17, the reflected light B' generated in the metal thin film 7 corresponding to the insulating inclination face are portion 13 (ref: FIG. 19A) is focused toward the center C of the virtual circle 15 along the insulating inclination face are portion 13 when viewed from the top. Therefore, the amount of light at the light focused portion 16 including the center C and its periphery is relatively high. In this manner, the amount of light at the light focused portion 16 is the above-described marginal amount of light or more.

2-2. Step (5)

As shown in FIG. 19B, in the step (5), the photoresist 23 after exposure to light is developed.

Then, the first light exposure portion 24, the second light exposure portion 25, and the light focused portion 16 are removed. In the photoresist 23, the opening portions 8 corresponding to the first light exposure portion 24 and the second light exposure portion 25, and the light focused opening portion 47 corresponding to the light focused portion 16 are formed.

2-3. Step (6)

As shown in FIG. 17 and FIG. 19C, for example, electrolytic plating in which electricity is supplied from the metal thin film 7 is performed. In this manner, each of the first wire 21 and the second wire 22 is formed on the metal thin film 7 exposed from the opening portion 8. At the same time with this, the isolated conductive portion 17 is formed on the metal thin film 7 exposed from the light focused opening portion 47.

The isolated conductive portion 17 has the same shape as that of the light focused portion 16 when viewed from the top.

The isolated conductive portion 17 is disposed in spaced-apart relation to the first wire 21 and the second wire 22. To be specific, the isolated conductive portion 17 is positioned between the first wire bending portion 41 and the second wire bending portion 43. In this manner, the isolated conductive portion 17 is insulated from the first wire 21 and the second wire 22.

4.

As shown in FIG. 19A, in the step (4), in the third embodiment, the light focused portion 16 is disposed in spaced-apart relation to the first light exposure portion 24 and the second light exposure portion 25. Thus, as shown in FIG. 17 and FIG. 19C, in the step (6), the isolated conductive portion 17 based on the light focused portion 16 is disposed in spaced-apart relation to the first wire bending portion 41 and the second wire bending portion 43. Thus, short circuit between the first wire 21 and the second wire 22 caused by the isolated conductive portion 17 can be prevented.

The first embodiment and the second embodiment are preferable compared to the third embodiment including the isolated conductive portion 17. That is, the isolated conductive portion 17 is an unnecessary pattern in the wired circuit board 1, so that the first embodiment and the second embodiment not including the isolated conductive portion 17 are preferable compared to the third embodiment.

Also, in view of enabling the interval S2 between the first wire bending portion 41 and the second wire bending portion 43 to be set small, the first embodiment and the second embodiment are preferable compared to the third embodiment.

<Modified Example of Third Embodiment>

In the modified example, for the members and steps that are the same as the third embodiment, the same reference numerals are given and detailed descriptions thereof are omitted.

In the third embodiment, as shown in FIG. 17, each of the first wire 21 and the second wire 22 has, at its portion, a generally L-shape (bent shape) when viewed from the top. However, the shape of the first wire 21 and the second wire 22 when viewed from the top is not limited to the description above.

As shown in FIG. 20, for example, in the modified example, each of the first wire 21 and the second wire 22 has, at its portion, a generally linear shape when viewed from the top.

The modified example can also achieve the same operations and effects as those of the third embodiment.

<Fourth Embodiment>

In the fourth embodiment, for the members and steps that are the same as the first to third embodiments, the same reference numerals are given and detailed descriptions thereof are omitted.

In the first embodiment, as shown in FIG. 1, the entire light focused portion 16 is included in the first light exposure portion 24 when viewed from the top.

Figure 21:
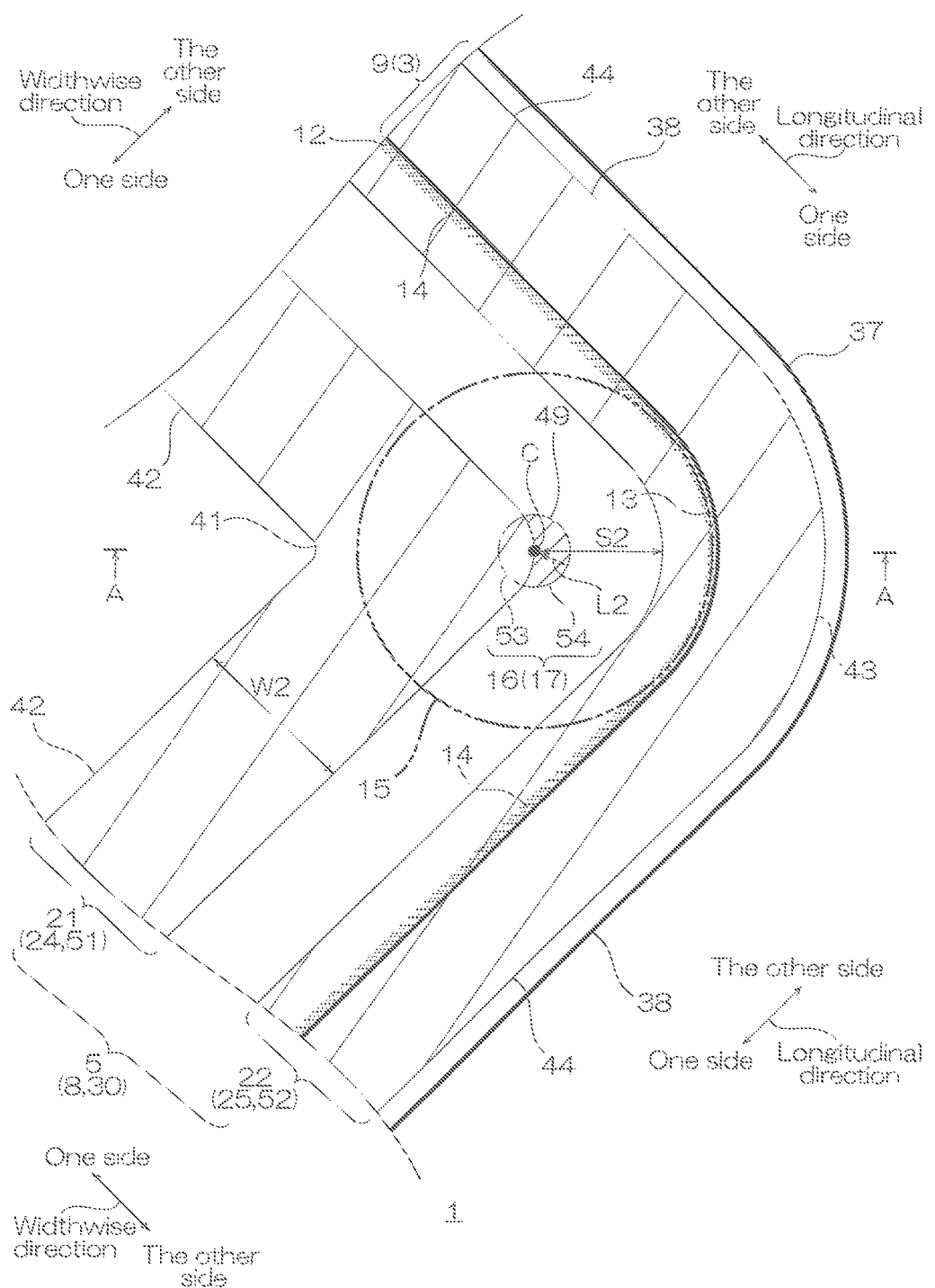
FIG. 21 shows an enlarged plan view of an arc portion of a lower wire in a wired circuit board obtained in the method for producing a wired circuit board in a fourth embodiment of the present invention.

However, in the fourth embodiment, as shown in FIG. 21, a portion of the light focused portion 16 is included in the first light exposure portion 24 when viewed from the top.

Meanwhile, the remaining portion of the light focused portion 16 is not included in the first light exposure portion 24.

The remaining portion of the light focused portion 16 not included in the first light exposure portion 24 becomes the projection portion 49 in the step (6). The projection portion 49 projects from the other end edge in the width direction of the first wire bending portion 41 toward the other side in the width direction.

A length (projection length) L2 in the width direction of the projection portion 49 is smaller than the interval S2 between the second wire bending portion 43 and the first wire bending portion 41. To be specific, the ratio (L2/S2) of L2 to S2 is, for example, 0.1 or more, preferably 0.2 or more, and for example, 0.5 or less, preferably 0.4 or less. To be more specific, L2 is, for example, 0.5 µm or more, preferably 1 µm or more, and for example, 100 µm or less, preferably 20 µm or less.

When L2 is the above-described upper limit or less, short circuit of the first wire 21 and the second wire 22 can be effectively prevented.

The projection portion 49 is originally an unnecessary pattern in the upper-side conductive pattern 5. However, the projection portion 49 is a conductive portion that is permitted to exist in the upper-side conductive pattern 5 because of no contact (connection) with the second wire 22.

The fourth embodiment can also achieve the same operations and effects as those of the first embodiment.

Of the first embodiment and the fourth embodiment, the first embodiment is preferable.

In the first embodiment, as shown in FIG. 1, the first light exposure portion 24 includes the entire light focused portion 16 (ref: phantom line of FIG. 1) provided in the Assumption 1. Thus, in the step (6), formation of the projection portion 49 caused by the light focused portion 16 can be prevented. Thus, short circuit of the first wire 21 and the second wire 22 caused by the isolated conductive portion 17 can be more surely prevented.

Meanwhile, in the fourth embodiment, the width W2 of the first wire 21 is a portion corresponding to the projection portion 49 and becomes wide. That is, the width W2 changes in accordance with the projection portion 49.

On the other hand, in the first embodiment, formation of the projection portion 49 continued from the first wire 21 can be prevented, so that disorder of an electric current in the first wire 21 caused by the change of the width W2 can be suppressed. Thus, the wired circuit board 1 having excellent reliability can be obtained.

<Modified Example of Fourth Embodiment>

In the modified example, for the members and steps that are the same as the fourth embodiment, the same reference numerals are given and detailed descriptions thereof are omitted.

In the fifth embodiment, as shown in FIG. 21, each of the first wire 21 and the second wire 22 has, at its portion, a generally L-shape (bent shape) when viewed from the top. However, the shape of the first wire 21 and the second wire 22 when viewed from the top is not limited to the description above.

Although not shown, for example, in the modified example, each of the first wire 21 and the second wire 22 has, at its portion, a generally linear shape when viewed from the top.

The modified example can also achieve the same operations and effects as those of the fourth embodiment.

<Fifth Embodiment>

In the fifth embodiment, for the members and steps that are the same as the first to fourth embodiments, the same reference numerals are given and detailed descriptions thereof are omitted.

In the second embodiment, as shown in FIG. 10, the entire light focused portion 16 is included in the second light exposure portion 25 when viewed from the top.

Figure 22:
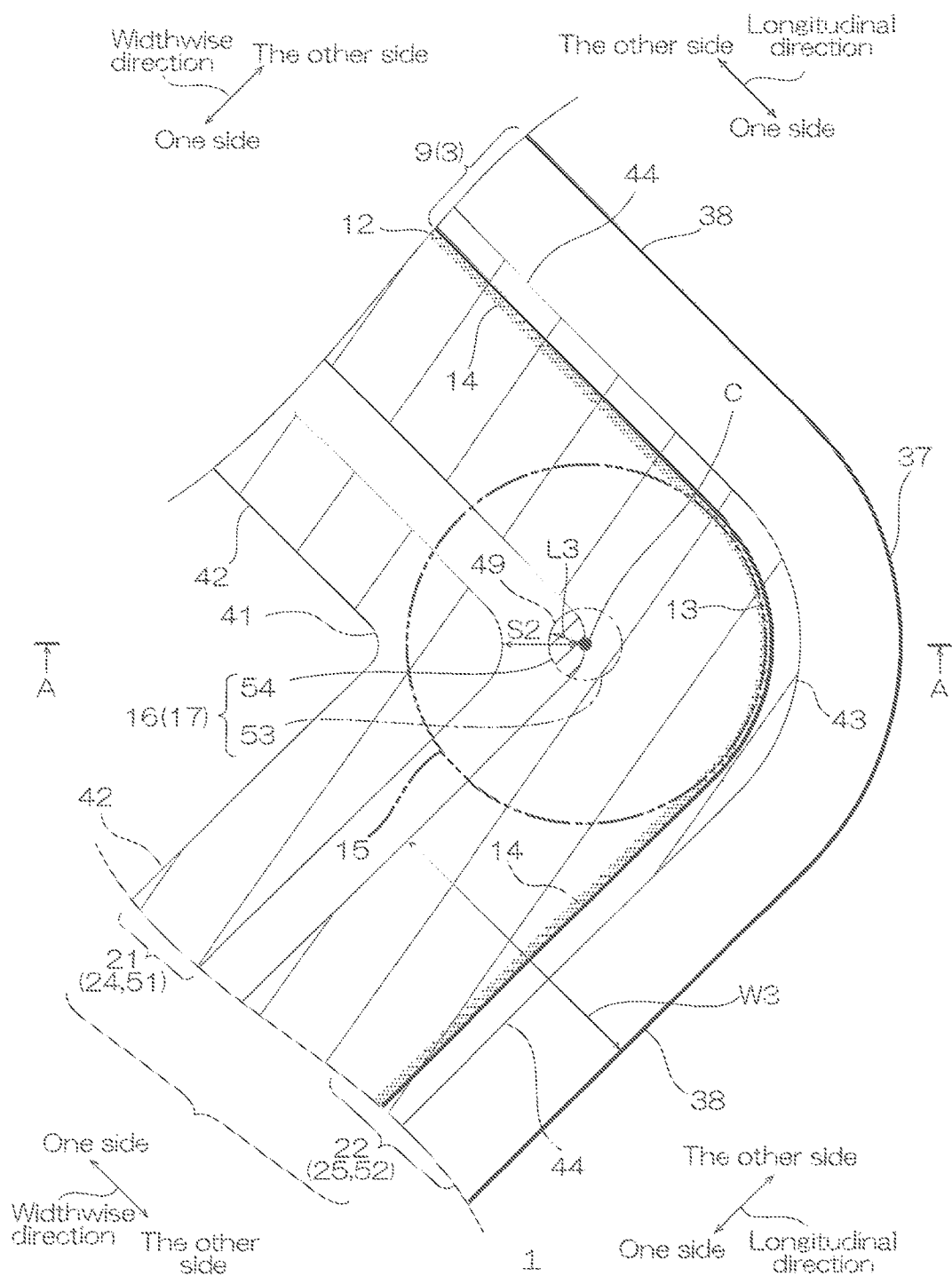
FIG. 22 shows an enlarged plan view of an arc portion of a lower wire in a wired circuit board obtained in the method for producing a wired circuit board in a fifth embodiment of the present invention.

However, in the fifth embodiment, as shown in FIG. 22, a portion of the light focused portion 16 is included in the second light exposure portion 25 when viewed from the top. Meanwhile, the remaining portion of the light focused portion 16 is not included in the second light exposure portion 25.

The remaining portion of the light focused portion 16 not included in the second light exposure portion 25 becomes the projection portion 49 in the step (6). The projection portion 49 projects from the other end edge in the width direction of the first wire bending portion 41 toward the other side in the width direction.

The length (projection length) L2 in the width direction of the projection portion 49 is smaller than the interval S2 between the second wire bending portion 43 and the first wire bending portion 41. To be specific, the ratio (L2/S2) of L2 to S2 is, for example, 0.1 or more, preferably 0.2 or more, and for example, 0.5 or less, preferably 0.4 or less. To be more specific, L2 is, for example, 0.5 μm or more, preferably 1 μm or more, and for example, 100 μm or less, preferably 20 μm or less.

When L2 is the above-described upper limit or less, short circuit of the first wire 21 and the second wire 22 can be effectively prevented.

The projection portion 49 is originally an unnecessary pattern in the upper-side conductive pattern 5. However, the projection portion 49 is a conductive portion that is permitted to exist in the upper-side conductive pattern 5 because of no contact (connection) with the first wire 21.

The fifth embodiment can also achieve the same operations and effects as those of the second embodiment.

Of the second embodiment and the fifth embodiment, the second embodiment is preferable.

In the second embodiment, as shown in FIG. 10, the second light exposure portion 25 includes the entire light focused portion 16 (ref: phantom line of FIG. 10) provided in the Assumption 2. Thus, in the step (6), formation of the projection portion 49 caused by the light focused portion 16 can be prevented. Thus, short circuit of the first wire 21 and the second wire 22 caused by the isolated conductive portion 17 can be more surely prevented.

Meanwhile, in the fifth embodiment, as shown in FIG. 22, the width W3 of the second wire 22 is a portion corresponding to the projection portion 49 and becomes wide. That is, the width W3 changes in accordance with the projection portion 49.

On the other hand, in the second embodiment, formation of the projection portion 49 continued from the second wire 22 can be prevented, so that disorder of an electric current in the second wire 22 caused by the change of the width W3 can be suppressed. Thus, the wired circuit board 1 having excellent reliability can be obtained.

<Modified Example of Fifth Embodiment>

In the modified example, for the members and steps that are the same as the fifth embodiment, the same reference numerals are given and detailed descriptions thereof are omitted.

In the fifth embodiment, as shown in FIG. 22, each of the first wire 21 and the second wire 22 has, at its portion, a generally L-shape (bent shape) when viewed from the top. However, the shape of the first wire 21 and the second wire 22 when viewed from the top is not limited to the description above.

Although not shown, for example, in the modified example, each of the first wire 21 and the second wire 22 has, at its portion, a generally linear shape when viewed from the top.

The modified example can also achieve the same operations and effects as those of the fifth embodiment.

<Sixth Embodiment>

In the sixth embodiment, for the members and steps that are the same as the first to fifth embodiments, the same reference numerals are given and detailed descriptions thereof are omitted.

In the first to fifth embodiments, as shown in FIG. 3D to FIG. 5J, the positive type photoresist 23 is used, and the additive method is used to form the upper-side conductive pattern 5.

However, in the sixth embodiment, as shown in FIG. 23D to FIG. 25I, the negative type photoresist 23 is used, and the subtractive method is used to form the upper-side conductive pattern 5.

The wired circuit board 1 obtained by the production method of the wired circuit board 1 of the sixth embodiment includes the lower-side conductive pattern 3 and the upper-side conductive pattern 5 having the same shapes when viewed from the top as those of the lower-side conductive pattern 3 and the upper-side conductive pattern 5 of the first embodiment.

Figure 23A:
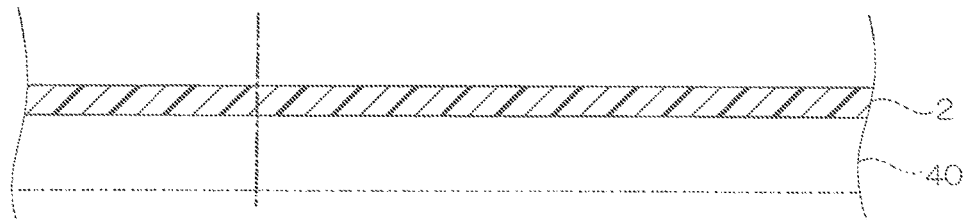
FIG. 23A to FIG. 23D show a portion of process diagrams of the method for producing a wired circuit board in a sixth embodiment of the present invention.
Figure 23B:
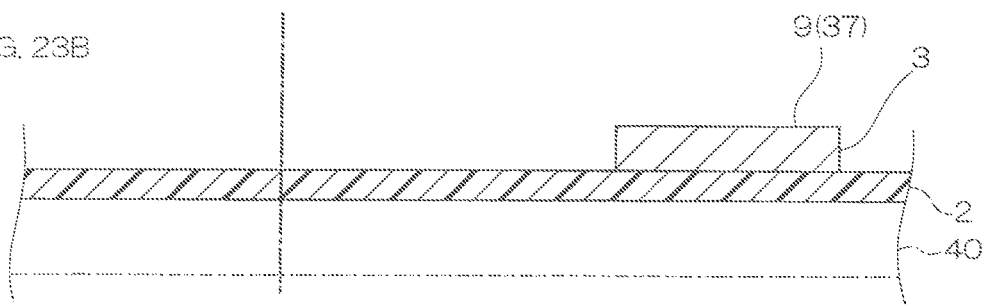
Figure 23C:
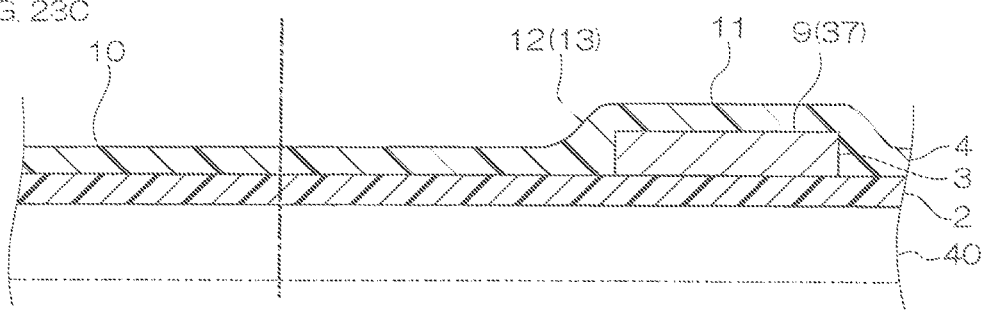
Figure 23D:
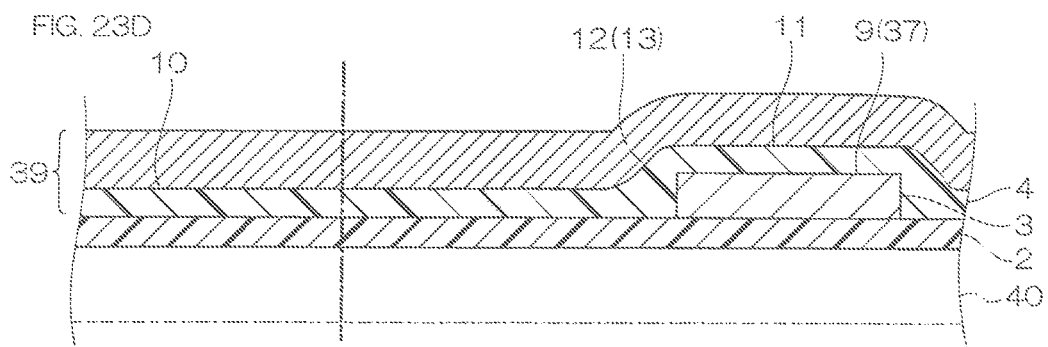

The production method of the sixth embodiment includes a step (i) (ref: FIG. 23A), in which the insulating base layer 2 is prepared, a step (ii) (ref: FIG. 23B), in which the lower-side conductive pattern 3 is provided on the top face of the insulating base layer 2, a step (1) (ref: FIG. 23C), in which the intermediate insulating layer 4 is provided on the top face of the insulating base layer 2 so as to cover the lower-side conductive pattern 3, and a step (2) (ref: FIG. 23D), in which the conductive layer 33 is provided on the top face of the intermediate insulating layer 4.

Figure 24E:
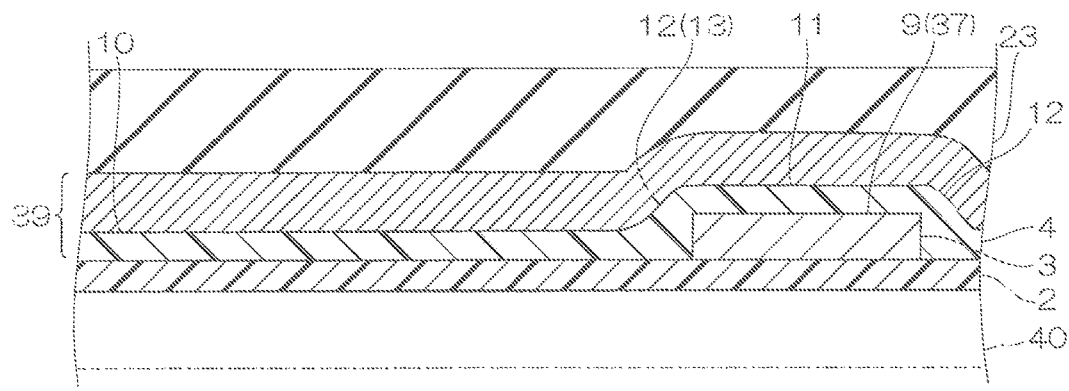
FIG. 24E to FIG. 24G show, following FIG. 23D, a portion of process diagrams of the method for producing a wired circuit board in the sixth embodiment of the present invention.
Figure 24F:
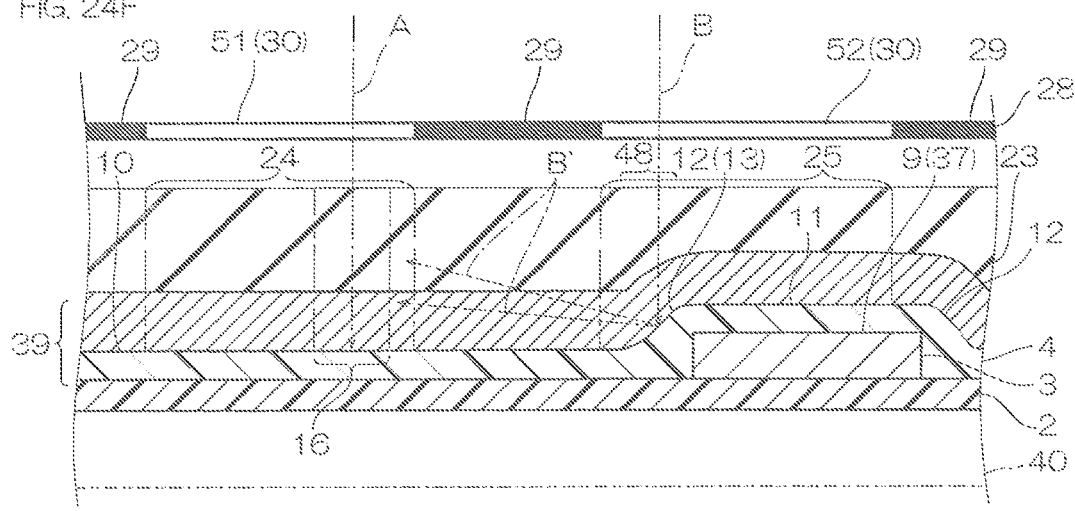
Figure 24G:
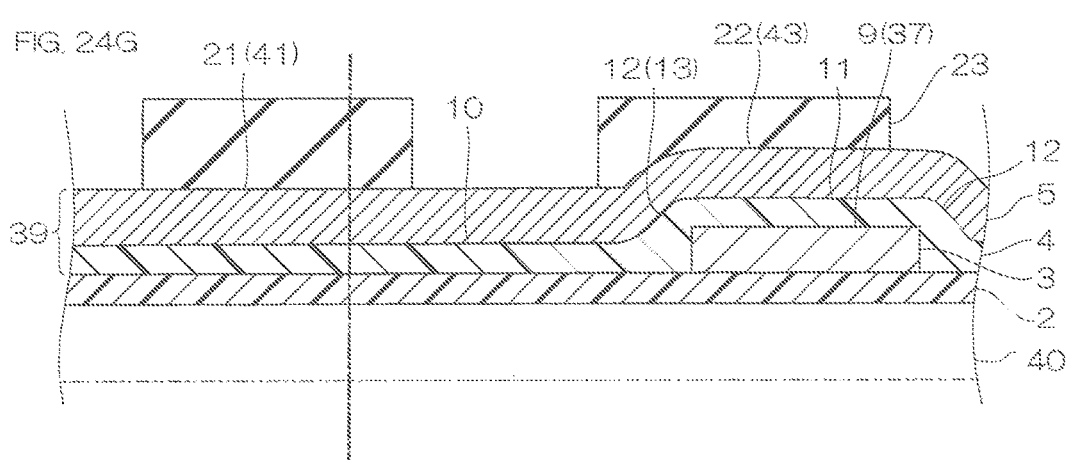

Furthermore, the production method of the wired circuit board 1 includes a step (3) (ref: FIG. 24E), in which the photoresist 23 is provided on the top face of the conductive layer 33, a step (4) (ref: FIG. 24F), in which the photoresist 23 is exposed to light through the photomask 28, and a step (5) (ref: FIG. 24G), in which in the photoresist 23, a portion other than the first light exposure portion 24 corresponding to the first wire 21 and the second light exposure portion 25 corresponding to the second wire 22 is removed, and the conductive layer 33 is exposed from the first light exposure portion 24 and the second light exposure portion 25.

Furthermore, the production method of the wired circuit board 1 includes a step (6) (ref: FIG. 25H), in which the conductive layer 33 exposed from the first light exposure portion 24 and the second light exposure portion 25 is removed to form the upper-side conductive pattern 5, a step (iii) (ref: FIG. 25I), in which the first light exposure portion 24 and the second light exposure portion 25 are removed, and a step (v) (ref: FIG. 25J), in which the insulating cover layer 6 is provided on the top face of the intermediate insulating layer 4 so as to cover the upper-side conductive pattern 5.

1. Step (1) and Step (2)

In the sixth embodiment, as shown in FIG. 23C and FIG. 23D, the step (1) and the step (2) are sequentially conducted. Alternatively, the step (1) and the step (2) are conducted, for example, simultaneously. When the step (1) and the step (2) are conducted simultaneously, a two-layer substrate 39 in which the intermediate insulating layer 4 and the conductive layer 33 are laminated in advance is provided on the top face of the insulating base layer 2 so as to cover the lower-side conductive pattern 3.

The conductive layer 33 is disposed on the entire top face including the first flat face 10, the second flat face 11, and the inclination face 12 of the intermediate insulating layer 4. The conductive layer 33 extends along the top face of the intermediate insulating layer 4 along the surface direction. The conductive layer 33 is made of the same conductive material as that of the upper-side conductive pattern 5. The thickness of the conductive layer 33 is the same as the thickness of the upper-side conductive pattern 5. The surface reflectivity of the conductive layer 33 relative to light with a wavelength of 400 nm with the incident angle of 45 degrees is, for example, 60% or more, preferably 70% or more, more preferably 80% or more, and for example, 99% or less. The surface reflectivity is, for example, calculated in conformity with the method described in JIS Z8741 (in 1997). When the surface reflectivity of the conductive layer 33 is less than the above-described lower limit, the reflected light B' in the assumption to be described later is not generated, and the problem of the present invention may not be solved.

2. Step (4)

As shown in FIG. 24F, in the step (4), the photomask 28 is disposed at the upper side of the photoresist 23.

The photoresist 23 is a negative type photoresist (negative photoresist). The negative type photoresist is a resist that allows a portion to which (a predetermined amount or more of) light is exposed to remain in developing thereafter, and meanwhile, a portion which is shielded from light at the time of exposure (portion to which light is not applied, to be specific, portion failing to reach a predetermined amount of light) to be removed in developing thereafter.

Thereafter, as shown in the arrow of FIG. 24F, the photoresist 23 is exposed to light through the photomask 28. The photoresist 23 has the light shield portion 29 and the translucent portion 30 having the same pattern as the description above.

When the photoresist 23 is exposed to light through the photomask 28, the light A passing through the first translucent portion 51 generates the first light exposure portion 24 in the photoresist 23. The first light exposure portion 24 has the same shape as that of the first wire 21 (ref: FIG. 1) when viewed from the top.

Meanwhile, the light B passing through the second translucent portion 52 generates the second light exposure portion 25 in the photoresist 23. The second light exposure portion 25 has the same shape as that of the second wire 22 (ref: FIG. 1) when viewed from the top.

The second light exposure portion 25 includes the inclination face facing portion 48 as an example of the facing portion facing the insulating inclination face arc portion 13.

A portion of the light B passing through the second translucent portion 52 passes through the inclination face facing portion 48 of the photoresist 23 and generates the reflected light B' in the conductive layer 33 corresponding to the insulating inclination face arc portion 13.

The reflected light B' generates the light focused portion 16 in the photoresist 23 corresponding to the first wire bending portion 41 (ref: FIG. 1). That is, the light focused portion 16 constitutes the first light exposure portion 24 by being exposed to light with sufficient amount of light by the light A passing through the first translucent portion 51 and the reflected light B' generated in the conductive layer 33 corresponding to the insulating inclination face arc portion 13.

3. Step (5)

As shown in FIG. 24G, in the step (5), the photoresist 23 after exposure to light is, for example, developed with a developer. Then, a portion other than the first light exposure portion 24 and the second light exposure portion 25 is removed, and the first light exposure portion 24 and the second light exposure portion 25 are left.

4. Step (6)

As shown in FIG. 25H, in the step (6), the conductive layer 33 exposed from the first light exposure portion 24 and the second light exposure portion 25 (photoresist 23 after developing) is removed.

For example, the first light exposure portion 24 and the second light exposure portion 25 are used as an etching resist to conduct etching on the conductive layer 33 exposed from the first light exposure portion 24 and the second light exposure portion 25.

In this manner, the upper-side conductive pattern 5 having the first wire 21, the second wire 22, and the second terminal (not shown) is formed.

5. Step (iii)

As shown in FIG. 25I, in the step (iii), the first light exposure portion 24 and the second light exposure portion 25 are removed, for example, by peeling.

6. Wired Circuit Board

As shown in FIG. 25J, the wired circuit board 1 obtained by the production method of the sixth embodiment includes the insulating base layer 2, the lower-side conductive pattern 3, the intermediate insulating layer 4, the upper-side conductive pattern 5, and the insulating cover layer 6. The wired circuit board 1 of the sixth embodiment does not include the metal thin film 7 (ref: FIG. 5K) unlike the wired circuit board 1 of the first to fifth embodiments.

Meanwhile, the wired circuit board 1 of the sixth embodiment may include an adhesive layer (not shown) between the upper-side conductive pattern 5 and the intermediate insulating layer 4 so as to allow them to adhere.

7.

The sixth embodiment can also achieve the same operations and effects as those of the first embodiment.

Comparative Example 2 compared with the sixth embodiment is described with reference to FIG. 27, FIG. 29, and FIG. 30.

Figure 30A:
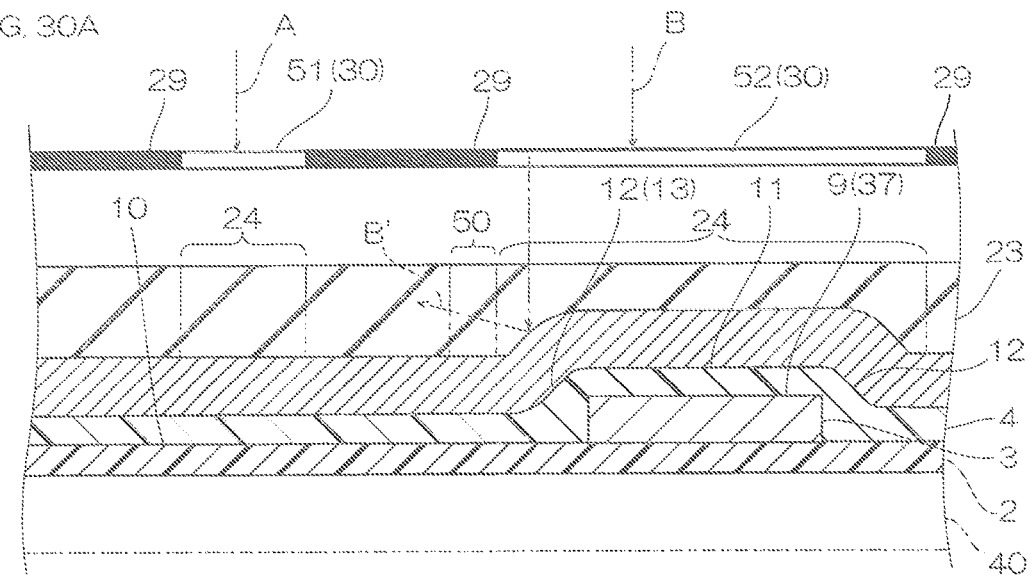
FIG. 30A to FIG. 30C show partial process diagrams of Comparative Example 2 in which an upper-side conductive pattern is provided using a negative type photoresist and etching.
Figure 30B:
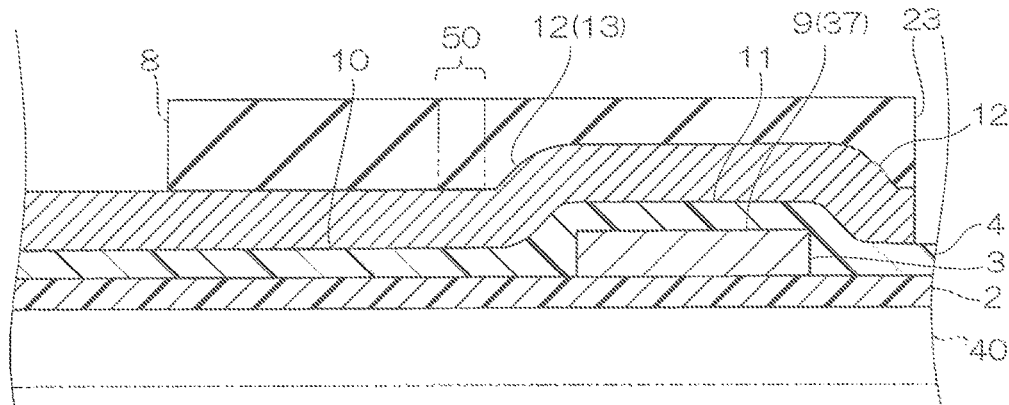
Figure 30C:
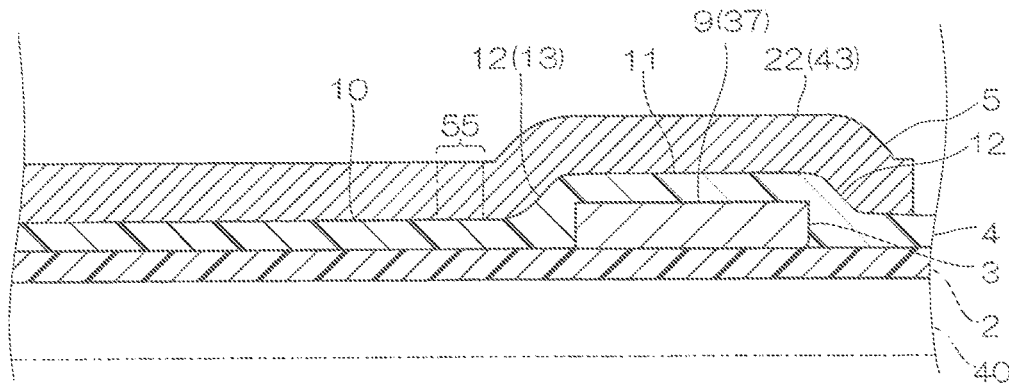

In Comparative Example 2, as shown in FIG. 27 and FIG. 30A, the photoresist 23 has a light focused portion 50 caused by light focus of the reflected light B' in the step (4) and removed in the step (5) shown in FIG. 30B. In the step (5), both of a portion corresponding to the first wire bending portion 41 (ref: FIG. 29) in the first light exposure portion 24, and a portion corresponding to the second wire bending portion 43 (ref: FIG. 29) in the second light exposure portion 25 are in contact with the light focused portion 50.

In the step (6), in the conductive layer 33 corresponding to the light focused portion 50, the short circuit portion 55 connecting the first wire 21 to the second wire 22 is formed. The short circuit portion 55 short-circuits the first wire 21 and the second wire 22.

Meanwhile, in the sixth embodiment, as described above, short circuit of the first wire 21 and the second wire 22 can be prevented.

8. Modified Example of Sixth Embodiment

In the production method of the sixth embodiment, the wired circuit board 1 having the first wire 21 and the second wire 22 in the same shapes when viewed from the top as those of the first wire 21 and the second wire 22 described in the second to fifth embodiments can be obtained.

<Modified Example of First to Sixth Embodiments>

In the first to sixth embodiments, the wired circuit board 1 is described as the wired circuit board obtained by the method of the present invention. However, the wired circuit board is not limited to this, and as shown by the phantom line of FIG. 2, the suspension board with circuit including a metal supporting board 40 can be also used. In such a case, the suspension board with circuit includes the metal supporting board 40, the insulating base layer 2, the lower-side conductive pattern 3, the intermediate insulating layer 4, the upper-side conductive pattern 4, and the insulating cover layer 6.

Figure 26:
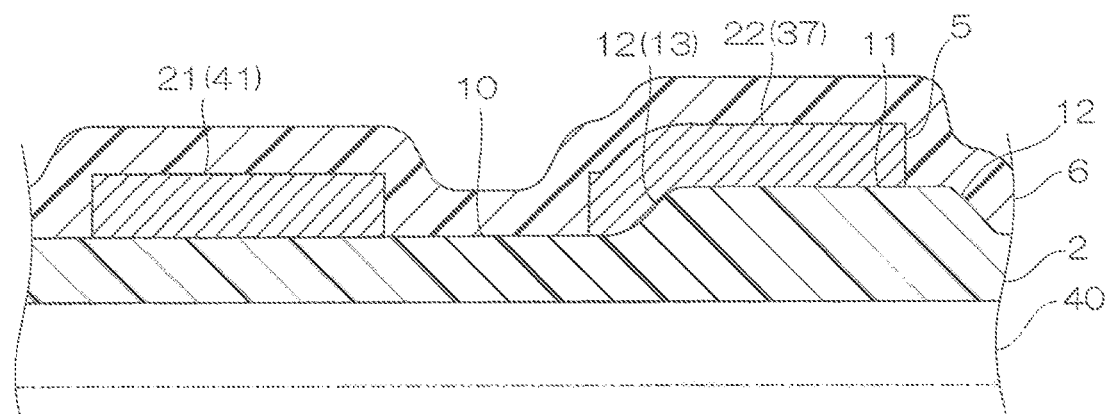
FIG. 26 shows a cross-sectional view of a modified example (embodiment in which the lower-side conductive pattern and the intermediate insulating layer are not provided) of the wired circuit board obtained in the first to sixth embodiments.

The inclination face 12 of the intermediate insulating layer 5 of the wired circuit board 1 obtained in the first to sixth embodiments corresponds to the ridgeline portion 20 of the lower wire 9. However, for example, though not shown, as shown in FIG. 26, the inclination face 12 does not correspond to the lower-side conductive pattern 3, and the insulating base layer 2 as an example of the insulating layer has a plurality of thickness T1 and T2, so that the insulating base layer 2 can also have the inclination face 12. The thickness T1 is the thickness of the insulating base layer 2 in the first flat face 10. Meanwhile, the thickness T2 is the thickness of the insulating base layer 2 in the second flat face 11. The thickness T2 is thicker than the thickness T1.

In the first to sixth embodiments, as shown in FIG. 2, the top face of the intermediate insulating layer 4 has the second flat face 11. However, though not shown, for example, as long as at least the inclination face 12 is included, the second flat face 11 may not be included.

As shown in FIG. 1, the lower-side conductive pattern 3 includes the lower wire 9. Alternatively, for example, though not shown, the lower-side conductive pattern 3 can further have another wire.

As shown in FIG. 1, the upper-side conductive pattern 5 includes the first wire 21 and the second wire 22. Alternatively, for example, though not shown, the upper-side conductive pattern 5 can further have another wire.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method for producing a wired circuit board including an insulating layer, and a first wire and a second wire disposed next to each other in spaced-apart relation on an upper side face of the insulating layer in a thickness direction of the insulating layer, where the thickness direction is orthogonal to a longitudinal direction and a width direction of the wired circuit board, the method comprising the steps of:

a step (1), in which the insulating layer is provided, the upper side face of the insulating layer including at least one flat face and an inclination face, the inclination face being inclined with respect to the at least one flat face in the thickness direction;

a step (2), in which a metal thin film is provided on the upper side face of the insulating layer including the inclination face and the at least one flat face;

a step (3), in which a photoresist is provided on a surface of the metal thin film;

a step (4), in which a photomask is disposed so that a first light exposure portion corresponding to the first wire in the photoresist and a second light exposure portion corresponding to the second wire in the photoresist are exposed to light, and the photoresist is exposed to light through the photomask;

a step (5), in which the first light exposure portion and the second light exposure portion in the photoresist are removed to expose the metal thin film corresponding to the first light exposure portion and the second light exposure portion; and a step (6), in which the first wire and the second wire are provided on the surface of the metal thin film, wherein the inclination face includes an arc portion that has a generally arc shape when viewed from the top of the wired circuit board, in the step (4), the second light exposure portion of the photoresist has a facing portion which is disposed over the inclination face and thus faces the inclination face, in the step (4), the reflected light reflected at the metal thin film corresponding to the arc portion is focused on the photoresist corresponding to the center of a virtual circle along the arc portion, and in the step (4), the photomask is disposed so as to satisfy the following Conditions A to C:

Condition A: at least a portion of the first light exposure portion and at least a portion of the second light exposure portion are overlapped with the virtual circle when viewed from the top, Condition B: the photoresist has a light focused portion caused by light focus of the reflected light in the step (4) and removed in the step (5), and Condition C: the light focused portion is disposed in spaced-apart relation to at least one of the following: the first light exposure portion, the second light exposure portion, or both the first light exposure portion and the second light exposure portion.

2. The method for producing a wired circuit board according to claim 1, wherein
   either the first light exposure portion or the second light exposure portion includes the entire light focused portion.

3. A method for producing a wired circuit board including an insulating layer, and a first wire and a second wire disposed next to each other in spaced-apart relation on an upper side face of the insulating layer in a thickness direction of the insulating layer, where the thickness direction is orthogonal to a longitudinal direction and a width direction of the wired circuit board, the method comprising the steps of:
   a step (1), in which the insulating layer is provided, the upper side face of the insulating layer including at least one flat face and an inclination face, the inclination face being inclined with respect to the at least one flat face in the thickness direction;
   a step (2), in which a conductive layer is provided on the upper side face of the insulating layer including the inclination face and the at least one flat face;
   a step (3), in which a photoresist is provided on a surface of the conductive layer;
   a step (4), in which a photomask is disposed so that a first light exposure portion corresponding to the first wire in the photoresist and a second light exposure portion corresponding to the second wire in the photoresist are exposed to light, and the photoresist is exposed to light through the photomask;
   a step (5), in which a portion other than the first light exposure portion and the second light exposure portion in the photoresist is removed to expose the conductive layer from the portion other than the first light exposure portion and the second light exposure portion; and
   a step (6), in which the conductive layer exposed from the portion other than the first light exposure portion and the second light exposure portion is removed, and the first wire and the second wire are formed, wherein the inclination face includes an arc portion that has a generally arc shape when viewed from the top of the wired circuit board, in the step (4), the second light exposure portion of the photoresist has a facing portion which is disposed over the inclination face and thus faces the inclination face, in the step (4), the reflected light reflected at the conductive layer corresponding to the arc portion is focused on the photoresist corresponding to the center of a virtual circle along the arc portion, and in the step (4), the photomask is disposed so as to satisfy the following conditions A to C:

Condition A: at least a portion of the first light exposure portion and at least a portion of the second light exposure portion are overlapped with the virtual circle when viewed from the top, Condition B: the photoresist has a light focused portion caused by light focus of the reflected light in the step (4) and removed in the step (5), and Condition C: the light focused portion is disposed in spaced-apart relation to at least one of the following: the first light exposure portion, the second light exposure portion, or both the first light exposure portion and the second light exposure portion.

4. The method for producing a wired circuit board according to claim 3, wherein
   either the first light exposure portion or the second light exposure portion includes the entire light focused portion.

* * * * *